United States Patent
Uchiyama

(10) Patent No.: US 9,319,067 B2
(45) Date of Patent: Apr. 19, 2016

(54) STORAGE CONTROL APPARATUS, STORAGE SYSTEM, AND STORAGE CONTROL METHOD

(71) Applicant: FUJITSU LIMITED, Kawasaki-shi (JP)

(72) Inventor: Kenji Uchiyama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 82 days.

(21) Appl. No.: 13/769,903

(22) Filed: Feb. 19, 2013

(65) Prior Publication Data

US 2013/0246886 A1 Sep. 19, 2013

(30) Foreign Application Priority Data

Mar. 19, 2012 (JP) ................. 2012-062165

(51) Int. Cl.
*G06F 11/00* (2006.01)
*H03M 13/09* (2006.01)
*G06F 11/10* (2006.01)

(52) U.S. Cl.
CPC ........... *H03M 13/09* (2013.01); *G06F 11/1076* (2013.01); *H03M 13/098* (2013.01); *G06F 2212/403* (2013.01)

(58) Field of Classification Search
CPC ................................................. G06F 2212/403
USPC .................................................. 714/766, 800
See application file for complete search history.

(56) References Cited

U.S. PATENT DOCUMENTS

| | | | | |
|---|---|---|---|---|
| 5,856,890 | A * | 1/1999 | Hamai et al. | 360/53 |
| 6,067,635 | A * | 5/2000 | DeKoning et al. | 714/6.21 |
| 6,523,087 | B2 * | 2/2003 | Busser | 711/114 |
| 6,745,212 | B2 | 6/2004 | Kishi et al. | |
| 7,689,895 | B2 * | 3/2010 | Kim et al. | 714/785 |
| 2010/0325522 | A1 * | 12/2010 | Tsukamoto et al. | 714/770 |
| 2010/0332951 | A1 * | 12/2010 | Peng et al. | 714/773 |
| 2011/0019509 | A1 * | 1/2011 | Ferren et al. | 369/13.01 |
| 2012/0017139 | A1 * | 1/2012 | Otsuka | 714/773 |
| 2013/0159644 | A1 * | 6/2013 | Lee | 711/162 |

FOREIGN PATENT DOCUMENTS

| | | |
|---|---|---|
| JP | 10-116157 A | 5/1998 |
| JP | 10-260791 A | 9/1998 |
| JP | 10-312246 | 11/1998 |
| JP | 11-327805 | 11/1999 |
| JP | 2003-067248 | 3/2003 |
| JP | 2003-150323 | 5/2003 |
| JP | 2003-150325 | 5/2003 |

OTHER PUBLICATIONS

Japanese Office Action mailed Oct. 6, 2015 for corresponding Japanese Patent Application No. 2012-062165, with Partial English Translation, 3 pages.

* cited by examiner

*Primary Examiner* — M. Mujtaba K Chaudry
(74) *Attorney, Agent, or Firm* — Fujitsu Patent Center

(57) ABSTRACT

A storage control apparatus writes n pieces of data (here, n is an integer greater than 1) in a first memory apparatus, and reads the n pieces of written data from the first memory apparatus. A parity calculation unit calculates parity based on divided data extracted from each of the n pieces of data for each certain size, and stores the calculated parity in a second memory apparatus. A read control unit restores, in reading the n pieces of data from the first memory apparatus, at least one of the n pieces of data instead of reading it from the first memory apparatus but using other data having been read from the first memory apparatus among the n pieces of data and the parity stored in the second memory apparatus.

20 Claims, 38 Drawing Sheets

STORAGE CONTROL APPARATUS, STORAGE SYSTEM, AND STORAGE CONTROL METHOD

CROSS-REFERENCE TO RELATED APPLICATION

This application is based upon and claims the benefit of priority of the prior Japanese Patent Application No. 2012-062165, filed on Mar. 19, 2012, the entire contents of which are incorporated herein by reference.

FIELD

The embodiments discussed herein relate to a storage control apparatus, storage system, and storage control method.

BACKGROUND

In recent years, a hierarchical virtual storage system has been known in which a high-capacity and inexpensive recording medium, such as a magnetic tape, is used as a back-end library apparatus, and also a recording medium with a higher access speed, such as an HDD (Hard Disk Drive), is used as a cache apparatus. A control apparatus that controls access to the cache apparatus and the library apparatus is provided in the virtual storage system, and it makes a host apparatus virtually recognize data stored in the cache apparatus as data of the library apparatus. As a result, the host apparatus utilizes a high-capacity memory area provided by the library apparatus as if it is connected to the host apparatus itself.

Meanwhile, as a technology for preventing loss of data stored in a storage system or the like, a technology that makes data redundant using parity has been known. As an example of such technology, there is a technology in which data to be backed up is divided into certain size of data, parity is generated from the plurality of pieces of divided data, and the plurality of pieces of divided data and parity are respectively recorded in different backup apparatuses (for example, see Japanese Laid-open Patent Publication No. 2003-150325). In addition, there is a technology in which a striping unit in RAID (Redundant Arrays of Inexpensive Disks)-5 is made variable according to a content of data to be record (for example, see Japanese Laid-open Patent Publication No. 2003-150323). Furthermore, there is a technology in which exclusive OR operations for generating parity are collectively executed by a disk apparatus for storing the parity (for example, see Japanese Laid-open Patent Publication No. 10-312246).

In the above-described virtual storage system, there is a request for reducing a time required to read data from a magnetic tape to a control apparatus. For example, when data is read from the magnetic tape, a transport mechanism transports to a tape drive the magnetic tape in which the data has been stored, then mounts it therein, and thus it takes a long time before read of the data itself is started. In addition, there is a case where a temporary read error occurs during read of the data from the magnetic tape, and in that case, it takes an extra time of retrying the read. Furthermore, there is also a problem that a read speed itself from the magnetic tape is low as compared with a read speed from an HDD or the like.

SUMMARY

According to one aspect, there is provided a storage control apparatus that writes n pieces of data (here, n is an integer greater than 1) in a first memory apparatus, and reads the n pieces of written data from the first memory apparatus. The storage control apparatus calculates parity based on divided data extracted from each of the n pieces of data for each certain size, and has: a parity calculation unit that stores the calculated parity in a second memory apparatus; and a read control unit that restores, in reading the n pieces of data from the first memory apparatus, at least one of the n pieces of data instead of reading it from the first memory apparatus but using other data having been read from the first memory apparatus among the n pieces of data and the parity stored in the second memory apparatus.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
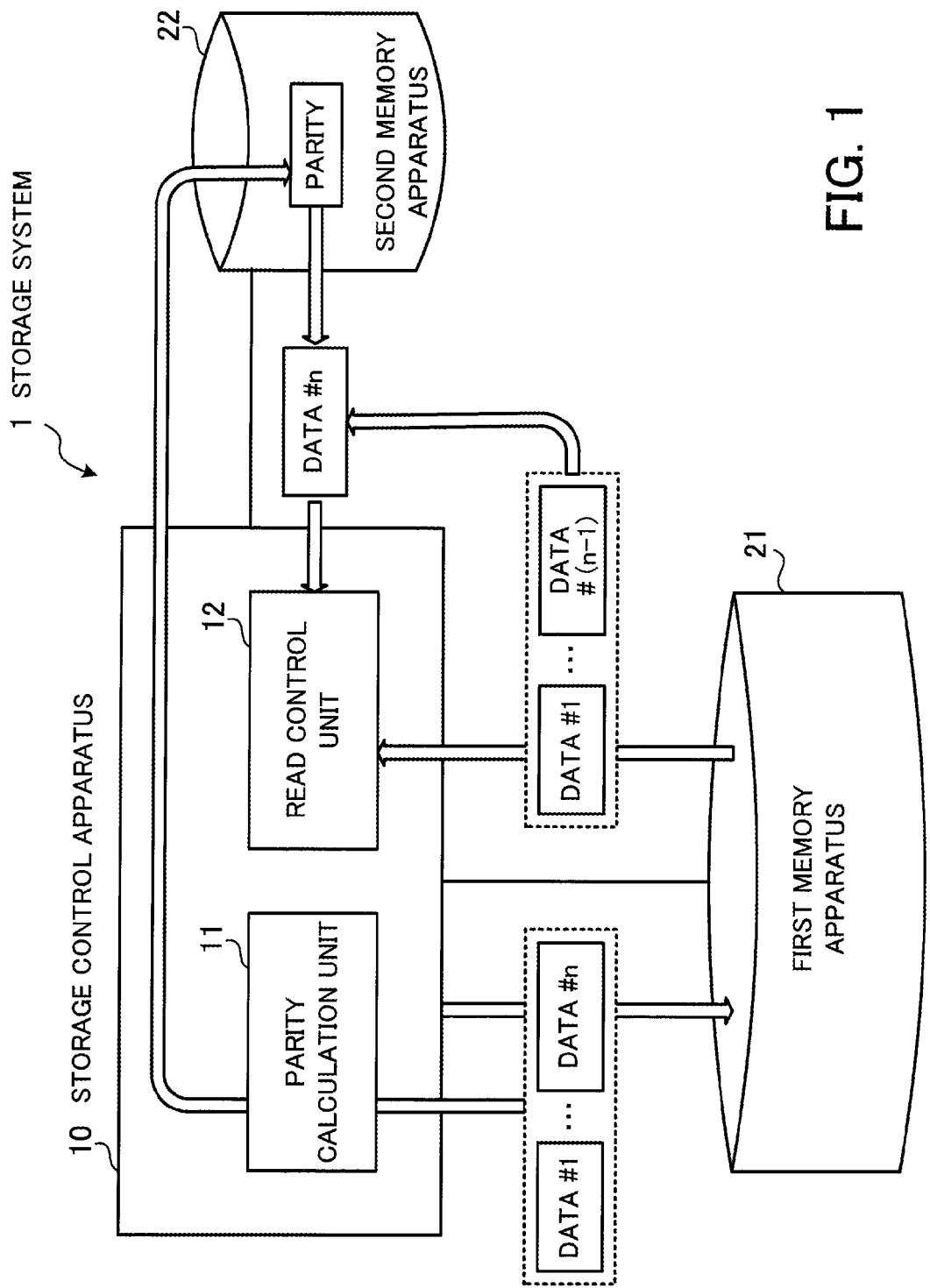
FIG. 1 illustrates a configuration example and an operation example of a storage system according to a first embodiment.

Several embodiments will be described below with reference to the accompanying drawings, wherein like reference numerals refer to like elements throughout.

First Embodiment

FIG. 1 illustrates a configuration example and an operation example of a storage system according to a first embodiment. A storage system 1 illustrated in FIG. 1 includes: a storage control apparatus 10; a first memory apparatus 21; and a second memory apparatus 22.

The storage control apparatus 10 mainly controls write of data in the first memory apparatus 21, and read of the data from the first memory apparatus 21. In addition, the storage control apparatus 10 is accessible also to the second memory apparatus 22.

It is to be noted that the second memory apparatus 22 may be provided inside the storage control apparatus 10. In addition, an access speed from the storage control apparatus 10 to the second memory apparatus 22 is higher than that from the storage control apparatus 10 to the first memory apparatus 21. For example, when the first memory apparatus 21 is a memory apparatus using a portable recording medium, such as a magnetic tape or an optical disk, as a recording medium, the second memory apparatus 22 is achievable as a fixed nonvolatile recording medium, such as an HDD and an SSD (Solid State Drive), or a volatile semiconductor memory, such as a DRAM (Dynamic Random Access Memory) and a SRAM (Static RAM).

The storage control apparatus 10 executes processing that writes a plurality of pieces of data in the first memory apparatus 21, and processing that reads the written plurality of pieces of data from the first memory apparatus 21. In the following description, the number of pieces of data that the storage control apparatus 10 writes in the first memory apparatus 21 is set as n (here, n is an integer greater than 1). In FIG. 1, n pieces of data are represented as data #1, . . . , and data #n.

Here, each of the n pieces of data may be, for example, one file, or may be a data group including a plurality of files like a logical volume. In addition, the n pieces of data are, for example, data previously set by a user so as to be managed as one group.

The storage control apparatus 10 includes a parity calculation unit 11 and a read control unit 12 as processing functions relating to read and write of the n pieces of data.

The parity calculation unit 11 calculates parity based on divided data extracted from each of the n pieces of data for each certain size, and stores the calculated parity in the second memory apparatus 22.

Here, timing when the parity calculation unit 11 calculates the parity may just be arbitrary timing before the n pieces of data written in the first memory apparatus 21 are read by the storage control apparatus 10. Namely, by the parity calculation unit 11, the parity is previously stored in the second memory apparatus 22 before the n pieces of data are read from the first memory apparatus 21 by the storage control apparatus 10.

In addition, it is desirable that the parity calculation unit 11 calculates the parity before the storage control apparatus 10 writes the n pieces of data in the first memory apparatus 21. As a result, the parity calculation unit 11 reads the n pieces of data from a memory apparatus whose access speed is higher than the first memory apparatus 21, such as a RAM (Random Access Memory) in the storage control apparatus 10 or the second memory apparatus 22, and calculates the parity at a high speed.

It is to be noted that each of the n pieces of data may have a certain size, or may not have the certain size. However, when each of the n pieces of data does not have the certain size, the parity calculation unit 11 calculates m types of parity, for example, as follows. The parity calculation unit 11 adds dummy data at least to each piece of data excluding data of a maximum size of the n pieces of data so that respective sizes of the n pieces of data are the same as one another. The parity calculation unit 11 calculates the m types of parity based on the n pieces of data whose respective sizes become the same as one another by adding the dummy data. It is to be noted that added each dummy data need not be written in the first memory apparatus 21 together with the n pieces of data.

In reading the n pieces of data stored in the first memory apparatus 21, the read control unit 12 restores one of the n pieces of data (for example, data #n of FIG. 1) instead of directly reading the one of the n pieces of data from the first memory apparatus 21, but by calculation using other data having been read from the first memory apparatus 21 among the n pieces of data (for example, data #1 to data # (n−1) of FIG. 1), and the parity stored in the second memory apparatus 22. Since a time for the data to be restored by calculation is shorter than a time for the same data to be read from the first memory apparatus 21, a time required to read the whole n pieces of data is reduced.

In addition, the read control unit 12 may execute data restoration processing by calculation in parallel with processing that reads other one data of the n pieces of data from the first memory apparatus 21. In this case, the read control unit 12 reads (n−2) pieces of data of the n pieces of data from the first memory apparatus 21. Subsequently, the read control unit 12 executes in parallel processing that reads first data (for example, data # (n−1) of FIG. 1) of the remaining two pieces of data from the first memory apparatus 21, and processing that restores second data (for example, data #n of FIG. 1) of the remaining two pieces of data using the (n−2) pieces of data having been read from the first memory apparatus 21, divided data having been read from the first memory apparatus 21 among the first data, and the parity stored in the second memory apparatus 22. As described above, the read processing of the first data and the restoration processing of the second data are executed in parallel, and thereby a time required to read the whole n pieces of data is further reduced.

It is to be noted that in the above first embodiment, although the parity calculation unit 11 is configured to calculate one type of parity, the parity calculation unit 11 may, for example, calculate two types of parity and store it in the second memory apparatus 22. In this case, in reading the n pieces of data from the first memory apparatus 21, the read control unit 12 restores by calculation up to two pieces of data of the n pieces of data instead of reading them from the first memory apparatus 21.

Second Embodiment

Figure 2:
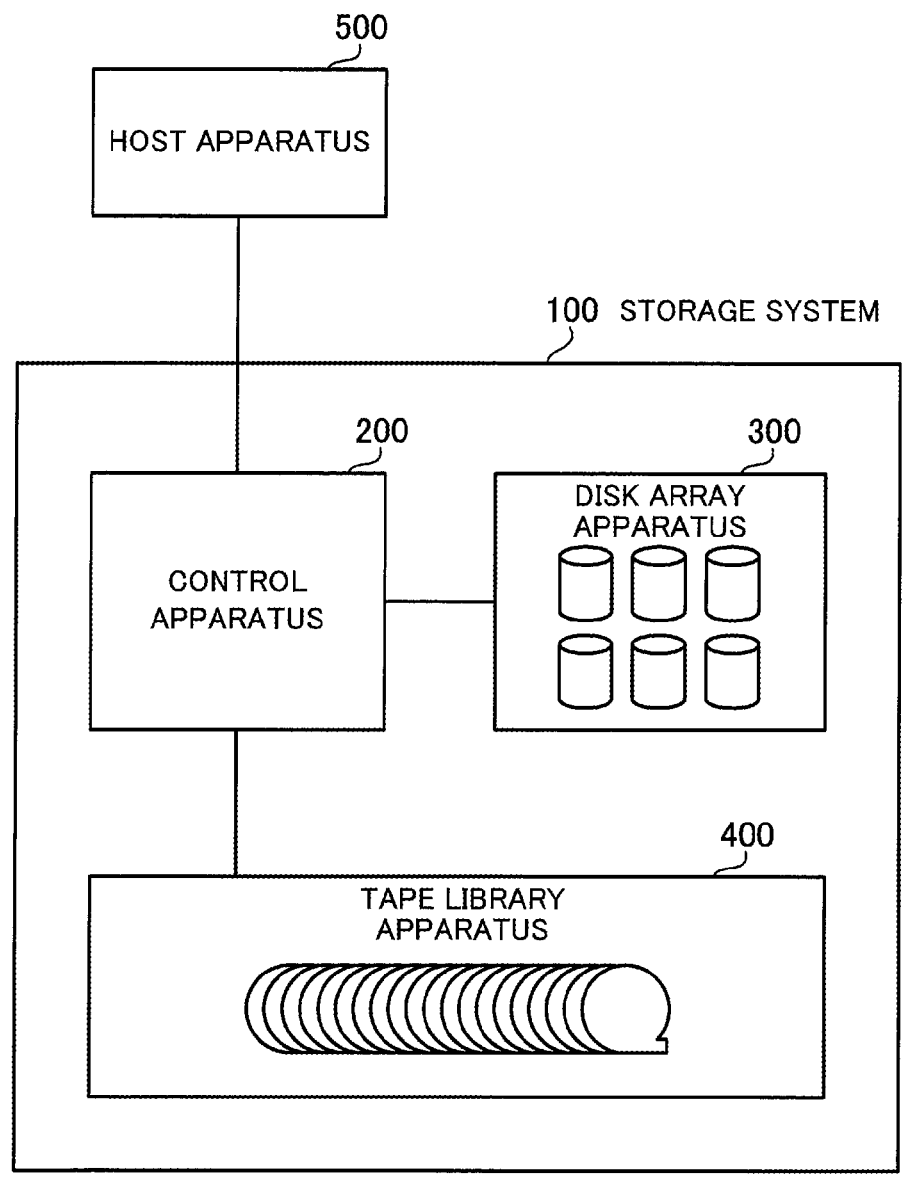
FIG. 2 illustrates a system configuration example of a storage system according to a second embodiment.

FIG. 2 illustrates a system configuration example of a storage system according to a second embodiment. The storage system 100 illustrated in FIG. 2 includes: a control apparatus 200; a disk array apparatus 300; and a tape library apparatus 400. In addition, a host apparatus 500 is connected to the control apparatus 200.

The control apparatus 200 controls data transfer operation between the host apparatus 500 and the disk array apparatus 300, and data transfer operation between the disk array apparatus 300 and the tape library apparatus 400. The control apparatus 200 controls the storage system 100 to operate as a hierarchical virtual tape library system in which the tape library apparatus 400 is used as a back-end library apparatus, and in which the disk array apparatus 300 as a cache apparatus. Here, the virtual tape library system is the system in which the host apparatus 500 is virtually accessible through the disk array apparatus 300 to a high-capacity memory area achieved by the tape library apparatus 400.

The disk array apparatus 300 includes a plurality of HDDs as a recording medium that achieves a memory area of the cache apparatus in the virtual tape library system. It is to be noted that the disk array apparatus 300 may include other type of nonvolatile memory apparatus, such as an SSD, as the recording medium for achieving the memory area of the cache apparatus.

The tape library apparatus 400 is a memory apparatus using a plurality of magnetic tapes as a recording medium that achieves a back-end memory area in the virtual tape library system. As will be mentioned later, the tape library apparatus 400 includes one or more tape drives that perform data access to the magnetic tape, a mechanism that transports a tape cartridge having the magnetic tape housed therein, and the like.

It is to be noted that as the recording medium that achieves the back-end memory area of the virtual tape library system, in addition to the magnetic tape, a portable recording medium, such as an optical disk, a magnetic optical disk, is also utilized.

In addition, the control apparatus 200, the disk array apparatus 300, and the tape library apparatus 400 are, for example, provided in one cabinet or respectively provided in an individual cabinet. Alternatively, for example, the control apparatus 200 and the disk array apparatus 300 may be provided in one cabinet, and the tape library apparatus 400 may be provided in another cabinet.

The host apparatus 500 issues an access request to the control apparatus 200 according to user's input operation, and thereby accesses a logical volume defined in the virtual tape library system. The logical volume is a logical memory area provided for a user using a physical memory area of the storage system 100.

Figure 3:
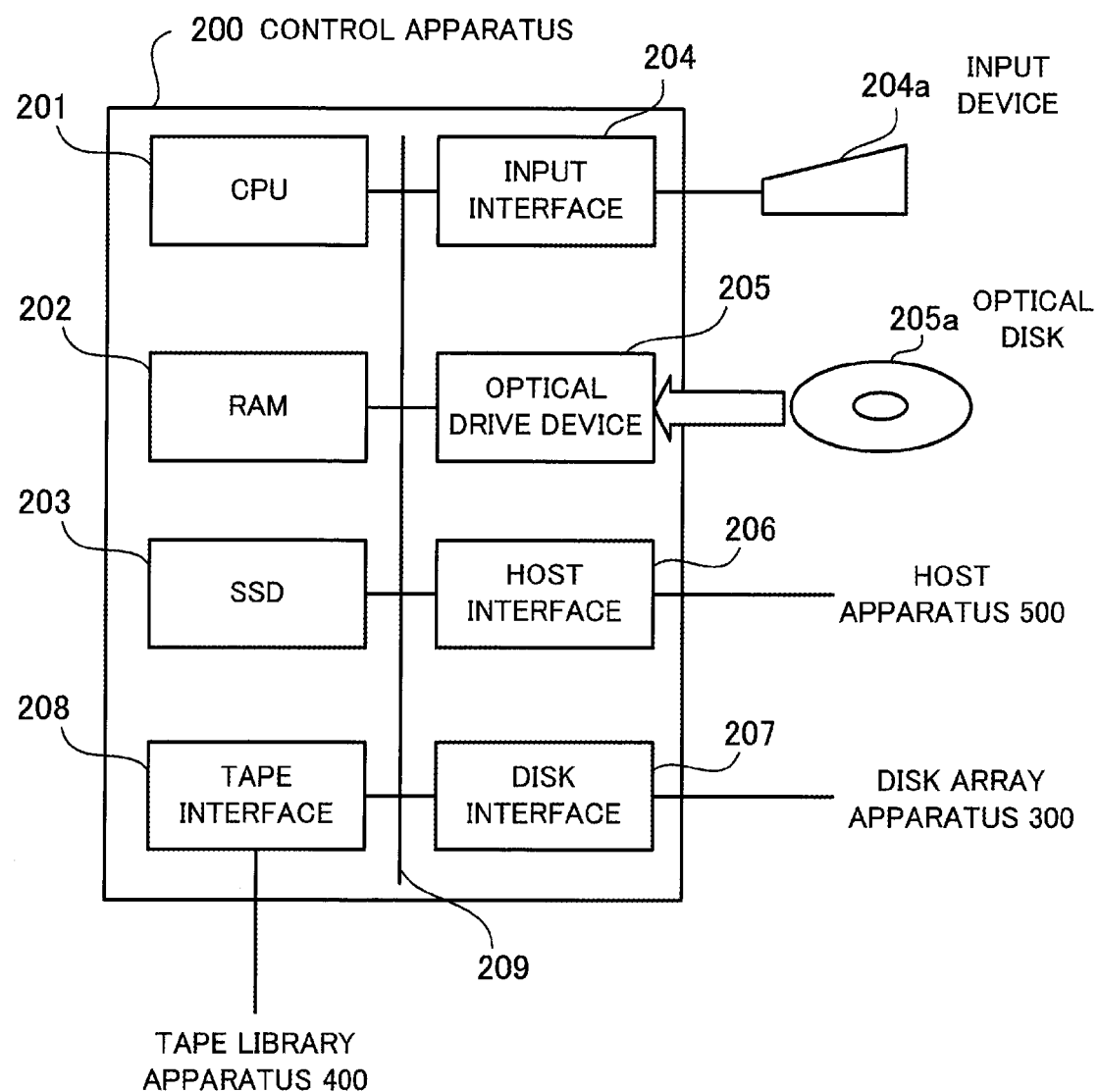
FIG. 3 illustrates a hardware configuration example of a control apparatus.

FIG. 3 illustrates a hardware configuration example of the control apparatus. The control apparatus 200 is achieved as, for example, a computer as illustrated in FIG. 3.

The whole control apparatus 200 is controlled by a CPU (Central Processing Unit) 201. A RAM 202 and a plurality of peripheral devices are connected to the CPU 201 through a bus 209.

The RAM 202 is used as a main memory apparatus for the control apparatus 200. At least a part of a firmware program to be executed by the CPU 201 is temporarily stored in the RAM 202. In addition, various types of data needed for processing by the CPU 201 are stored in the RAM 202.

The peripheral devices connected to the bus 209 include an SSD 203, an input interface 204, an optical drive device 205, a host interface 206, a disk interface 207, and a tape interface 208.

The SSD 203 is used as a secondary memory apparatus of the control apparatus 200. The firmware program and various types of data are stored in the SSD 203. It is to be noted that as the secondary memory apparatus, other type of nonvolatile memory apparatus, such as an HDD, may be used.

For example, an input device 204a provided with various types of operation keys and the like is connectable to the input interface 204. The input interface 204 transmits a signal from the input device 204a to the CPU 201 through the bus 209. It is to be noted that the input device 204a may be installed in the control apparatus 200.

The optical drive device 205 reads data recorded on an optical disk 205a utilizing a laser beam or the like. The optical disk 205a is a portable recording medium on which data has been recorded so as to be readable by light reflection. In the optical disk 205a, there are, for example, included: a DVD (Digital Versatile Disc); a DVD-RAM; a CD-ROM (Compact Disc Read Only Memory); a CD-R (Recordable)/RW (Rewritable); and the like.

The host interface 206 is a communication interface that transmits and receives data to and from the host apparatus 500. The disk interface 207 is a communication interface that transmits and receives data to and from the disk array apparatus 300. The tape interface 208 is a communication interface that transmits and receives data to and from the tape library apparatus 400.

It is to be noted that similar to the control apparatus 200, the host apparatus 500 is also achievable as a computer including a CPU, a RAM, a peripheral device, and the like.

Figure 4:
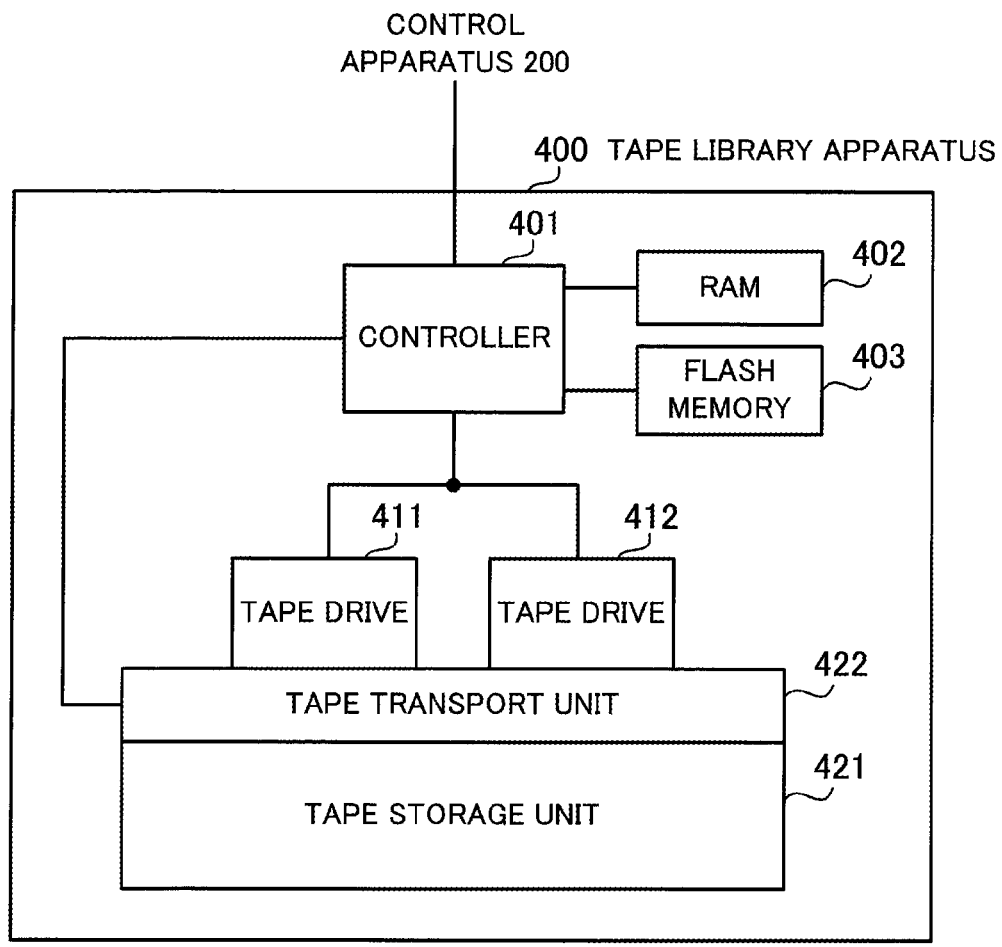
FIG. 4 illustrates a hardware configuration example of a tape library apparatus.

FIG. 4 illustrates a hardware configuration example of the tape library apparatus. The tape library apparatus 400 includes: a controller 401, a RAM 402, a flash memory 403, tape drives 411 and 412, a tape storage unit 421, and a tape transport unit 422.

The controller 401, for example, includes a CPU, and totally controls the whole tape library apparatus 400. At least a part of a firmware program to be executed by the controller 401 is temporarily stored in the RAM 402. In addition, various types of data needed for processing by the controller 401 are stored in the RAM 402. The firmware program and various types of data are stored in the flash memory 403.

Each of the tape drives 411 and 412 mounts one tape cartridge transported by the tape transport unit 422, and performs write of data in a magnetic tape in the mounted tape cartridge and read of the data from the magnetic tape under control of the controller 401. It is to be noted that the number of tape drives included in the tape library apparatus 400 is not particularly limited.

The plurality of tape cartridges is stored in the tape storage unit 421. The tape transport unit 422 transports the tape cartridge under control of the controller 401. The tape transport unit 422, for example, transports the tape cartridge stored in the tape storage unit 421 to either the tape drive 411 or 412, and then mounts the tape cartridge. In addition, the tape transport unit 422 unmounts the tape cartridge from either the tape drive 411 or 412, and transports it to the tape storage unit 421 to store therein.

Figure 5:
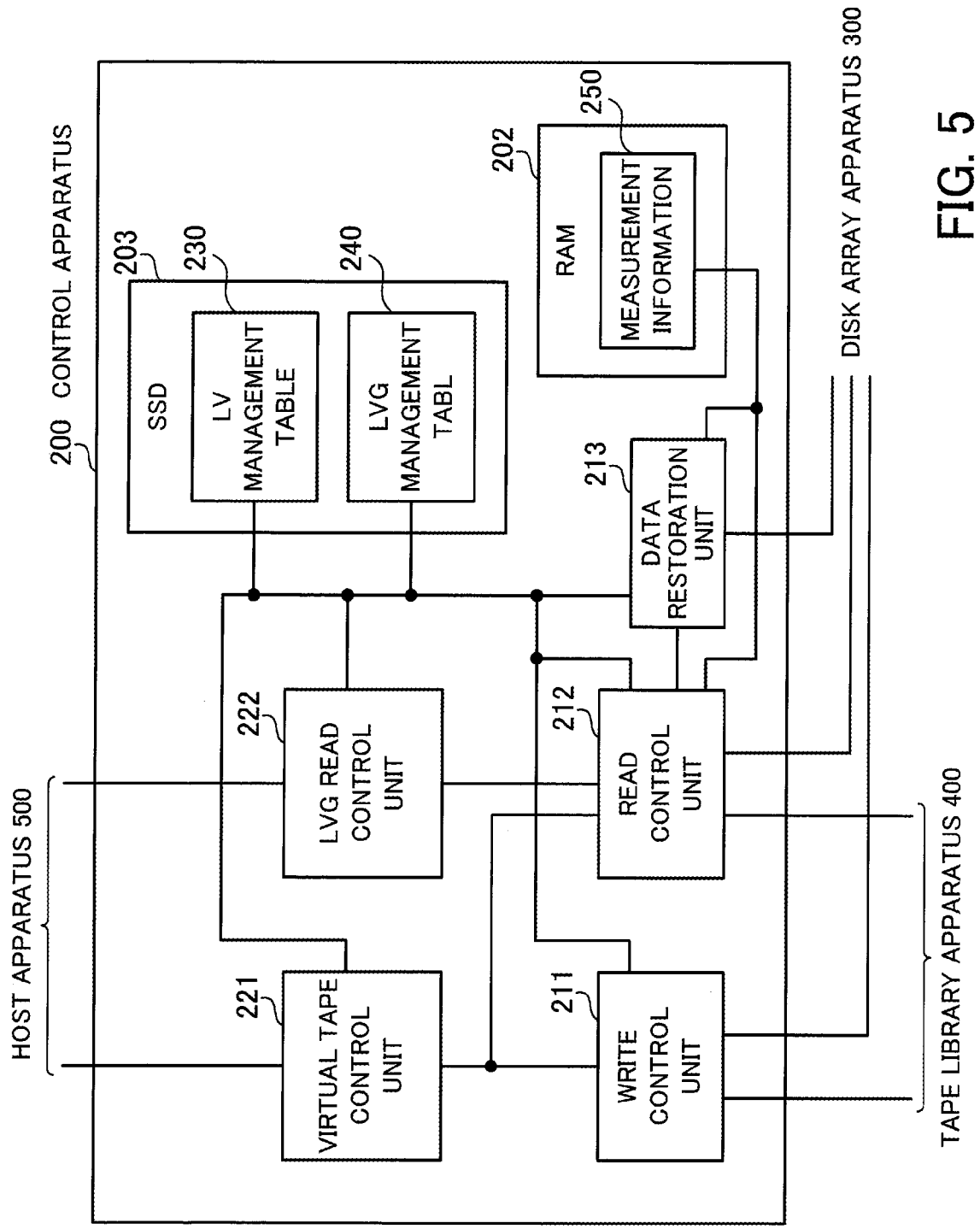
FIG. 5 is a block diagram illustrating an example of processing functions included in the control apparatus.

FIG. 5 is a block diagram illustrating an example of processing functions included in the control apparatus.

The control apparatus 200 includes: a write control unit 211, a read control unit 212, a data restoration unit 213, a virtual tape control unit 221, and an LVG (Logical Volume Group) read control unit 222. Processing of the each unit is, for example, achieved by the CPU 201 of the control apparatus 200 executing a predetermined firmware program.

In addition, an LV (Logical Volume) management table 230 and an LVG management table 240 are stored in the SSD 203 of the control apparatus 200. It is to be noted that at least one of the LV management table 230 and the LVG management table 240 may be, for example, stored in any one of HDDs of the disk array apparatus 300. Furthermore, measurement information 250 is temporarily stored in the RAM 202 of the control apparatus 200.

The write control unit 211 transfers data in the disk array apparatus 300 to the tape library apparatus 400 according to an instruction from the virtual tape control unit 221, and requests the tape library apparatus 400 to write the transferred data in the magnetic tape. In addition, the write control unit 211 may also write data received from the host apparatus 500 in the disk array apparatus 300 according to the instruction from the virtual tape control unit 221.

Here, data transfer to the tape library apparatus 400 according to the instruction from the virtual tape control unit 221 is executed with a logical volume group (LVG) configured with previously set one or more logical volumes (LVs) being as a unit. In transferring the logical volume group to the tape library apparatus 400, the write control unit 211 calculates parity using data of each logical volume belonging to the logical volume group, and stores the calculated parity in the disk array apparatus 300.

The read control unit 212 requests to the tape library apparatus 400 data read from the magnetic tape according to the instruction from the virtual tape control unit 221 or the LVG read control unit 222. The read control unit 212 stores in the disk array apparatus 300 data transmitted from the tape library apparatus 400 according to the read request. In addition, the read control unit 212 reads data from the disk array apparatus 300 according to the instruction from the virtual tape control unit 221, and transfers it to the virtual tape control unit 221.

Here, when requested to perform data read from the tape library apparatus 400 in a logical volume group unit, the read control unit 212 makes the data restoration unit 213 restore a part of the logical volumes belonging to the logical volume group using the parity without reading it from the tape library apparatus 400. A time required for data read from the tape library apparatus 400 is, for example, long as compared with a time required for data read from the disk array apparatus 300. As described above, the part of the logical volumes in the logical volume group is restored by the data restoration unit 213, a data amount actually read from the tape library apparatus 400 decreases, and thereby a time required until data of the whole logical volume group is stored in the disk array apparatus 300 is reduced.

The data restoration unit 213 restores the part of the logical volumes in the logical volume group using data having been read from the tape library apparatus 400 among data in the same logical volume group, and the parity stored in the disk array apparatus 300.

The virtual tape control unit 221 instructs the write control unit 211 or the read control unit 212 to execute processing, such as data access to the HDD in the disk array apparatus 300, and data access to the magnetic tape in the tape library apparatus 400 according to an access request from the host apparatus 500 to the virtual tape library system. The virtual tape control unit 221, for example, performs the following control.

The virtual tape control unit 221 secures an area for the logical volume in the disk array apparatus 300. When receiving a request of write in the logical volume from the host apparatus 500, the virtual tape control unit 221 writes the data requested to be written in a corresponding area on the disk array apparatus 300. The virtual tape control unit 221 writes the logical volume having data written therein in the magnetic tape in the tape library apparatus 400 at arbitrary timing after writing the data in the disk array apparatus 300. Here, in writing the logical volume in the disk array apparatus 300 in the tape library apparatus 400, the virtual tape control unit 221 performs control so that all the logical volumes in the logical volume group to which the logical volume to be written belongs are written in the magnetic tape in the tape library apparatus 400.

In addition, when free space of the disk array apparatus 300 decreases to not more than predetermined one, the virtual tape control unit 221 erases from the disk array apparatus 300 the logical volume group with a longest final access time among the logical volume groups in the disk array apparatus 300. At this time, when data that has not been written in the magnetic tape in the tape library apparatus 400 is present in the logical volume group targeted for erasure, the virtual tape control unit 221 performs control so that the logical volume group to be erased is written in the magnetic tape in the tape library apparatus 400.

It is to be noted that in writing the logical volume in the magnetic tape, the virtual tape control unit 221 associates information indicating a write destination of the logical volume with identification information of the logical volume, and registers it in the LV management table 230.

Meanwhile, when receiving a data read request from the host apparatus 500, the virtual tape control unit 221 determines whether or not the logical volume including the data requested to be read is cached in the disk array apparatus 300. When the logical volume is cached in the disk array apparatus 300, the virtual tape control unit 221 reads from the disk array apparatus 300 the data requested to be read, and transmits it to the host apparatus 500.

Meanwhile, when the logical volume is not cached in the disk array apparatus 300, the virtual tape control unit 221 refers to the LV management table 230, and specifies a magnetic tape in which the logical volume is stored. The virtual tape control unit 221 reads the logical volume from the specified magnetic tape, and writes it in the disk array apparatus 300. It is to be noted that data transfer processing from the magnetic tape to the disk array apparatus 300 at this time is called "recall". The virtual tape control unit 221 reads from the logical volume written in the disk array apparatus 300 the data requested to be read, and transmits it to the host apparatus 500.

The LVG read control unit 222 requests data read from the tape library apparatus 400 in the logical volume group unit to the read control unit 212, for example, according to a request from the host apparatus 500 or the like. As a case where such read is requested, for example, there is included processing that reads the logical volume group stored in the magnetic tape of the tape library apparatus 400 to the disk array apparatus 300, and moves it to other apparatus (for example, an disk array apparatus in other storage system). Alternatively, there is also included processing that once reads to the disk array apparatus 300 LVGs distributedly stored in the plurality of magnetic tapes of the tape library apparatus 400, and collectively copies them to a magnetic tape for an external storage other than the magnetic tape for the virtual tape library.

Next, will be described information to be registered in the LV management table 230, LVG management table 240, and the measurement information 250.

Figure 6:
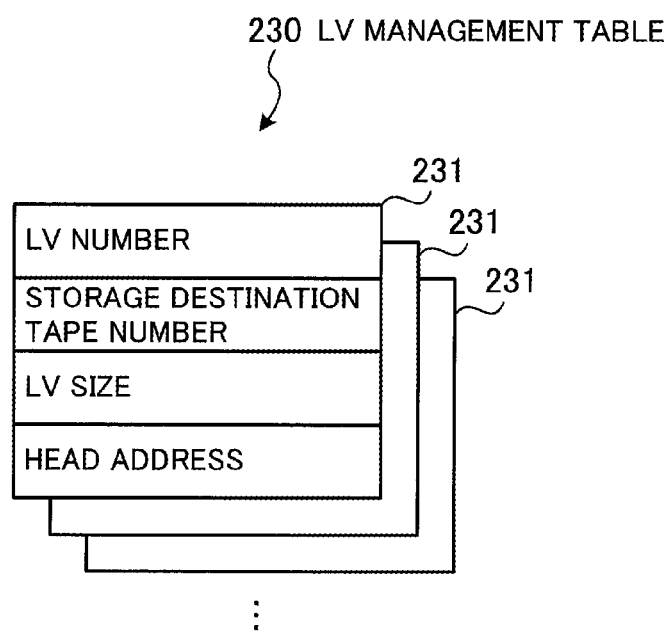
FIG. 6 illustrates an example of information registered in an LV (Logical Volume) management table.

FIG. 6 illustrates an example of information registered in the LV management table.

The LV management table 230 holds information indicating in which position of which magnetic tape a logical volume defined on the virtual tape library system is stored. A record 231 is generated for each logical volume in the LV management table 230, and each field of an "LV number", a "storage destination tape number", an "LV size", and a "head address" is provided in each record 231.

An identification number for identifying a corresponding logical volume is registered in the field of the "LV number". An identification number for identifying a magnetic tape in which the corresponding logical volume is stored is registered in the field of the "storage destination tape number". A size of the corresponding logical volume is registered in the field of the "LV size". An address indicating a head of an area in the magnetic tape in which the corresponding logical volume is stored is registered in the field of the "head address".

Figure 7:
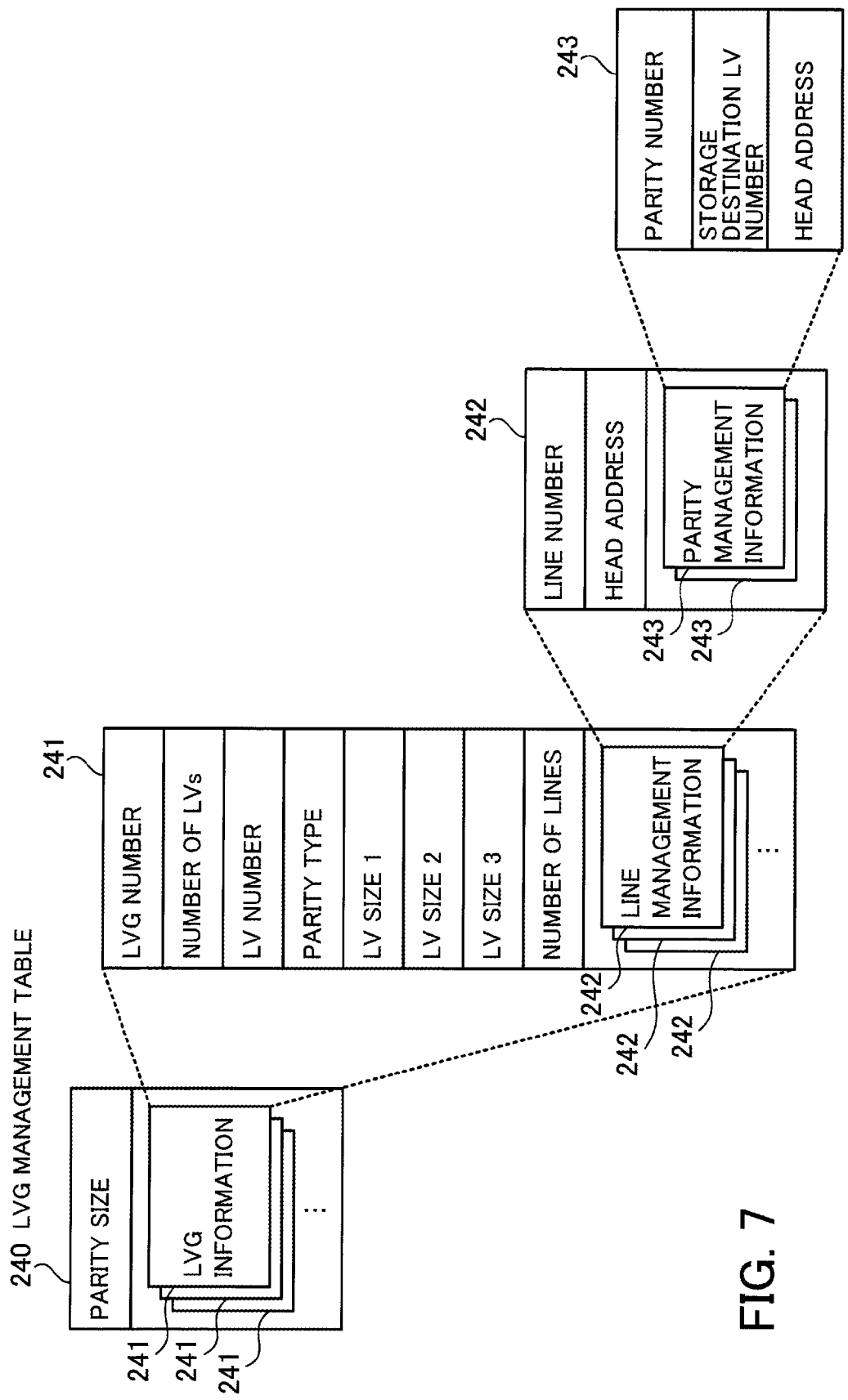
FIG. 7 illustrates an example of information registered in an LVG (Logical Volume Group) management table.

FIG. 7 illustrates an example of information registered in the LVG management table. The LVG management table 240 holds information for managing the logical volume belonging to the logical volume group, and holds information needed in reading the logical volume group from the magnetic tape in the tape library apparatus 400.

A field of a "parity size" is provided in the LVG management table 240 as information common to all the logical volume groups. A size of parity that the write control unit 211 calculates with one parity operation is registered in the field of the "parity size". The size of the parity is equal to a size of one block obtained by dividing the logical volume at the time of the parity operation. Note that the block will be described in detail later.

In addition, LVG information 241 is registered in the LVG management table 240 for each logical volume group. Each field of an "LVG number", "the number of LVs", the "LV number", a "parity type", an "LV size 1", an "LV size 2", an "LV size 3", and "the number of lines" is provided in each LVG information 241.

An identification number for identifying the corresponding logical volume group is registered in the field of the "LVG number". The number of logical volumes belonging to the corresponding logical volume group is registered in the field of "the number of LVs". A list of identification numbers for identifying each logical volume belonging to the corresponding logical volume group is registered in the field of the "LV number". It is to be noted that which logical volume is made to belong to which logical volume group may be set by the user through the host apparatus 500, and information according to the user's setting operation is registered in each field of "the number of LVs" and the "LV number".

In the field of the "parity type", a type of parity which is calculated by the write control unit 211 is registered when the corresponding logical volume group is written in the magnetic tape in the tape library apparatus 400. The type of the parity is information for identifying the parity to be "single parity" in which one type of parity (parity P) is calculated, or to be "double parity" in which two types of parity (parities P and Q) are calculated. It is to be noted that for example, information according to the user's setting operation is registered also in the field of the "parity type".

A size of a maximum logical volume of the logical volumes belonging to the corresponding logical volume group is registered in the field of the "LV size 1". A size of a second largest logical volume of the logical volumes belonging to the corresponding logical volume group is registered in the field of the "LV size 2". A size of a third largest logical volume of the logical volumes belonging to the corresponding logical volume group is registered in the field of the "LV size 3".

The number of blocks obtained from the maximum size of logical volume of the logical volumes belonging to the corresponding logical volume group is indicated in the field of "the number of lines". Information of the field of "the number of lines" is obtained by dividing the size registered in the field of the "LV size 1" by the size registered in the field of the "parity size".

Information of each field of the "LV size 1", "LV size 2", "LV size 3", and "the number of lines" is automatically registered by the virtual tape control unit 221, for example, when the logical volume made to belong to the logical volume group is set by the user. It is to be noted that information may just be registered in the field of the "LV size 3" only when the registered information of the field of the "parity type" indicates the double parity.

Furthermore, line management information 242 is registered in the LVG information 241 for each line. The number of pieces of the line management information 242 registered in the LVG information 241 coincides with the number registered in the field of "the number of lines". Each field of the "line number" and the "head address" is provided in the line management information 242.

An identification number for identifying a corresponding line is registered in the field of the "line number". The identification number is allocated in order from a head of the line. Information indicating a position from the head of the corresponding line is registered in the field of the "head address". An address of the head line is "0", and an address of a next line is a value obtained by adding addresses corresponding to the size registered in the field of the "parity size" to the address of the previous line.

In addition, parity management information 243 is registered in the line management information 242 for each parity. When the registered information of the field of the "parity type" indicates single parity, one piece of parity management information 243 is registered in the line management information 242. Meanwhile, when the registered information of the field of the "parity type" indicates double parity, two pieces of parity management information 243 are registered in the line management information 242.

The parity management information 243 indicates where in a memory area of the disk array apparatus 300 parity corresponding to a logical volume group identified by the "LVG number" and a line identified by the "line number" is stored. Namely, the parity managed by the parity management information 243 indicates data obtained by dividing a batch of parity calculated from one logical volume group in a line unit.

Each field of the "parity number", the "storage destination LV number", and the "head address" is provided in the parity management information 243. The "parity number" is an identification number for identifying corresponding parity. It is to be noted that for example, identification numbers continuous in order of the lines are given to the parity of the same logical volume group. An identification number of a logical volume on the disk array apparatus 300 in which the corresponding parity is stored is registered in the field of the "storage destination LV number". It is to be noted that the logical volume indicated by the "storage destination LV number" is one of logical volumes that do not belong to the logical volume group. In the "head address" registered is information indicating where in the logical volume indicated by the "storage destination LV number" a head portion of a memory area of the corresponding parity is located.

Figure 8:
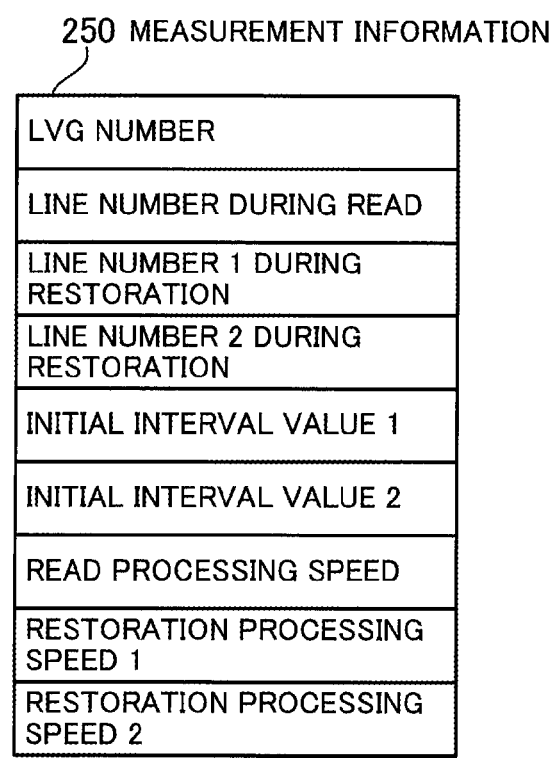
FIG. 8 illustrates an example of information registered in measurement information.

FIG. 8 illustrates an example of information registered in the measurement information.

The measurement information 250 is information that is registered and is also referred to by the read control unit 212 and the data restoration unit 213, when data is read from the magnetic tape in the tape library apparatus 400 to the disk array apparatus 300 with the logical volume group being as a unit. In the measurement information 250, provided is each field of the "LVG number", a "line number during read", a "line number 1 during restoration", a "line number 2 during restoration", an "initial interval value 1", an "initial interval value 2", a "read processing speed", a "restoration processing speed 1", and a "restoration processing speed 2".

An identification number for identifying a logical volume group to be read is registered in the field of the "LVG number". In starting processing that reads a certain logical volume group from the magnetic tape in the tape library apparatus 400, the read control unit 212 generates to the RAM 202 the measurement information 250 in which the identification number of the certain logical volume group is registered in the field of the "LVG number". Since then, until the whole logical volume group is written in the disk array apparatus 300, information of the fields other than the "LVG number" in the generated measurement information 250 is updated as needed by the read control unit 212 or the data restoration unit 213.

In the field of the "line number during read", registered is a line number indicating data of which line is during read in the logical volume during read from the magnetic tape in the tape library apparatus 400.

A line number indicating data of which line is during restoration in the logical volume during restoration using parity is registered in each field of the "line number 1 during restoration" and "line number 2 during restoration". In the field of the "line number 1 during restoration", registered are a line number in restoration processing in process examples 1 and 2 that will be described hereinafter, and a line number in restoration processing using the parity P in a process example 3 that will be described hereinafter. A line number in restoration processing using the parity Q in the process example 3 is registered in the field of the "line number 2 during restoration".

The number of lines used to decide timing to start restoration processing using the parity, or timing to restart it is registered in each field of the "initial interval value 1" and the "initial interval value 2". In executing restoration processing of a certain logical volume, the data restoration unit 213 executes it so that an interval between a line during restoration in the certain logical volume and a line during read or during restoration in a logical volume previous to the certain logical volume in order of read becomes not less than the number of lines registered in the field of the "initial interval value 1" or the "initial interval value 2".

The number of lines used for the restoration processing in the process examples 1 and 2 that will be described hereinafter is registered in the field of the "initial interval value 1", and the number of lines used for the restoration processing using the parity Q in the process example 3 is registered in the field of the "initial interval value 2". Information of each field of the "initial interval value 1" and the "initial interval value 2" is calculated by the data restoration unit 213.

A measurement result of a read processing speed of the logical volume from the magnetic tape by the read control unit 212 is registered in the field of the "read processing speed". A measurement result of a restoration processing speed of the logical volume using the parity by the data restoration unit 213 is registered in each field of the "restoration processing speed 1" and the "restoration processing speed 2". Measurement results of restoration processing speeds in the process examples 1 and 2 that will be described hereinafter are registered in the field of the "restoration processing speed 1", and a measurement result of a restoration processing speed using the parity Q in the process example 3 is registered in the field of the "restoration processing speed 2".

Figure 9:
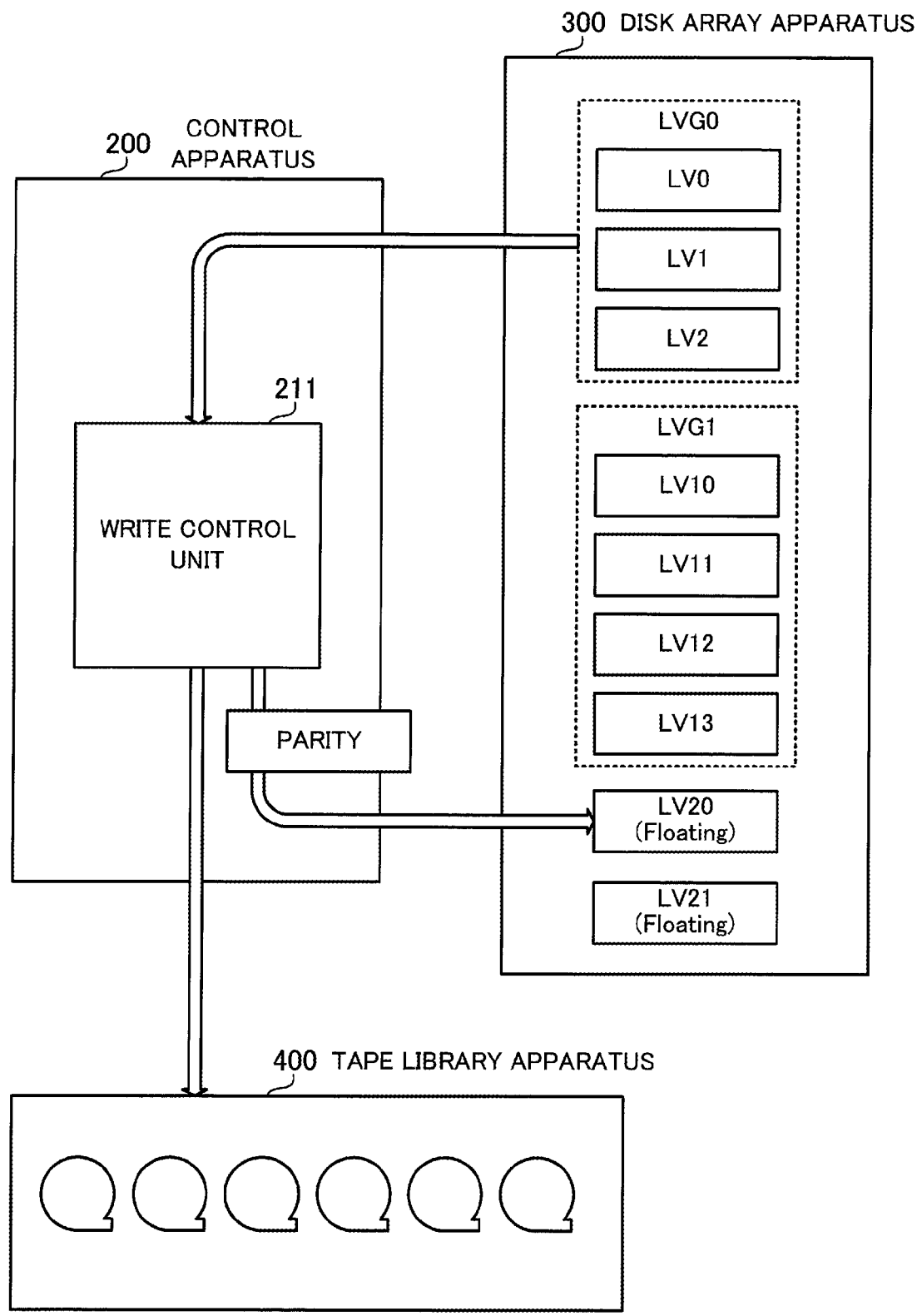
FIG. 9 is a diagram for describing a summary of write processing of a logical volume group for a magnetic tape in the tape library apparatus.

Next, FIG. 9 is a diagram for describing a summary of write processing of a logical volume group in a magnetic tape in the tape library apparatus.

The control apparatus 200 allocates an arbitrary plurality of logical volumes on a virtual tape library system to a logical volume group according to an instruction from a user through the host apparatus 500. The logical volumes allocated to the logical volume group come to be recognized by the host apparatus 500, for example, as a logical memory area to which the user is accessible. Meanwhile, the control apparatus 200 manages as an area called floating a logical volume that is not allocated to the logical volume group and is not recognized by the host apparatus 500.

In an example illustrated in FIG. 9, logical volumes LV0 to LV2 are allocated to a logical volume group LVG0, and logical volumes LV10 to LV13 are allocated to a logical volume group LVG1. Meanwhile, both logical volumes LV20 and LV21 belong to a floating area.

As mentioned above, the write control unit 211 of the control apparatus 200 executes data transfer to the tape library apparatus 400 according to an instruction from the virtual tape control unit 221 in a logical volume group unit. In writing the logical volume group in the magnetic tape in the tape library apparatus 400, the write control unit 211 calculates parity using data of each logical volume belonging to the logical volume group, and stores the calculated parity in a predetermined memory area in the disk array apparatus 300. The write control unit 211, for example, stores the calculated parity in a logical volume belonging to the floating area.

In the example illustrated in FIG. 9, in writing data of the logical volume group LVG0 in the tape library apparatus 400, the write control unit 211 calculates parity based on data of the logical volumes LV0 to LV2 belonging to the logical volume group LVG0. The write control unit 211 stores the calculated parity in the logical volume LV20 belonging to the floating area. The parity stored in the logical volume LV20 is then referred to by the data restoration unit 213 when the logical volume group LVG0 is read from the magnetic tape in the tape library apparatus 400 to the disk array apparatus 300.

Incidentally, the write control unit 211 may, for example, calculate one type of parity, or may calculate two types of parity (parities P and Q) by different calculation methods. Consequently, in the following description, an example where one type of parity is calculated will be described as the "process example 1", and examples where two types of parity are calculated will be described as the "process example 2" and the "process example 3".

Process Example 1

Figure 10:
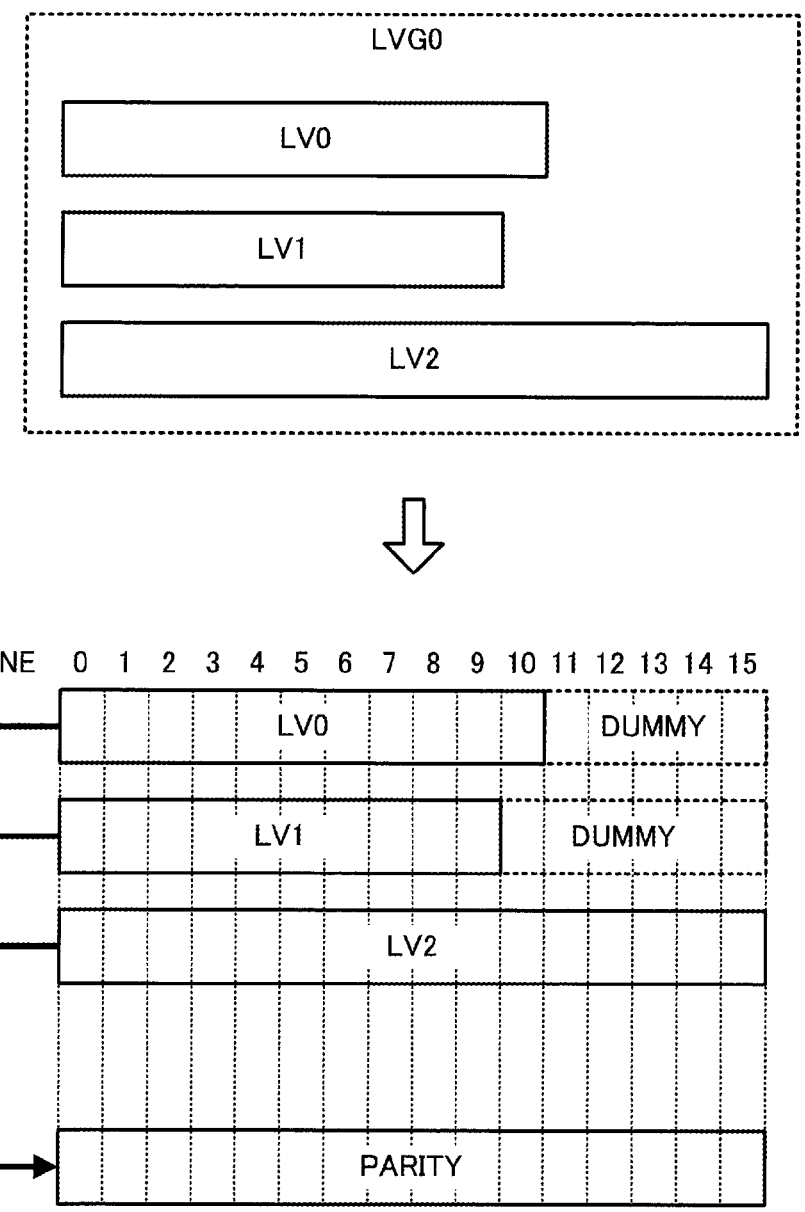
FIG. 10 is a diagram for describing parity calculation processing in a process example 1.

FIG. 10 is a diagram for describing parity calculation processing in the process example 1. Hereinafter, as an example, the parity calculation processing will be described assuming that the logical volumes LV0 to LV2 belong to one logical volume group LVG0.

Each of the plurality of logical volumes belonging to the logical volume group does not necessarily have a same size. Consequently, in calculating parity, the write control unit 211 adds dummy data to a back end of the logical volume belonging to the logical volume group, and thereby equalizes the size of each logical volume.

The dummy data has a predetermined uniform value, such as "0". In addition, the dummy data may just be added to at least logical volumes other than the logical volume of maximum size of the logical volumes belonging to the logical volume group. In an example illustrated in FIG. 10, a size of the logical volume LV2 is the maximum of the logical volumes LV0 to LV2 belonging to the same logical volume group. The write control unit 211, for example, as illustrated in a lower side of FIG. 10, equalizes the sizes of the logical volumes LV0 to LV2 by adding dummy data to each of the logical volumes LV0 and LV1.

It is to be noted that after this, for the purpose of simplification of the description, when dummy data is added to the back end of the logical volume, the whole logical volume including the added dummy data is referred to as the "logical volume". However, the dummy data is data temporarily added for parity calculation, and it is not actually written in the magnetic tape of the tape library apparatus 400.

After executing size equalization processing, the write control unit 211 calculates parity for each block obtained by dividing each of the logical volumes LV0 to LV2 for each certain size from a head thereof. Here, numbers of blocks from the respective heads of each logical volume belonging to the logical volume group and the parity calculated from the each logical volume are represented by the line numbers. The write control unit 211 calculates parity for each block using a block corresponding to a same line number in each logical volume belonging to the logical volume group.

For example, in FIG. 10, a block of a line number 0 in the parity is calculated based on a block of the line number 0 in each of the logical volumes LV0 to LV2. Similarly, a block of a line number 1 in the parity is calculated based on a block of a line number 1 in each of the logical volumes LV0 to LV2.

In addition, although a block of a line number 10 in the parity is calculated based on a block of a line number 10 in each of the logical volumes LV0 to LV2, dummy data is used as the block of the line number 10 in the logical volume LV1. As described above, even when the sizes of the logical volumes belonging to the logical volume group are not equal to one another, the write control unit 211 calculates parity based on the data of the logical volumes by adding dummy data to back ends of the logical volumes.

It is to be noted that at the time of parity calculation processing, a memory area of the whole dummy data to be added need not be secured in the memory area of the disk array apparatus 300. For example, the write control unit 211 stores dummy data for one block in the memory area of the disk array apparatus 300. When dummy data is then needed in calculating a block of parity corresponding to a certain line number, the write control unit 211 reads the stored dummy data for one block from the disk array apparatus 300.

Figure 11:
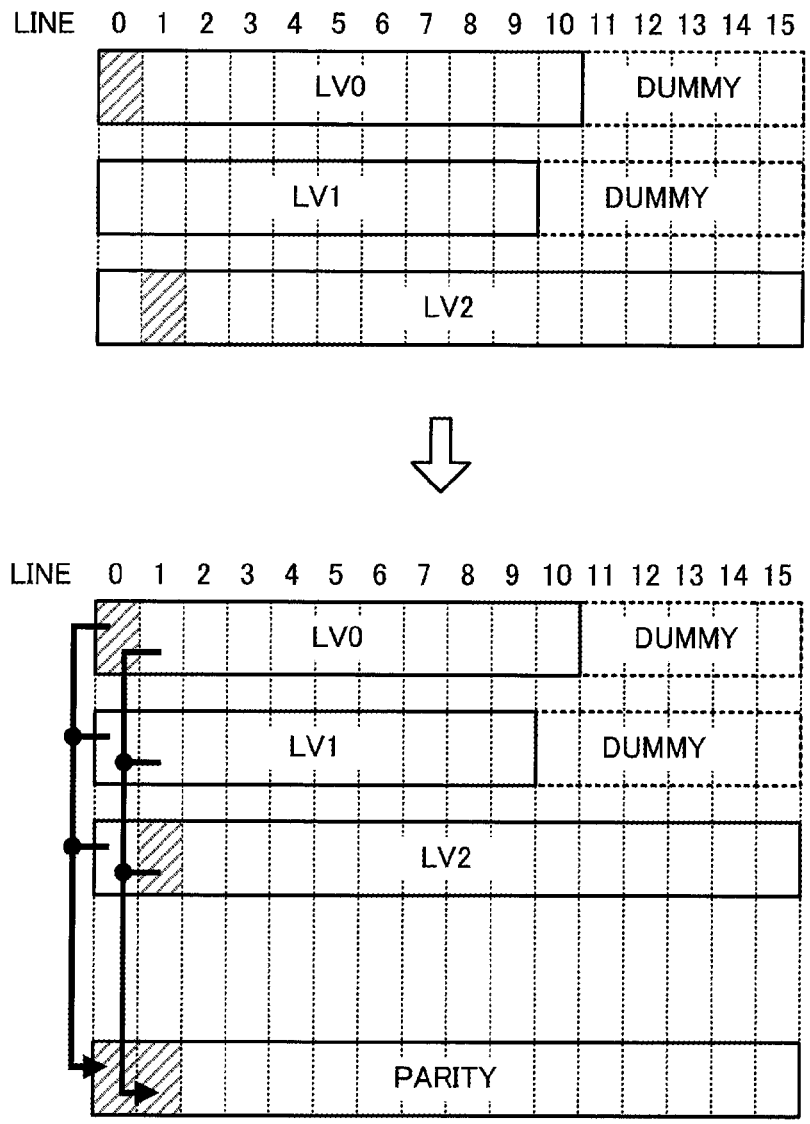
FIG. 11 is a diagram for describing parity calculation processing when only a part of logical volumes is updated.

FIG. 11 is a diagram for describing parity calculation processing when only a part of the logical volume is updated.

When writing data of a newly generated logical volume group in the magnetic tape in the tape library apparatus 400, the write control unit 211, as illustrated in FIG. 10, newly calculates the whole parity, and writes it in the disk array apparatus 300. Meanwhile, when the write control unit 211 has written the data of the logical volume group in the magnetic tape of the tape library apparatus 400 once or more times, parity corresponding to the logical volume group has already been stored in the disk array apparatus 300. When writing again the data of the logical volume group in the magnetic tape in the tape library apparatus 400 from such a state, the write control unit 211 may just perform recalculation of only a block of parity corresponding to an updated portion of the data in the logical volume group.

For example, as illustrated in an upper side of FIG. 11, assume that the block of the line number 0 in the logical volume LV0 and the block of the line number 1 in the logical volume LV2 are updated. In this case, as illustrated in a lower side of FIG. 11, in writing the logical volumes LV0 to LV2 in the magnetic tape in the tape library apparatus 400, the write control unit 211 recalculates only the blocks corresponding to the lines 0 and 1 of the parity stored in the disk array apparatus 300, and overwrites and saves them in the disk array apparatus 300. Specifically, the write control unit 211 recalculates the block of the line number 0 in the parity based on the block of the line number 0 in each of the logical volumes LV0 to LV2. In addition, the write control unit 211 recalculates a block of a line number 1 in the parity based on the block of the line number 1 in each of the logical volumes LV0 to LV2.

Figure 12:
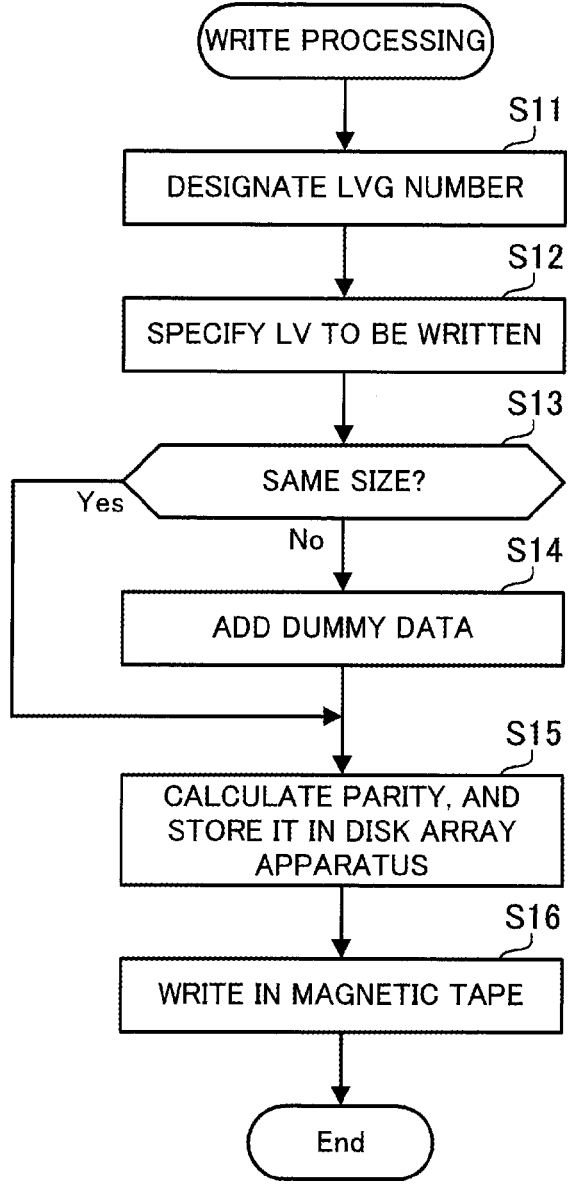
FIG. 12 is a flow chart illustrating an example of a write processing procedure for the magnetic tape in the tape library apparatus in a logical volume group unit.

FIG. 12 is a flow chart illustrating an example of a write processing procedure in the magnetic tape in the tape library apparatus in a logical volume group unit.

[Step S11] The virtual tape control unit 221 designates to the write control unit 221 an LVG number with which a logical volume group is identified, and requests write in the magnetic tape.

[Step S12] The write control unit 211 specifies logical volumes belonging to the logical volume group designated from the virtual tape control unit 221 with reference to the LVG management table 240.

[Step S13] The write control unit 211 reads a size of each logical volume specified in step S12 from the LV management table 240, and determines whether or not the size of each logical volume is the same as one another. When the size of each logical volume is the same as one another, the write control unit 211 executes processing of step S15. Meanwhile, when at least one size of each logical volume differs from a size of the other logical volumes, the write control unit 211 executes processing of step S14.

[Step S14] The write control unit 211 adds dummy data at least to logical volumes other than the logical volume of a maximum size of the specified logical volumes. As a result, the write control unit 211 equalizes the size of each logical volume.

[Step S15] The write control unit 211 reads the block of each logical volume from the disk array apparatus 300 in order of the line number, and calculates parity. The write control unit 211 stores the calculated parity in a predetermined logical volume belonging to the floating area in the disk array apparatus 300.

Whenever calculating the block corresponding to one line number in the parity, the write control unit 211 registers the line management information 242 corresponding to the line number in the LVG management table 240. It is to be noted that only one piece of parity management information 243 in the line management information 242 is registered in step S15.

[Step S16] The write control unit 211 transfers data of each logical volume specified in step S12 from the disk array apparatus 300 to the tape library apparatus 400, and instructs the tape library apparatus 400 to store the transferred data in the magnetic tape. The tape library apparatus 400, for example, sequentially selects an unused magnetic tape from the tape storage unit 421, mounts the selected magnetic tape in any of the tape drives 411 and 412, and writes the data received from the write control unit 211 in the mounted magnetic tape. The write control unit 211 receives from the tape library apparatus 400 an identification number and write position information of the magnetic tape in which each logical volume has been written, and registers them in a record of a corresponding logical volume in the LV management table 230.

Next, will be described processing in which the control apparatus 200 reads data from the magnetic tape of the tape library apparatus 400 in the logical volume group unit, and stores it in the disk array apparatus 300.

With the above-described processing by the write control unit 211, the parity corresponding to the logical volume group stored in the magnetic tape of the tape library apparatus 400 is stored in the disk array apparatus 300. When one type of parity is stored as in the process example 1, one of the logical volumes belonging to the logical volume group is restored using the other logical volumes and the parity.

Consequently, when receiving an instruction of data read of the logical volume group from the LVG read control unit 222, the read control unit 212 reads from the magnetic tape of the tape library apparatus 400 logical volumes excluding one of the logical volumes belonging to the instructed logical volume group. In addition, the read control unit 212 makes the data restoration unit 213 restore a remaining one logical volume instead of reading it from the magnetic tape, but using the read data of the logical volume and the parity stored in the disk array apparatus 300. As a result, a time required until data of the whole logical volume group is stored in the disk array apparatus 300 is reduced.

Furthermore, restoration processing of the logical volume by the data restoration unit 213 is executed in parallel with read processing of other one logical volume from the magnetic tape by the read control unit 212. As a result, the time required until the data of the whole logical volume group is stored in the disk array apparatus 300 is further reduced.

Here, first, using FIGS. 13 and 14, will be described a process example when the logical volume group LVG0 illustrated in FIG. 10 is read from the tape library apparatus 400 to the disk array apparatus 300.

Figure 13:
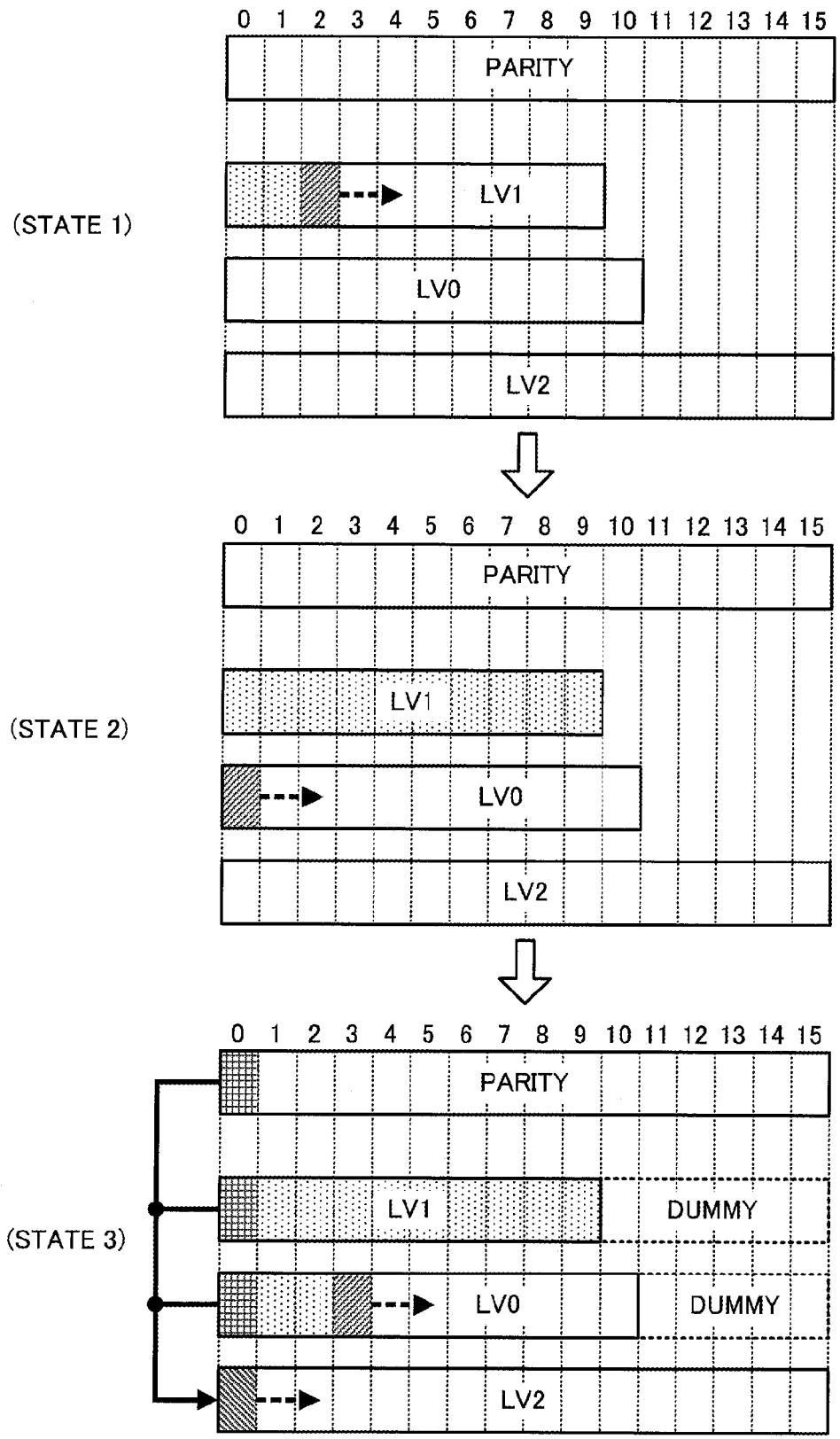
FIG. 13 illustrates an example of read processing of a logical volume group from the tape library apparatus.
Figure 14:
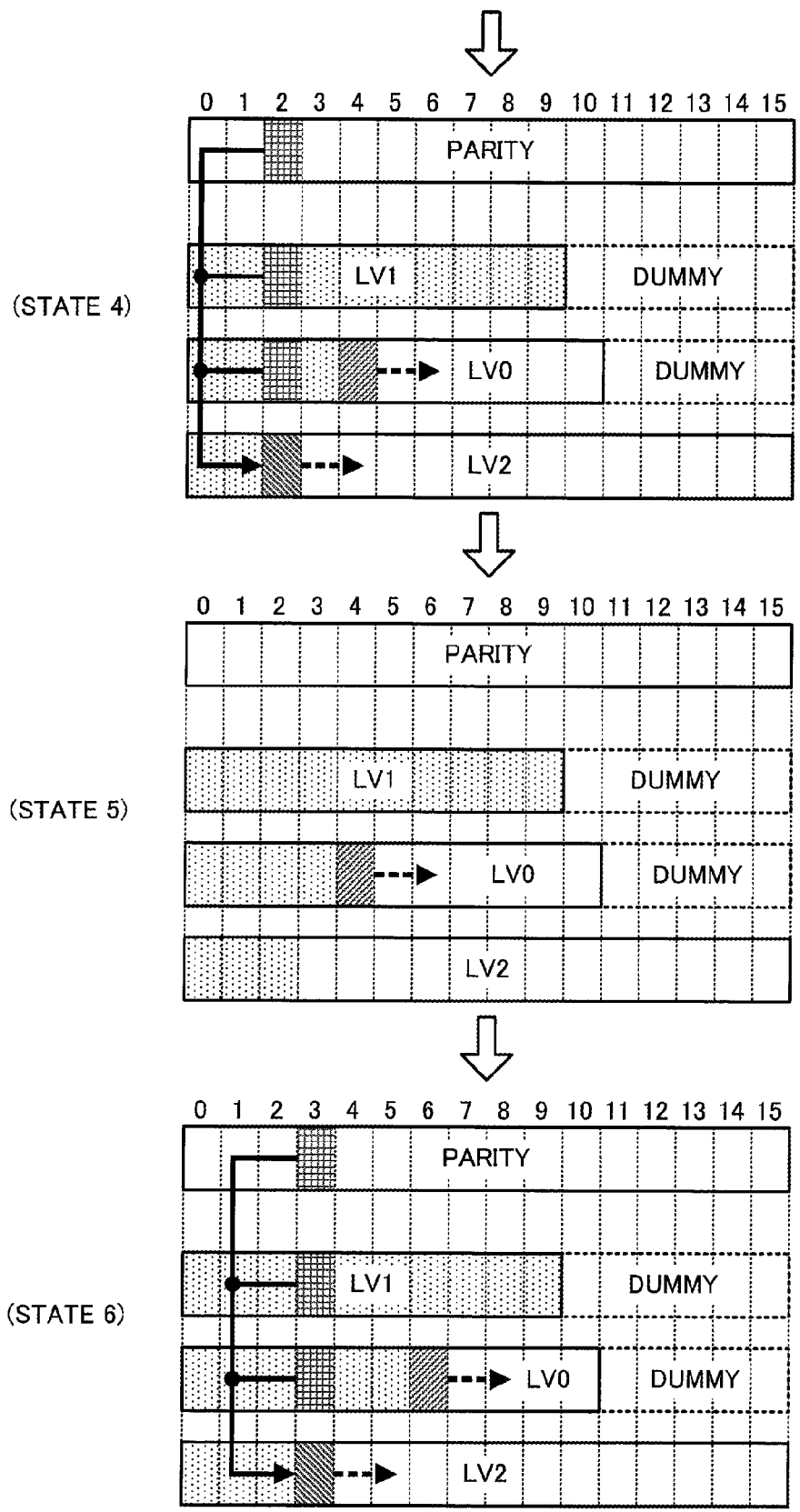
FIG. 14 illustrates the example of the read processing of the logical volume group from the tape library apparatus.

FIGS. 13 and 14 illustrate an example of read processing of the logical volume group from the tape library apparatus.

When receiving an instruction of data read of the logical volume group from the LVG read control unit 222, the read control unit 212 determines read order of the logical volumes belonging to the logical volume group. In the process example 1, the read control unit 212 reads the logical volumes belonging to the logical volume group in order of smaller size thereof. Here, a logical volume having last read order is restored by the data restoration unit 213 without being read from the magnetic tape.

In the examples of FIGS. 13 and 14, among the logical volumes LV0 to LV2, the size of the logical volume LV1 is the smallest, and the size of the logical volume LV2 is the largest. Therefore, the read control unit 212 decides read order as order of the logical volumes LV1, LV0, and LV2, and first starts read of the logical volume LV1 from the magnetic tape in the tape library apparatus 400. A state 1 in FIG. 13 illustrates the state where read of each block of the line numbers 0 and 1 in the logical volume LV1 has been completed, and a block of the line number 2 is during read.

When read of all the blocks of the logical volume LV1 is completed, the read control unit 212 starts read of the logical volume LV0 as illustrated in a state 2 of FIG. 13. In addition, when determining that read order of the logical volume LV0 for which read is started is the second read order from the last, the read control unit 212 instructs the data restoration unit 213 to execute restoration processing of the logical volume LV2 having the last read order.

The data restoration unit 213 calculates an initial interval value Lp, and registers it in the field of the "initial interval value 1" of the measurement information 250. The initial interval value Lp is an integer of 1 or more indicating the number of lines. When the read processing of the logical volume LV0 is completed in blocks for the number of lines indicated by the initial interval value Lp, the data restoration unit 213 starts the restoration processing of the logical volume LV2. For example, in a case where the initial interval value Lp indicates the number of lines "3", as illustrated in a state 3 of FIG. 13, when read of a block of the line number 2 in the logical volume LV0 is completed, and read of a block of a line number 3 is started, the data restoration unit 213 starts the restoration processing of the logical volume LV2.

The initial interval value Lp is calculated in accordance with the following Expression (1).

$$Lp = Vr(L2 - /Vr - Lmax/Vp)/Bs \qquad (1)$$

Here, Lmax is a size of a maximum logical volume of the logical volumes belonging to the logical volume group to be read, and the size corresponds to a size of the logical volume to be restored (logical volume LV2 in FIG. 14). The data restoration unit 213, for example, obtains Lmax from the field of the "LV size 1" of the LVG information 241 in the LVG management table 240.

L2 is a size of the second largest logical volume of the logical volumes belonging to the logical volume group to be read, and the size corresponds to the size of the logical volume during read (logical volume LV0 in FIG. 14). The data restoration unit 213, for example, obtains L2 from the field of the "LV size 2" of the LVG information 241 in the LVG management table 240.

Vp is a measurement value of a data restoration speed by the data restoration unit 213. The data restoration unit 213 obtains Vp from the field of the "restoration processing speed 1" of the measurement information 250. In an initial phase as the state 2 of FIG. 13, a predetermined initial value is registered in the field of the "restoration processing speed 1" and subsequently, information of the field of the "restoration processing speed 1" is updated as needed by the data restoration unit 213.

Vr is a measurement value of a read speed of the logical volume currently during read by the read control unit 212. The data restoration unit 213 obtains Vr from the field of the "read processing speed" of the measurement information 250. In the initial phase, a predetermined initial value is registered in the field of the "read processing speed". The initial phase referred to herein is the phase before the read of the logical volume LV0 in FIG. 13 is completed, and the state 2 of FIG. 13 also corresponds to the initial phase. Subsequently, the information of the field of the "read processing speed" is updated as needed by the read control unit 212.

Bs is a data size per block.

Description is provided with reference to an example of FIG. 13, L2/Vr in Expression (1) is an expected time required for read of the logical volume LV0, and Lmax/Vp therein is an expected time required for restoration of the logical volume LV2. Since the restoration processing speed of the logical volume LV2 is higher than the read speed of the logical volume LV0 from the magnetic tape, Lmax/Vp may become shorter than L2/Vr. Consequently, the data restoration unit 213 delays restoration start timing of the logical volume LV2 from read start timing of the logical volume LV0 by the number of lines according to a difference between L2/Vr and Lmax/Vp. As a result, the data restoration unit 213 performs control so that read end timing of the logical volume LV0 from the magnetic tape and restoration end timing of the logical volume LV2 become substantially the same as each other.

However, the initial interval value Lp is the integer of 1 or more, and when a value of one place of decimals is rounded up, and a rounded-up value becomes less than 1 in calculation with Expression (1), a calculation result is fixed as 1. A reason why the initial interval value Lp is set as a value of 1 or more is that the data restoration unit 213 does not start restoration processing of the block to be restored before read of the block of the same line number as the block to be restored among blocks of the logical volume during read is completed. For example, in FIG. 13, assuming that the line number of the block to be restored is set as 0, the data restoration unit 213 does not restore the block to be restored before read of the block of the same line number 0 as the block to be restored among the blocks of the logical volume LV0 is completed. Therefore, the data restoration unit 213 decides the restoration start timing so that the line number of the block to be restored becomes smaller than the line number of the block during read by 1 or more.

Next, will be described processing after the restoration processing of the logical volume LV2 is started. The data restoration unit 213 restores blocks of the logical volume LV2 in order from a head block. When a certain block of the logical volume LV2 is set as a block to be restored, the data restoration unit 213 restores the block to be restored of the logical volume LV2 using a block of the same line number as the block to be restored in each of the parity stored in the disk array apparatus 300 and other read logical volume.

For example, as illustrated in the state 3 of FIG. 13, the data restoration unit 213 reads the block of the line number 0 in each of the parity, logical volume LV1, and logical volume LV0 from the disk array apparatus 300, and restores the block of the line number 0 in the logical volume LV2 using each read block. In addition, as illustrated in a state 4 of FIG. 14, the data restoration unit 213 reads a block of the line number 2 in each of the parity, logical volume LV1, and logical volume LV0 from the disk array apparatus 300, and restores the block of the line number 2 in the logical volume LV2 using each read block.

It is to be noted that in executing the restoration processing, the data restoration unit 213 restores all the blocks of the logical volume LV2 by adding dummy data to a back end of the read logical volume. For example, when a line number 10 is set as the block to be restored, the data restoration unit 213 restores the block of the line number 10 in the logical volume LV2 using the block of the line number 10 in each of the parity and the logical volume LV0, and dummy data for one block corresponding to the logical volume LV1. In addition, when a line number 11 is set as the block to be restored, the data restoration unit 213 restores the block of the line number 11 in the logical volume LV2 using the block of the line number 11 in the parity, the dummy data for one block corresponding to the logical volume LV1, and dummy data for one block corresponding to the logical volume LV0.

The data restoration unit 213 executes restoration processing of the logical volume LV2 in parallel with the read processing of the logical volume LV0 by the read control unit 212. Here, the line number of the block to be restored in the logical volume LV2 is likely to coincide with the line number of the block to be read in the logical volume LV0. In this case, it becomes impossible for the data restoration unit 213 to execute the restoration processing of the block to be restored before read of the block of the same line number 0 as the block to be restored among the blocks of the logical volume LV0 is completed. As such a case, for example, there are included a case where errors of Vp and Vr that were substituted in the above-described Expression (1) are large, a case where a temporary error is generated during read of the logical volume LV0 and thereby retry of the read is performed, and the like.

As described above, in order that a situation does not occur where the line number of the block to be restored and the line number of the block to be read coincide with each other, in a case where a difference between the line number of the block during read in the logical volume LV0 and the line number of the block for which restoration has been completed is not more than a predetermined difference set value when restoration of one block in the logical volume LV2 is completed, the data restoration unit 213 temporarily stops restoration processing. The difference set value is set as an integer of 1 or more.

In a state 5 of FIG. 14, when the data restoration unit 213 completes restoration of the block of the line number 2 in the logical volume LV2, the read control unit 212 is executing read processing of a block of a line number 4 in the logical volume LV0. Here, assuming that the difference set value is 2, the data restoration unit 213 determines that a difference between the line number 4 of the block during read and the line number 2 of the block for which restoration has been completed is not more than the difference set value "2", and temporarily stops the restoration processing of the logical volume LV2. At this time, read processing of the logical volume LV0 by the read control unit 212 is continued unchanged from before.

The data restoration unit 213 that stopped restoration processing recalculates the initial interval value Lp in accordance with Expression (1). In the recalculation, the data restoration unit 213 substitutes in Lmax of parameters of Expression (1) a total size of the blocks for which restoration has not been completed in the logical volume LV2. In addition, the data restoration unit 213 substitutes in L2 a total size of the blocks for which read has not been completed in the logical volume LV0. Furthermore, the data restoration unit 213 substitutes in Vp and Vr newest actual measurement values registered in the fields of the "restoration processing speed 1" and the "read processing speed" of the measurement information 250, respectively.

When a difference between the line number of the block during read and the line number of the block to be restored becomes not less than the recalculated initial interval value Lp, the data restoration unit 213 restarts the restoration processing of the logical volume LV2. By adjusting timing to restart the restoration processing as described above, the data restoration unit 213 performs control so that the read end timing of the logical volume LV0 from the magnetic tape and the restoration end timing of the logical volume LV2 become substantially the same as each other. As a result, a possibility is reduced that the line number of the block to be restored and the line number of the block to be read coincide with each other again.

In the state 5 of FIG. 14, the data restoration unit 213 stops restoration processing still in a state where the line number of the block to be restored is "3". Here, assuming that the initial interval value Lp is calculated as "3", as illustrated in a state 6, when the line number of the block during read in the logical volume LV0 becomes "6", the data restoration unit 213 restarts the restoration processing of the logical volume LV2.

With the above processing, the logical volume LV2 set to have last read order is restored with calculation by the data restoration unit 213 without being read from the magnetic tape of the tape library apparatus 400, and is stored in the disk array apparatus 300. As a result, a time required until data of the whole logical volume group is stored in the disk array apparatus 300 is reduced.

Meanwhile, in the above-described processing illustrated in FIGS. 13 and 14, the read control unit 212 reads the logical volumes belonging to the logical volume group in order of smaller size thereof from the tape library apparatus 400. Here, read order is decided so that at least a maximum size of logical volume of the logical volumes belonging to the logical volume group has the last read order, and thereby an amount of data in which the logical volume is restored by calculation based on the parity becomes the largest. This means that an execution time of the restoration processing based on the parity, a speed of the restoration processing being higher than a read speed from the magnetic tape, becomes the longest. Accordingly, a reduction effect of a time required to store data in the disk array apparatus 300 becomes larger. Along with this, a period becomes longer when processing in which the logical volume is restored based on the parity, and processing in which other one logical volume is read from the tape library apparatus 400 are executed in parallel. Also in this point, a reduction effect of the time required for data storing in the disk array apparatus 300 becomes larger.

In addition, for example, when considering only a time simply needed to read data from the magnetic tape, the time not including a time required to mount the magnetic tape in a tape drive, and the like, by setting read order of the logical volume from the tape library apparatus 400 as order of a smaller size thereof, a period becomes the longest when processing in which the logical volume is restored based on the parity, and processing in which the other logical volume is read from the tape library apparatus 400 are executed in parallel.

It is to be noted that the logical volume restored by the data restoration unit 213 has been desirably stored in a magnetic tape different from the magnetic tape in which the logical volume having previous read order has been stored. As a result, the time required for data storing in the disk array apparatus 300 is reduced by the time required for mounting in the tape drive the magnetic tape in which the logical volume having the last read order has been stored, since the mounting time is not needed.

Next, an example of a processing procedure of the read control unit 212 and the data restoration unit 213 will be described using a flow chart.

Figure 15:
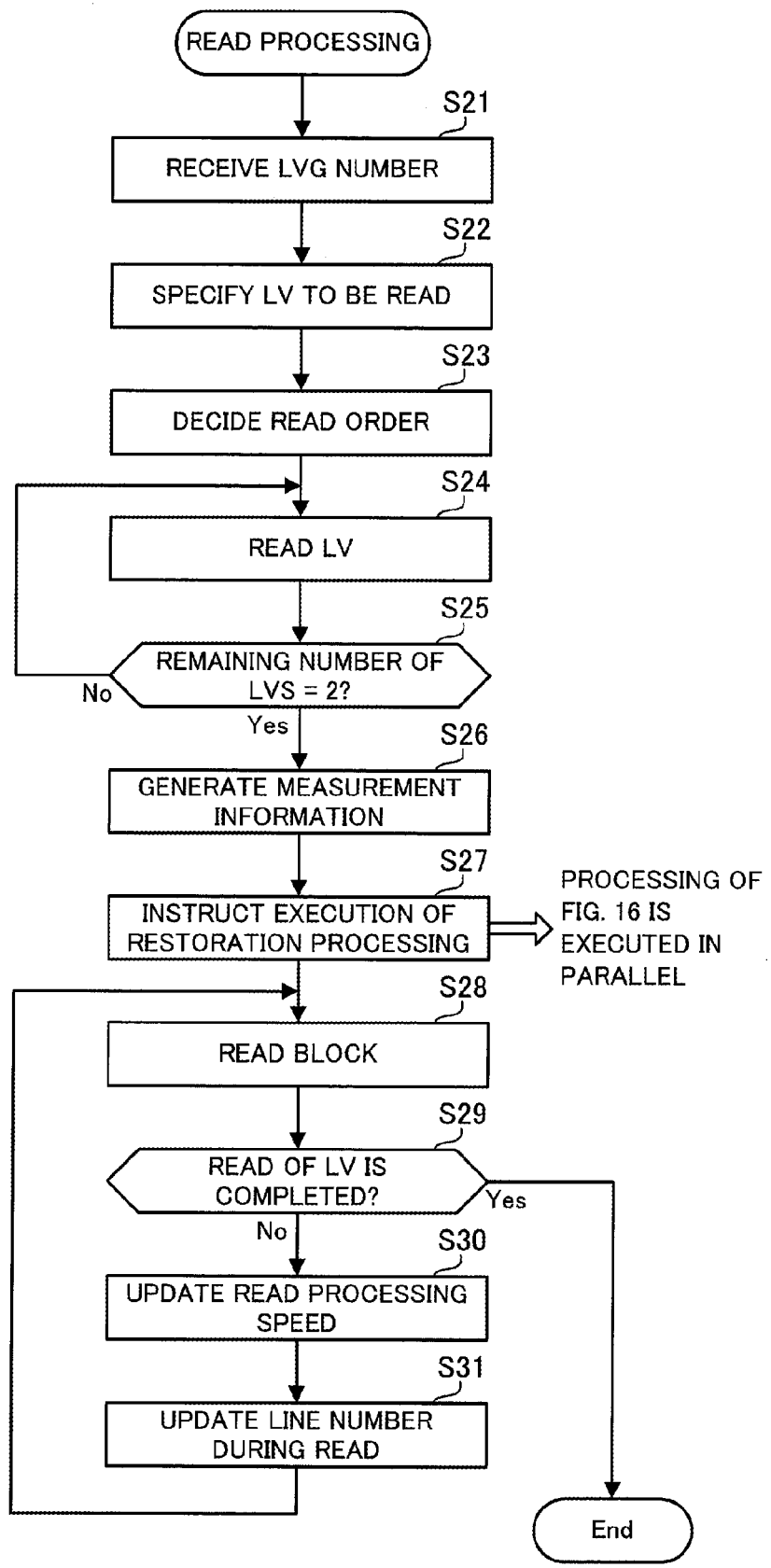
FIG. 15 is a flow chart illustrating a processing procedure of a read control unit in the process example 1.

FIG. 15 is a flow chart illustrating a processing procedure of the read control unit in the process example 1.

[Step S21] The read control unit 212 receives an execution instruction of read processing and designation of an LVG number from the LVG read control unit 222.

[Step S22] The read control unit 212 specifies a logical volume belonging to a logical volume group corresponding to the designated LVG number as a logical volume to be read with reference to the LVG management table 240.

[Step S23] The read control unit 212 reads a size of each specified logical volume from the LV management table 230, and decides read order of the specified logical volumes to be order of a smaller size thereof.

[Step S24] The read control unit 212 selects a logical volume having first read order of the logical volumes for which read has not been completed, and reads data of the selected logical volume from the magnetic tape of the tape library apparatus 400. The read control unit 212 stores data of the read logical volume in the disk array apparatus 300.

[Step S25] The read control unit 212 determines whether or not the remaining number of logical volumes for which read has not been completed is 2. When the remaining number of logical volumes is not less than 3, the processing returns to step S24, and the read control unit 212 executes read processing of the next logical volume. Meanwhile, when the remaining number of logical volumes is 2, the read control unit 212 executes processing of step S26.

[Step S26] The read control unit 212 generates in the RAM 202 the measurement information 250 corresponding to the LVG number of the logical volume group to be read. The read control unit 212 registers a head line number in the field of the "line number during read" of the measurement information 250, and registers a predetermined initial value in the field of the "read processing speed".

Figure 16:
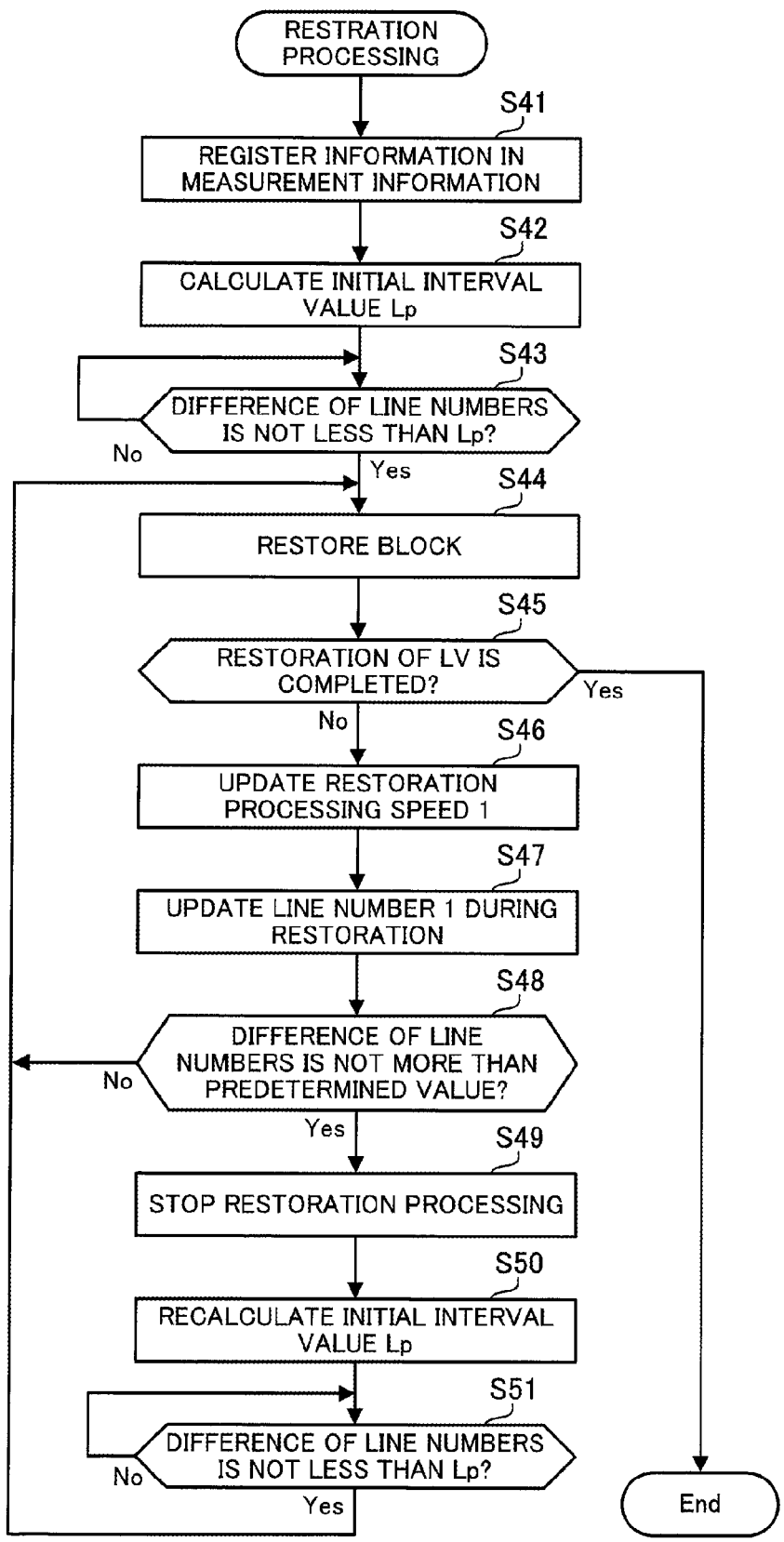
FIG. 16 is a flow chart illustrating a processing procedure of a data restoration unit in the process example 1.

[Step S27] The read control unit 212 notifies the data restoration unit 213 of the LVG number of the logical volume group for read processing, and the LV number of the logical volume having the last read order, and instructs execution of the restoration processing of the logical volume group corresponding to the LV number that the read control unit 212 has notified of. As a result, processing after step S28 by the read control unit 212 and processing of the data restoration unit 213 illustrated in later FIG. 16 are executed in parallel.

[Step S28] The read control unit 212 selects a block for which read has not been completed of the blocks of the logical volume to be read, and reads data of the selected block from the magnetic tape in the tape library apparatus 400. The read control unit 212 stores data of the read block in the disk array apparatus 300.

[Step S29] The read control unit 212 determines whether or not read of all the blocks included in the logical volume to be read has been completed. When the read has not been completed, the read control unit 212 executes processing of step S30. Meanwhile, when the read has been completed, the read control unit 212 ends the processing.

[Step S30] The read control unit 212 calculates a read processing speed of the logical volume to be read from the head block until now. The read control unit 212 updates information of the field of the "read processing speed" of the measurement information 250 depending on the calculated read processing speed.

It is to be noted that in this step S30, for example, after starting the head logical volume in the logical volume group as information to be registered in the field of the "read processing speed", the read control unit 212 may calculate a read speed until now. In this case, the read control unit 212 registers a calculated value of the read speed instead of the predetermined initial value in the field of the "read processing speed" also at the time of step S26.

[Step S31] The read control unit 212 increments by one the line number of the field of the "line number during read" of the measurement information 250. After this, the processing returns to step S28, and the read control unit 212 executes read of the next block.

FIG. 16 is a flow chart illustrating a processing procedure of the data restoration unit in the process example 1. When receiving an execution instruction of restoration processing from the read control unit 212 in step S27 of FIG. 15, the data restoration unit 213 executes processing of FIG. 16 in parallel with the read processing by the read control unit 212.

[Step S41] The data restoration unit 213 registers the following information in the measurement information 250 corresponding to the LVG number that the read control unit 212 has notified of. The data restoration unit 213 registers a head line number in the field of the "line number 1 during restoration", and registers the predetermined initial value in the field of the "restoration processing speed 1".

[Step S42] The data restoration unit 213 calculates the initial interval value Lp in accordance with the above-mentioned Expression (1), and registers it in the field of the "initial interval value 1" of the measurement information 250. At this time, the data restoration unit 213 substitutes in Vr of Expression (1) an actual measurement value registered in the field of the "read processing speed" of the measurement information 250, and substitutes in Vp of Expression (1) the initial value registered in the "restoration processing speed 1".

[Step S43] The data restoration unit 213 determines whether or not a difference between the line number registered in the field of the "line number during read" of the measurement information 250 and the line number registered in the field of the "line number 1 during restoration" of the measurement information 250 is not less than the initial interval value Lp calculated in step S42. The data restoration unit 213 enters a waiting state until the difference of the line numbers becomes not less than the initial interval value Lp, and executes processing of step S44 when the difference becomes not less than the initial interval value Lp.

[Step S44] The data restoration unit 213 selects a block for which restoration has not been completed among the blocks of the logical volume to be restored. The data restoration unit 213 reads from the disk array apparatus 300 a block of other logical volume corresponding to a same line number as the selected block and a block of the parity. It is to be noted that the data restoration unit 213 specifies a read position of the parity from the line management information 242 corresponding to the line number to be restored with reference to the LVG management table 240. The data restoration unit 213 restores data of the selected block for which restoration has not been completed using the data of each read block, and stores the restored data of the block in the disk array apparatus 300.

[Step S45] The data restoration unit 213 determines whether or not restoration of the whole logical volume to be restored has been completed. When restoration of the whole logical volume has been completed, the data restoration unit 213 ends the processing. Meanwhile, when the block for which restoration has not been completed is present in the blocks in the logical volume, the data restoration unit 213 executes processing of step S46.

[Step S46] The data restoration unit 213 calculates a restoration processing speed of the logical volume to be restored from a head block until now. The data restoration unit 213 updates information of the field of the "restoration processing speed 1" of the measurement information 250 by the calculated restoration processing speed.

[Step S47] The data restoration unit 213 increments by one the line number of the field of the "line number 1 during restoration" of the measurement information 250.

[Step S48] The data restoration unit 213 determines whether or not a difference between the line number registered in the field of the "line number during read" of the measurement information 250 and the line number registered in the field of the "line number 1 during restoration" of the measurement information 250 is not more than a predetermined difference set value. When the difference of the line numbers is larger than the difference set value, the processing proceeds to step S44, and the data restoration unit 213 executes restoration processing of a next block. Meanwhile, when the difference of the line numbers is not more than the difference set value, the data restoration unit 213 executes processing of step S49.

It is to be noted that in step S48, when read processing of the logical volume having previous read order from the magnetic tape has been completed by the read control unit 212, the data restoration unit 213 unconditionally executes processing of step S44.

[Step S49] The data restoration unit 213 temporarily stops restoration processing.

[Step S50] The data restoration unit 213 recalculates the initial interval value Lp in accordance with Expression (1), and updates the field of the "initial interval value 1" of the measurement information 250 with the calculated value. In performing the recalculation, the data restoration unit 213 calculates a total size of the blocks for which restoration has not been completed among the blocks of the logical volume to be restored, and substitutes the calculated value in Lmax of Expression (1). In addition, the data restoration unit 213 calculates a total size of the block for which read has not been completed among the blocks of the logical volume having the second read order from the last (i.e., the logical volume during read by the read control unit 212), and substitutes the calculated value in L2 of Expression (1). It is to be noted that the data restoration unit 213 reads a head line number of the block for which read has not been completed from the field of the "line number during read" of the measurement information 250, and thereby recognizes the block for which read has not been completed. Furthermore, the data restoration unit 213 substitutes in Vp and Vr values registered in the fields of the "restoration processing speed 1" and the "read processing speed" of the measurement information 250, respectively.

As compared with the previous case where the initial interval value Lp has been calculated, in a case where step S50 is executed, Vp is higher, Vr is lower, or both thereof hold. Therefore, the calculated initial interval value Lp is larger than 1 in a state where a value of one place of decimals is rounded up.

[Step S51] The data restoration unit 213 determines whether or not the difference between the line number registered in the field of the "line number during read" of the measurement information 250 and the line number registered in the field of the "line number 1 during restoration" of the measurement information 250 is not less than the initial interval value Lp calculated in step S50. The data restoration unit 213 enters a waiting state until the difference of the line numbers becomes not less than the initial interval value Lp, and executes processing of step S44 when the difference becomes not less than the initial interval value Lp.

Process Example 2

Figure 17:
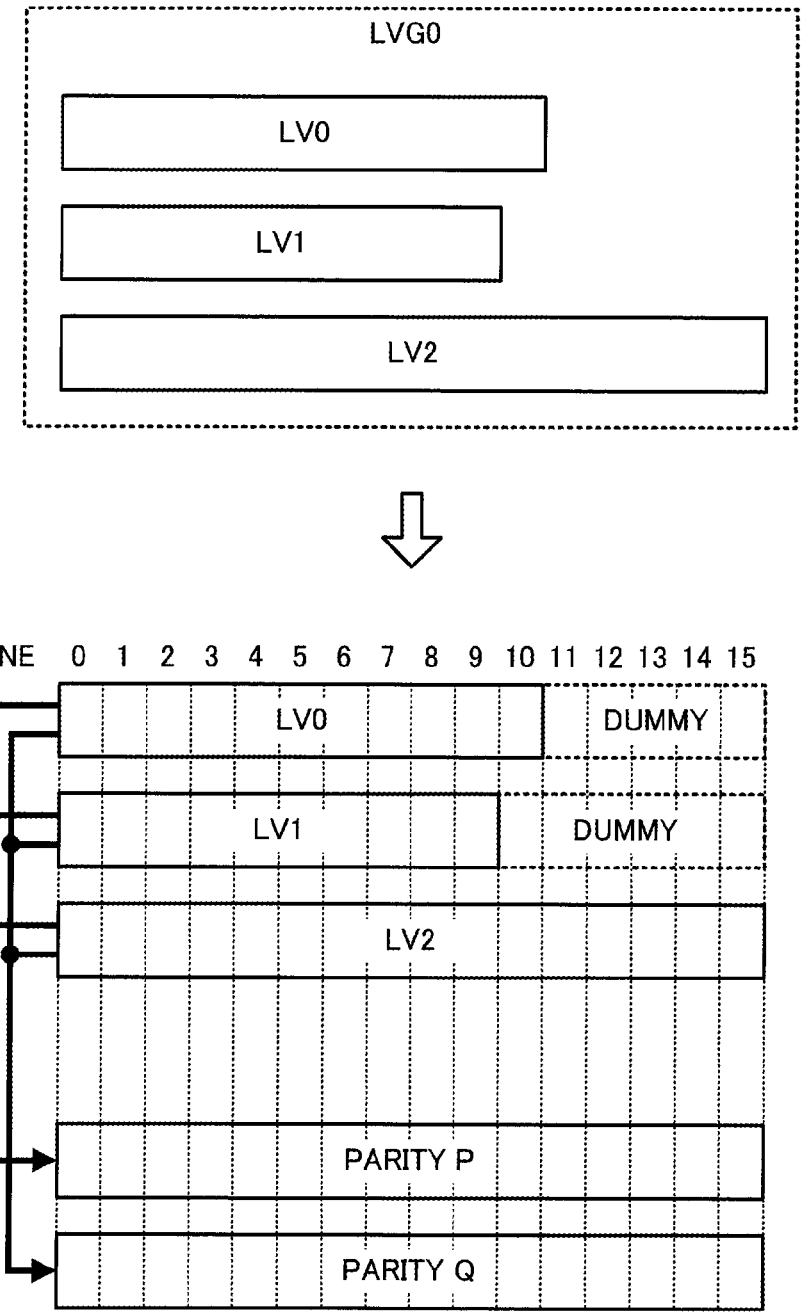
FIG. 17 is a diagram for describing parity calculation processing in a process example 2.

FIG. 17 is a diagram for describing parity calculation processing in the process example 2.

In the process example 2, in writing data in a logical volume group unit in the magnetic tape of the tape library apparatus 400, the write control unit 211 equalizes sizes of the logical volumes similar to the case of the process example 1. In an example illustrated in FIG. 17, the write control unit 211, for example, equalizes the sizes of the logical volumes LV0 to LV2 by adding dummy data to each of the logical volumes LV0 and LV1.

After executing size equalization processing, the write control unit 211 calculates parity for each block obtained by dividing each of the logical volumes LV0 to LV2 for each certain size from a head thereof. In the process example 2, the write control unit 211, as illustrated in a lower side in FIG. 17, calculates two types of parity (parities P and Q). The write control unit 211 stores the calculated parities P and Q in a predetermined logical volume belonging to the floating area in the disk array apparatus 300.

A data write processing procedure in the logical volume group unit by the write control unit 211 is similar to the processing of FIG. 12 excluding the next point. The write control unit 211 calculates the parities P and Q in step S15 of FIG. 12, and stores the parities P and Q in the disk array apparatus 300. At this time, the write control unit 211 registers the parity management information 243 corresponding to each of the parities P and Q in each line management information 242 in the LVG management table 240.

Next, will be described processing in which the control apparatus 200 reads data from the magnetic tape of the tape library apparatus 400 in the logical volume group unit, and stores it in the disk array apparatus 300.

When two types of parity are stored in the disk array apparatus 300 by the above-described processing by the write control unit 211, the data restoration unit 213 restores two of the logical volumes belonging to the logical volume group from the other logical volumes and the parities P and Q.

Consequently, when receiving an instruction of data read of the logical volume group from the LVG read control unit 222, the read control unit 212 reads from the magnetic tape of the tape library apparatus 400 logical volumes excluding two of the logical volumes belonging to the instructed logical volume group. In addition, the read control unit 212 restores the remaining two logical volumes in the data restoration unit 213 instead of reading the remaining two logical volumes from the magnetic tape, but using the data of the read logical volume and the parities P and Q stored in the disk array apparatus 300. As a result, a time required until data of the whole logical volume group is stored in the disk array apparatus 300 is reduced.

In addition, the data restoration unit 213 simultaneously restores the remaining two logical volumes. Furthermore, restoration processing of the logical volume by the data restoration unit 213 is executed in parallel with read processing of other one logical volume from the magnetic tape by the read control unit 212. As a result, the time required until the data of the whole logical volume group is stored in the disk array apparatus 300 is further reduced.

Here, first, using FIGS. 18 to 20, will be described a process example in the logical volume group LVG0 illustrated in FIG. 17 being read from the tape library apparatus 400 to the disk array apparatus 300.

Figure 18:
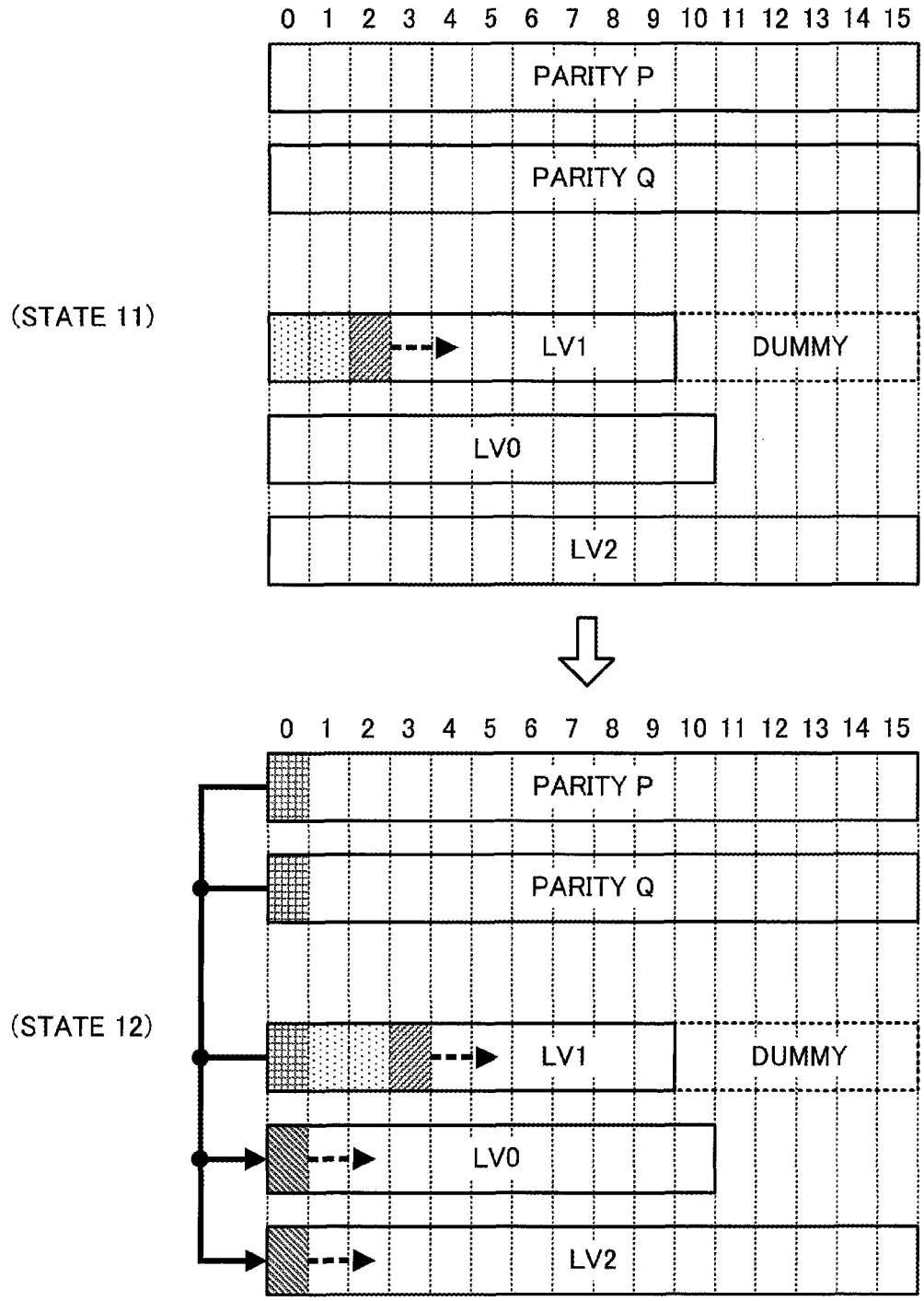
FIG. 18 illustrates an example of read processing of a logical volume group from the tape library apparatus.
Figure 19:
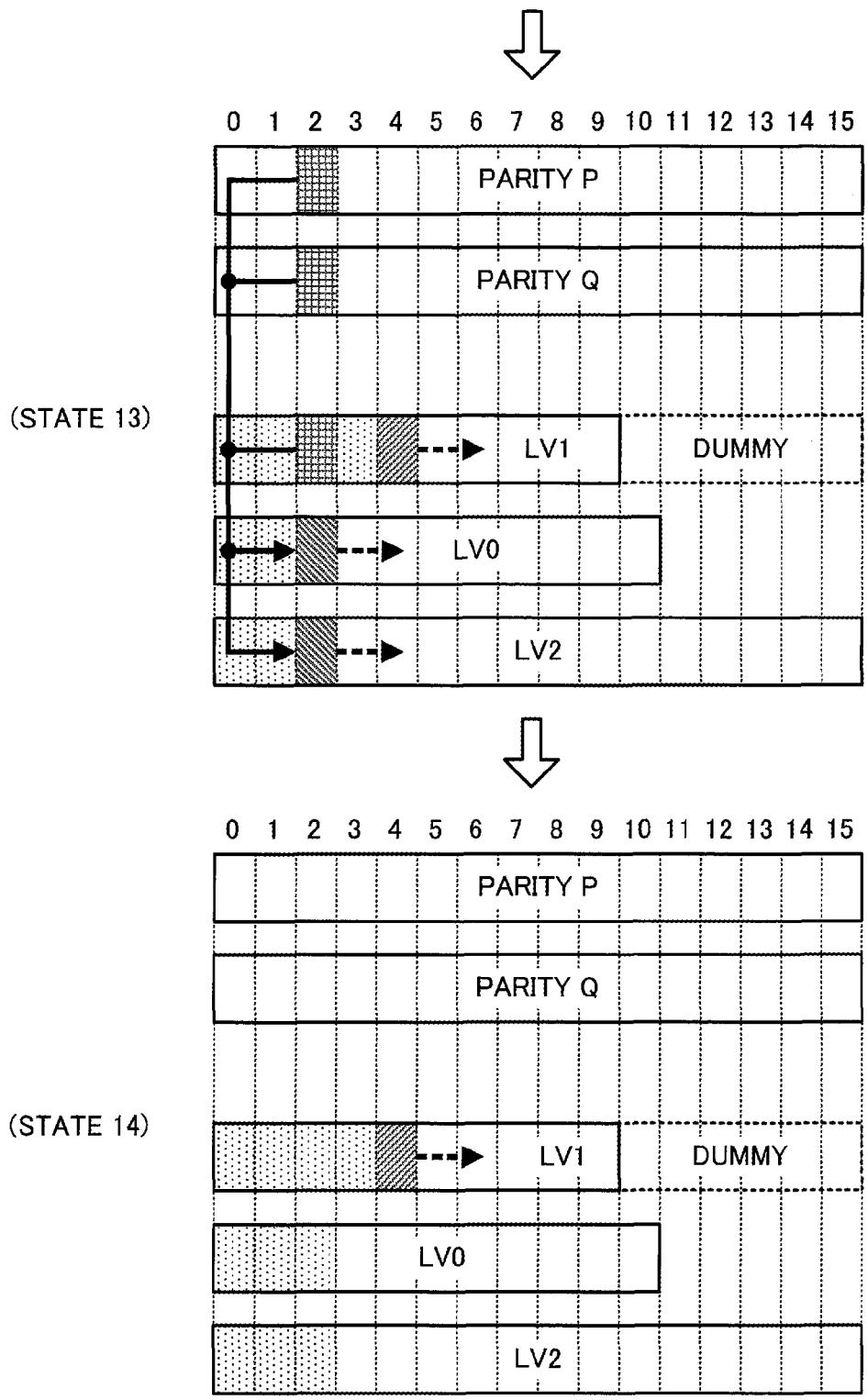
FIG. 19 illustrates the example of the read processing of the logical volume group from the tape library apparatus.
Figure 20:
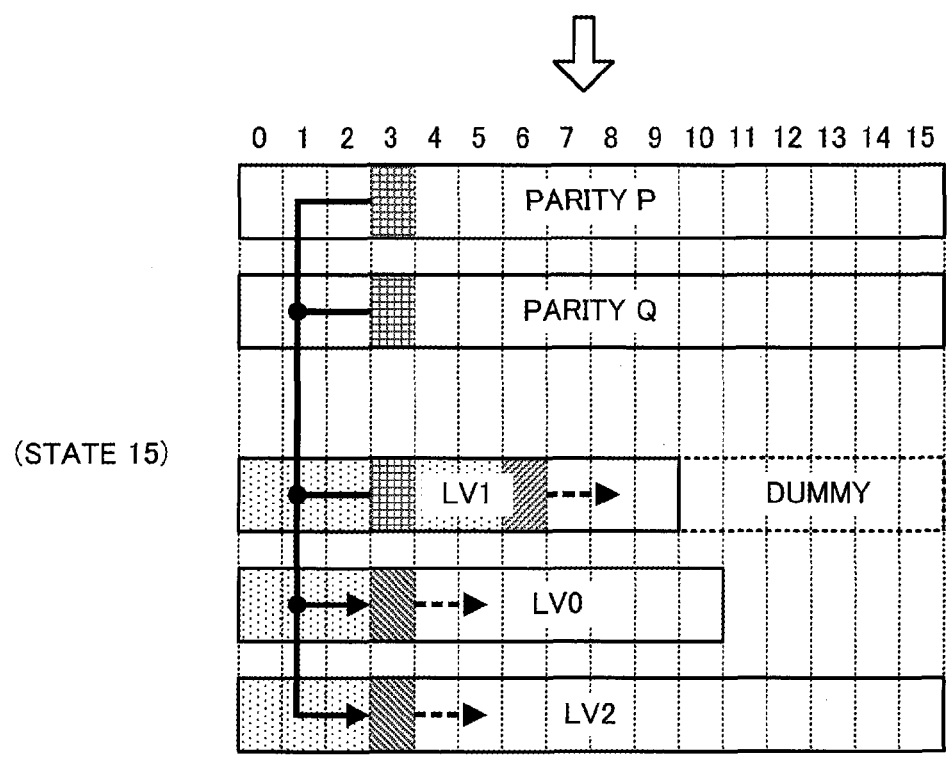
FIG. 20 illustrates the example of the read processing of the logical volume group from the tape library apparatus.

FIGS. 18 to 20 illustrate an example of read processing of the logical volume group from the tape library apparatus.

When receiving an instruction of data read of the logical volume group from the LVG read control unit 222, the read control unit 212 decides read order of the logical volumes belonging to the logical volume group. The read control unit 212 at least sets the logical volumes having last two read order as the maximum size of logical volume and the second largest size of logical volume of the logical volumes belonging to the logical volume group. As a result, a data amount restored by calculation becomes larger, and a time to execute in parallel restoration processing and read processing of the other one logical volume from the magnetic tape also becomes longer. Therefore, the time required until all the data of the logical volume group is stored in the disk array apparatus 300 is reduced.

In the present embodiment, as an example, the read control unit 212 reads the logical volumes belonging to the logical volume group in order of smaller size thereof. In the example of FIGS. 18 to 20, the read control unit 212 decides read order as the order of logical volumes LV1, LV0, and LV2, and as illustrated in a state 11 of FIG. 18, first starts read of the logical volume LV1 from the magnetic tape in the tape library apparatus 400. In addition, when determining that the logical volume LV1 for which read is started has the third read order from the last, the read control unit 212 instructs the data restoration unit 213 to execute restoration processing of the logical volumes LV0 and LV2 having the last read order and the second read order from the last.

The data restoration unit 213 calculates an initial interval value Lpq, and registers it in the field of the "initial interval value 1" of the measurement information 250. When the read processing of the logical volume LV1 is completed in the blocks for the number of lines indicated by the initial interval value Lpq, the data restoration unit 213 starts the restoration processing of the logical volumes LV0 and LV2. For example, in a case where the initial interval value Lpq is the number of lines "3", as illustrated in a state 12 of FIG. 18, when read of a block of the line number 2 in the logical volume LV1 is completed, and read of a block of a line number 3 is started, the data restoration unit 213 starts the restoration processing of the logical volumes LV0 and LV2.

In the process example 2, the initial interval value Lpq is calculated in accordance with the following Expression (2). However, the initial interval value Lpq is an integer of 1 or more, and when a value of one place of decimals is rounded up, and a rounded-up value becomes less than 1 in calculation with Expression (2), a calculation result is fixed as 1.

$$Lpq = Vr(L3/Vr - Lmax/Vpq)/Bs \qquad (2)$$

In Equation (2), L3 is a size of a third largest logical volume of the logical volumes belonging to the logical volume group to be read, and the size corresponds to a size of the logical volume during read (logical volume LV1 in FIG. 18). The data restoration unit 213, for example, obtains L3 from the field of the "LV size 3" of the LVG information 241 in the LVG management table 240.

In addition, Vpq is a measurement value of a data restoration speed using the parities P and Q by the data restoration unit 213. The data restoration unit 213 obtains Vpq from the field of the "restoration processing speed 1" of the measurement information 250. In the initial phase, a predetermined initial value is registered in the field of the "restoration processing speed 1" and subsequently, information of the field of the "restoration processing speed 1" is updated as needed by the data restoration unit 213.

Description is provided with reference to an example of FIG. 18, L3/Vr in Expression (2) is an expected time required for the read of the logical volume LV1, and Lmax/Vpq is an expected time required for restoration of the maximum size of logical volume LV2. The data restoration unit 213 delays restoration start timing of the logical volumes LV0 and LV2 from read start timing of the logical volume LV1 by the number of lines according to a difference between L3/Vr and Lmax/Vpq.

Next, will be described processing after the restoration processing of the logical volumes LV0 and LV2 is started. The data restoration unit 213 restores blocks of a same line number of the logical volumes LV0 and LV2 in order from a head thereof. For example, as illustrated in a state 13 of FIG. 19, the data restoration unit 213 reads a block of the line number 2 in each of the parities P and Q, and the logical volume LV1 from the disk array apparatus 300, and restores the block of the line number 2 in each of the logical volumes LV0 and LV2 using each read block.

It is to be noted that similarly to the case of the process example 1, in executing the restoration processing, the data restoration unit 213 restores all the blocks in each of the logical volumes LV0 and LV2 by adding dummy data to a back end of the read logical volume.

The data restoration unit 213 executes restoration processing of the logical volumes LV0 and LV2 in parallel with the read processing of the logical volume LV1 by the read control unit 212. Here, the line number of the block to be restored in the logical volumes LV0 and LV2 is likely to coincide with the line number of the block to be read in the logical volume LV1. In order that such a situation does not occur, when restoration of one blocks of both the logical volumes LV0 and LV2 is completed, in a case where a difference between the line number of the block during read in the logical volume LV1 and the line number of the block for which restoration has been completed is not more than a predetermined difference set value, the data restoration unit 213 temporarily stops restoration processing. The difference set value is set as an integer of 1 or more.

In a state 14 of FIG. 19, when the data restoration unit 213 completes restoration of the blocks of the line number 2 in the logical volumes LV0 and LV2, the read control unit 212 is executing read processing of a block of a line number 4 in the logical volume LV1. Here, assuming that the difference set value is 2, the data restoration unit 213 determines that a difference between the line number 4 of the block during read and the line number 2 of the block for which restoration has been completed is not more than the difference set value "2", and temporarily stops the restoration processing of the logical volumes LV0 and LV2. At this time, read processing of the logical volume LV1 by the read control unit 212 is continued unchanged from before.

The data restoration unit 213 that stopped restoration processing recalculates the initial interval value Lpq in accordance with Expression (2). In the recalculation, the data restoration unit 213 substitutes in Lmax of parameters of Expression (2) a total size of the blocks for which restoration has not been completed in the logical volume LV2. In addition, the data restoration unit 213 substitutes in L3 a total size of the blocks for which read has not been completed in the logical volume LV1. Furthermore, the data restoration unit 213 substitutes in Vpq and Vr newest actual measurement values registered in the fields of the "restoration processing speed 1" and the "read processing speed" of the measurement information 250, respectively.

When a difference between the line number of the block during read and the line number of the block to be restored becomes not less than the recalculated initial interval value Lpq, the data restoration unit 213 restarts the restoration processing of the logical volumes LV0 and LV2. As a result, a possibility is reduced that the line number of the block to be restored and the line number of the block to be read coincide with each other again.

Assuming that the initial interval value Lpq is calculated as "3", as illustrated in a state 15 of FIG. 20, when the line number of the block during read in the logical volume LV1 becomes "6", the data restoration unit 213 restarts the restoration processing of the logical volumes LV0 and LV2.

With the above processing, the logical volumes LV0 and LV2 are restored with calculation by the data restoration unit 213 without being read from the magnetic tape of the tape library apparatus 400, and are stored in the disk array apparatus 300. As a result, a time required until data of the whole logical volume group is stored in the disk array apparatus 300 is reduced.

Next, an example of a processing procedure of the read control unit 212 and the data restoration unit 213 will be described using a flow chart.

Figure 21:
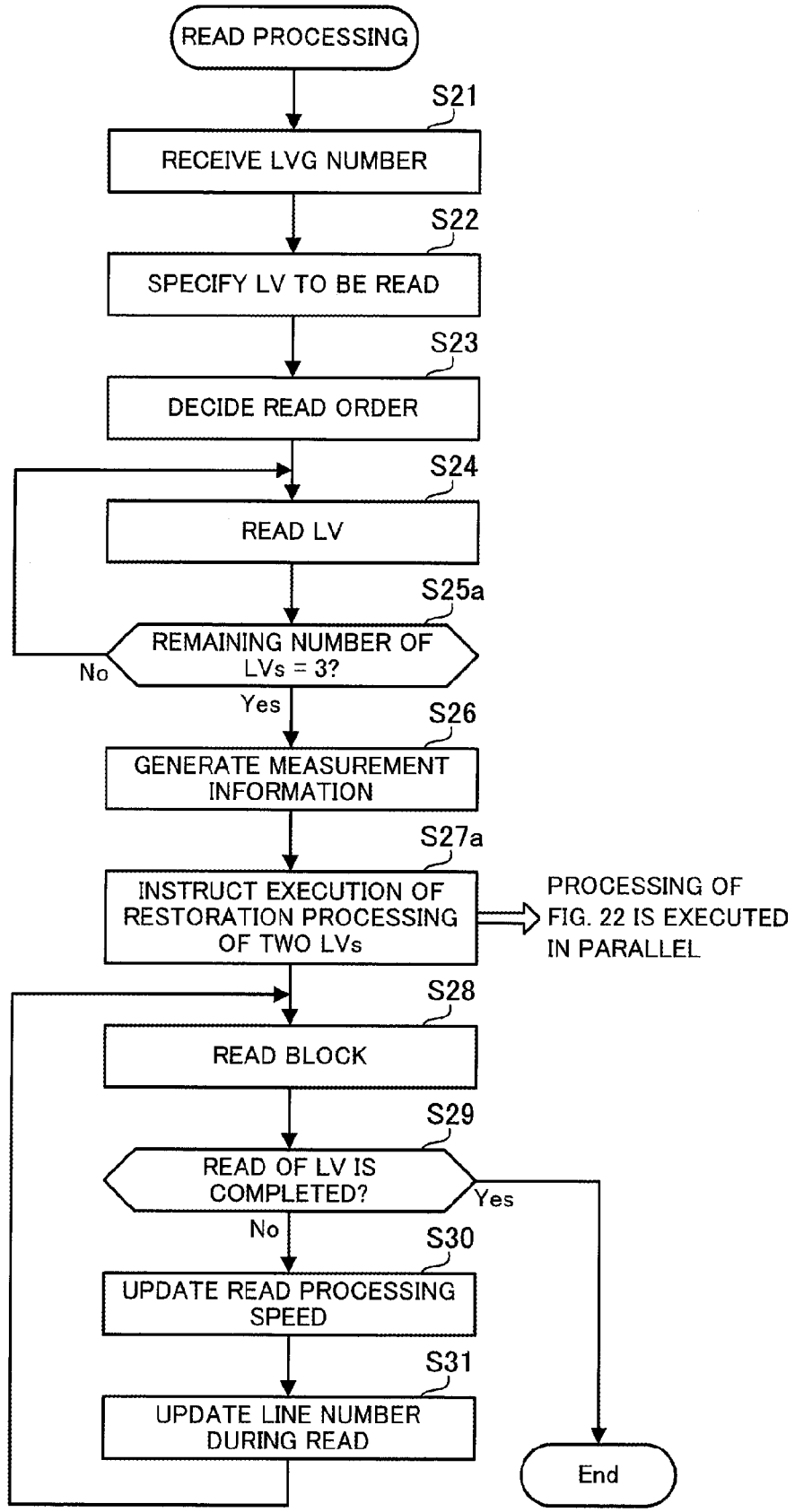
FIG. 21 is a flow chart illustrating a processing procedure of the read control unit in the process example 2.

FIG. 21 is a flow chart illustrating a processing procedure of the read control unit in the process example 2. It is to be noted that in the flow chart of FIG. 21, processing of steps S25 and S27 in the flow chart illustrated in FIG. 15 is changed to processing of steps S25*a* and S27*a*, respectively. Consequently, here, only processing steps different from those of FIG. 15 will be described, and description of the other processing steps will be omitted.

[Step S25*a*] The read control unit 212 determines whether or not the remaining number of logical volumes for which read has not been completed is 3. When the remaining number of logical volumes is not less than 4, the processing returns to step S24, and the read control unit 212 executes read processing of the next logical volume. Meanwhile, when the remaining number of logical volumes is 3, the read control unit 212 executes processing of step S26.

[Step S27*a*] The read control unit 212 notifies the data restoration unit 213 of the LVG number of the logical volume group for read processing, and the LV number of each of the logical volumes having the last read order and the second read order from the last, and instructs execution of the restoration processing of the logical volume group corresponding to the LV number that the read control unit 212 has notified of. As a result, processing after step S28 by the read control unit 212 and processing of the data restoration unit 213 illustrated in next FIG. 22 are executed in parallel.

It is to be noted that in steps S28 to S31 in FIG. 21, unlike the case of FIG. 15, the read control unit 212 executes read processing of the logical volume having been set to have the third read order from the last.

Figure 22:
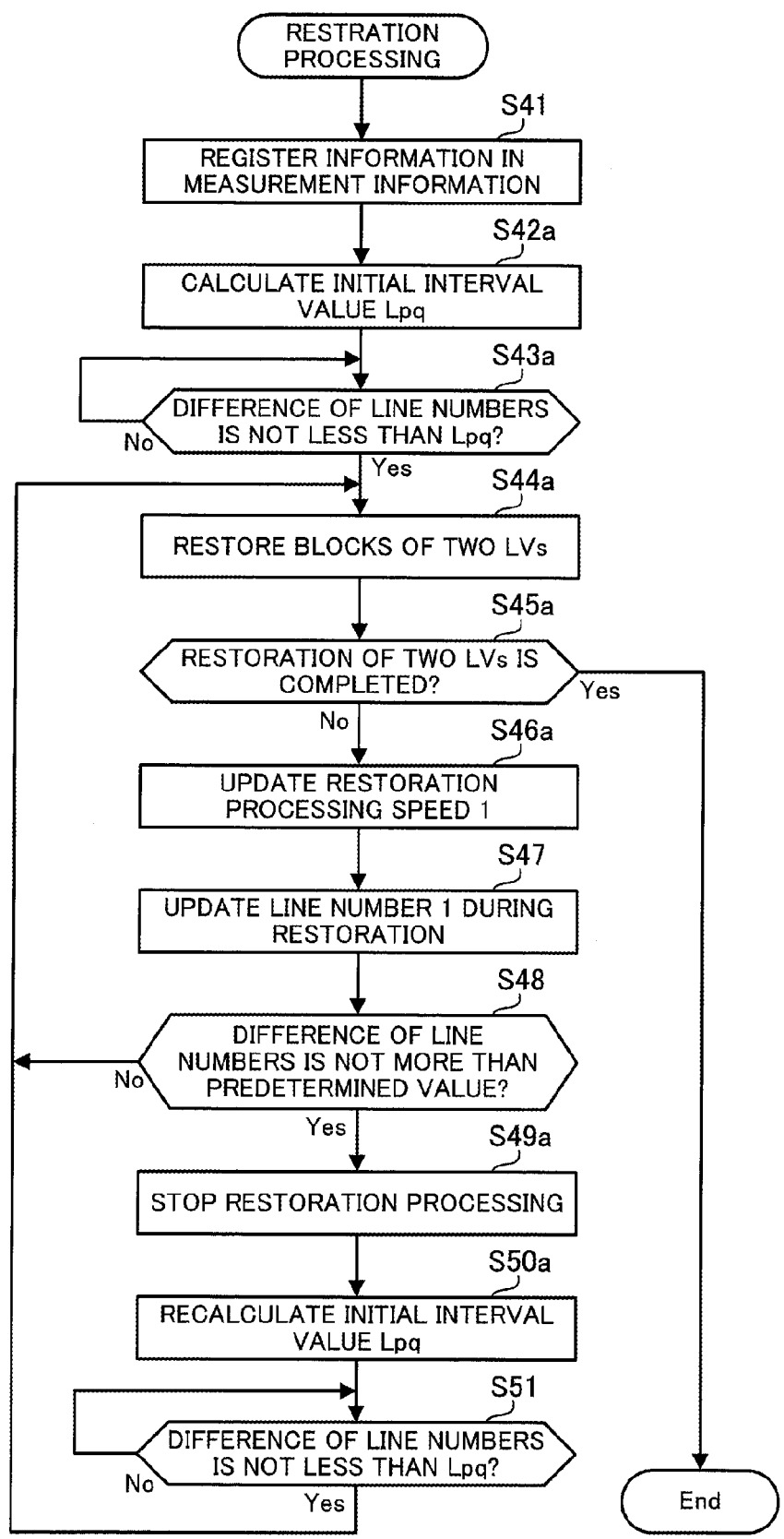
FIG. 22 is a flow chart illustrating a processing procedure of the data restoration unit in the process example 2.

FIG. 22 is a flow chart illustrating a processing procedure of the data restoration unit in the process example 2. It is to be noted that in FIG. 22, the same step number as in FIG. 16 is attached to a processing step in which the same processing as in FIG. 16 is executed.

When receiving an execution instruction of restoration processing from the read control unit 212 in step S27*a* of FIG. 21, the data restoration unit 213 executes processing of FIG. 22 in parallel with the read processing by the read control unit 212.

[Step S41] The data restoration unit 213 registers a head line number in the field of the "line number 1 during restoration", and registers a predetermined initial value in the field of the "restoration processing speed 1" in the measurement information 250 corresponding to the LVG number that the read control unit 212 has notified of.

[Step S42a] The data restoration unit 213 calculates the initial interval value Lpq in accordance with the above-mentioned Expression (2), and registers it in the field of the "initial interval value 1" of the measurement information 250. At this time, the data restoration unit 213 substitutes in Vr of Expression (2) an actual measurement value registered in the field of the "read processing speed" of the measurement information 250, and substitutes in Vpq of Expression (2) the initial value registered in the "restoration processing speed 1".

[Step S43a] The data restoration unit 213 determines whether or not the difference between the line number registered in the field of the "line number during read" of the measurement information 250 and the line number registered in the field of the "line number 1 during restoration" of the measurement information 250 is not less than the initial interval value Lpq calculated in step S42a. The data restoration unit 213 enters a waiting state until the difference of the line numbers becomes not less than the initial interval value Lpq, and executes processing of step S44a when the difference becomes not less than the initial interval value Lpq.

[Step S44a] The data restoration unit 213 selects a line number of a head block of the blocks for which restoration has not been completed in two logical volumes to be restored that the read control unit 212 has notified of. The data restoration unit 213 reads from the disk array apparatus 300 a block of other logical volume corresponding to a same line number as the selected line number and blocks of the parities P and Q. The data restoration unit 213 restores data of the block corresponding to the selected line number in two logical volumes to be restored using the data of each read block, and stores the restored data of the block in the disk array apparatus 300.

However, when sizes of the two logical volumes to be restored are different from each other, restoration of the whole logical volume having the second read order from the last is completed before restoration of the whole logical volume having the last read order is completed. In step S44a, when restoration of the whole logical volume having the second read order from the last is completed, the data restoration unit 213 performs restoration processing of only the block of the logical volume having the last read order.

[Step S45a] The data restoration unit 213 determines whether or not restoration of the whole two logical volumes to be restored has been completed. When restoration of the whole two logical volumes has been completed, the data restoration unit 213 ends the processing. Meanwhile, when the block for which restoration has not been completed is present in the blocks in the two logical volumes, the data restoration unit 213 executes processing of step S46a.

[Step S46a] The data restoration unit 213 calculates a restoration processing speed of the two logical volumes to be restored from the head block until now. The data restoration unit 213 updates information of the field of the "restoration processing speed 1" of the measurement information 250 by the calculated restoration processing speed.

[Step S47] The data restoration unit 213 increments by one the line number of the field of the "line number 1 during restoration" of the measurement information 250.

[Step S48] The data restoration unit 213 determines whether or not the difference between the line number registered in the field of the "line number during read" of the measurement information 250 and the line number registered in the field of the "line number 1 during restoration" of the measurement information 250 is not more than the predetermined difference set value. When the difference between the line numbers is larger than the difference set value, the processing proceeds to step S44a, and the data restoration unit 213 executes restoration processing of a next block. Meanwhile, when the difference between the line numbers is not more than the difference set value, the data restoration unit 213 executes processing of step S49a.

It is to be noted that in step S48, when read processing of the logical volume having previous read order from the magnetic tape has been completed by the read control unit 212, the data restoration unit 213 unconditionally executes processing of step S44a.

[Step S49a] The data restoration unit 213 temporarily stops restoration processing of the two logical volumes to be restored.

[Step S50a] The data restoration unit 213 recalculates the initial interval value Lpq in accordance with Expression (2), and updates the field of the "initial interval value 1" of the measurement information 250 with the calculated value. In performing the recalculation, the data restoration unit 213 calculates a total size of the blocks for which restoration has not been completed among the blocks of the logical volume to be restored, and substitutes the calculated value in Lmax of Expression (2). In addition, the data restoration unit 213 calculates a total size of the blocks for which read has not been completed among the blocks of the logical volume having the third read order from the last (i.e., the logical volume during read by the read control unit 212), and substitutes the calculated value in L3 of Expression (2). Furthermore, the data restoration unit 213 substitutes in Vpq and Vr values registered in the fields of the "restoration processing speed 1" and the "read processing speed" of the measurement information 250, respectively.

[Step S51] The data restoration unit 213 determines whether or not the difference between the line number registered in the field of the "line number during read" of the measurement information 250 and the line number registered in the field of the "line number 1 during restoration" of the measurement information 250 is not less than the initial interval value Lpq calculated in step S50a. The data restoration unit 213 enters a waiting state until the difference of the line numbers becomes not less than the initial interval value Lpq, and executes processing of step S44a when the difference becomes not less than the initial interval value Lpq.

Process Example 3

The following process example 3 is the example in which data read processing from the tape library apparatus 400 in the logical volume group unit in the process example 2 is modified as follows.

In the above-described process example 2, the read restoration unit 213 restores both the logical volume having the last read order and the logical volume having the second read order from the last among the blocks of the logical volume belonging to the logical volume group using two types of parities P and Q. In contrast with this, in the following process example 3, the data restoration unit 213 restores the logical volume having the second read order from the last using the read data and two types of parities P and Q. In addition, the data restoration unit 213 restores the logical volume having the last read order using the read data, the restored data of the logical volumes having the second read order from the last, and either the parity P or Q. Furthermore, the data restoration unit 213 executes in parallel restoration processing of the logical volume having the second read order from the last and restoration processing of the logical volume having the last read order. As a result, a time required until data of the whole logical volume group is stored in the disk array apparatus 300 is reduced.

Here, first, using FIGS. 23 to 25, will be described a process example in the logical volume group LVG0 illustrated in FIG. 17 being read from the tape library apparatus 400 to the disk array apparatus 300.

Figure 23:
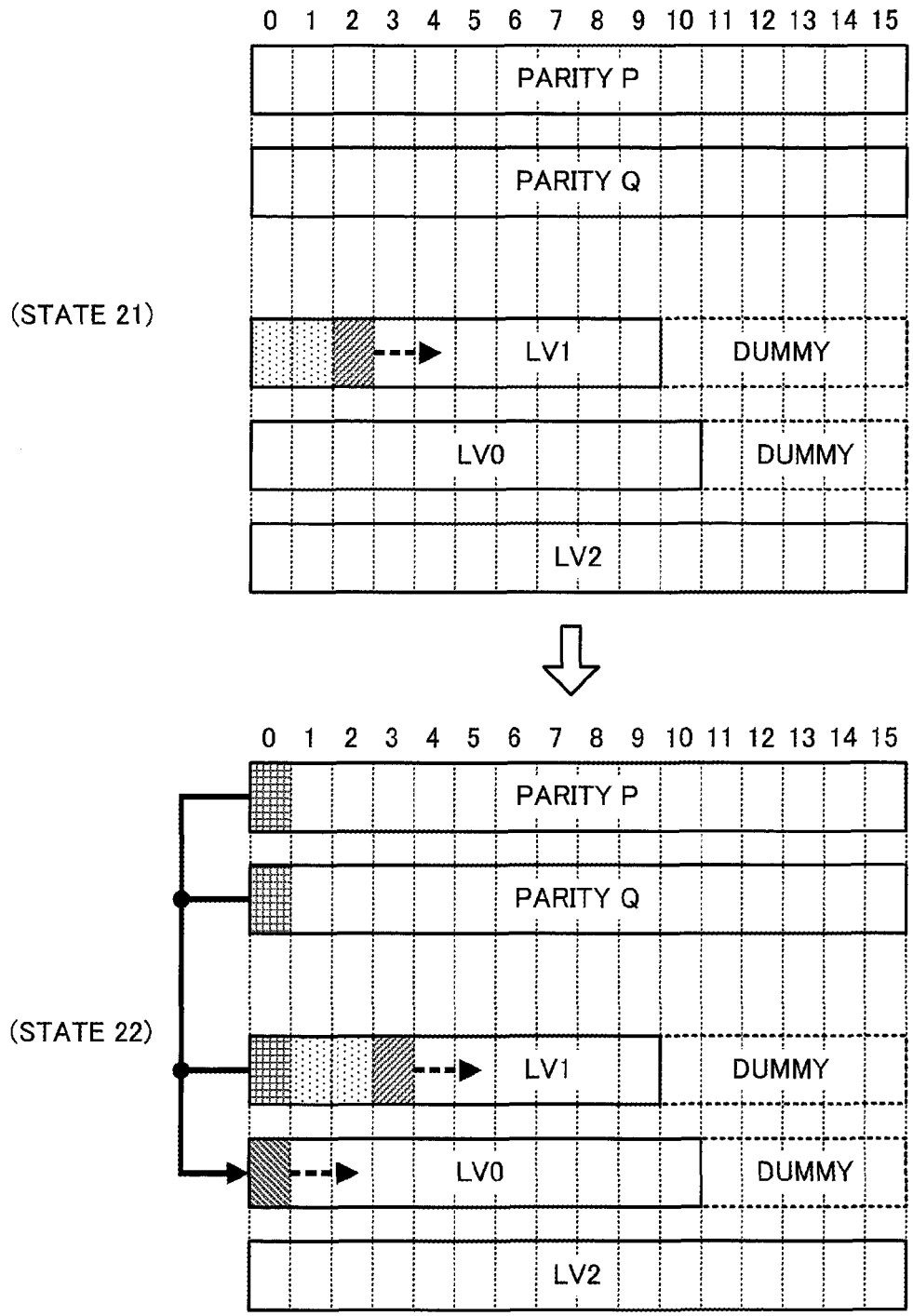
FIG. 23 illustrates an example of read processing of a logical volume group from the tape library apparatus.
Figure 24:
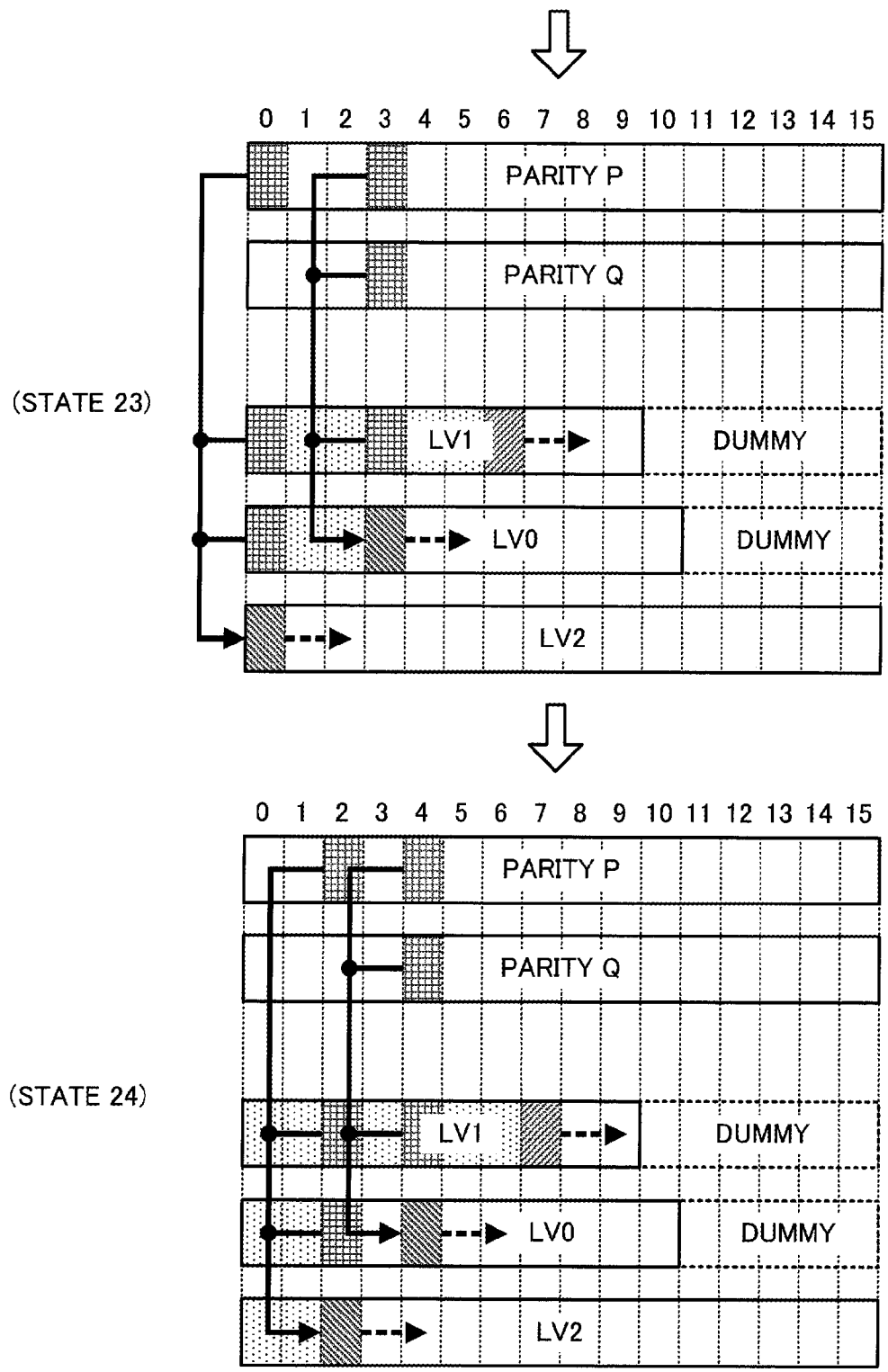
FIG. 24 illustrates the example of the read processing of the logical volume group from the tape library apparatus.
Figure 25:
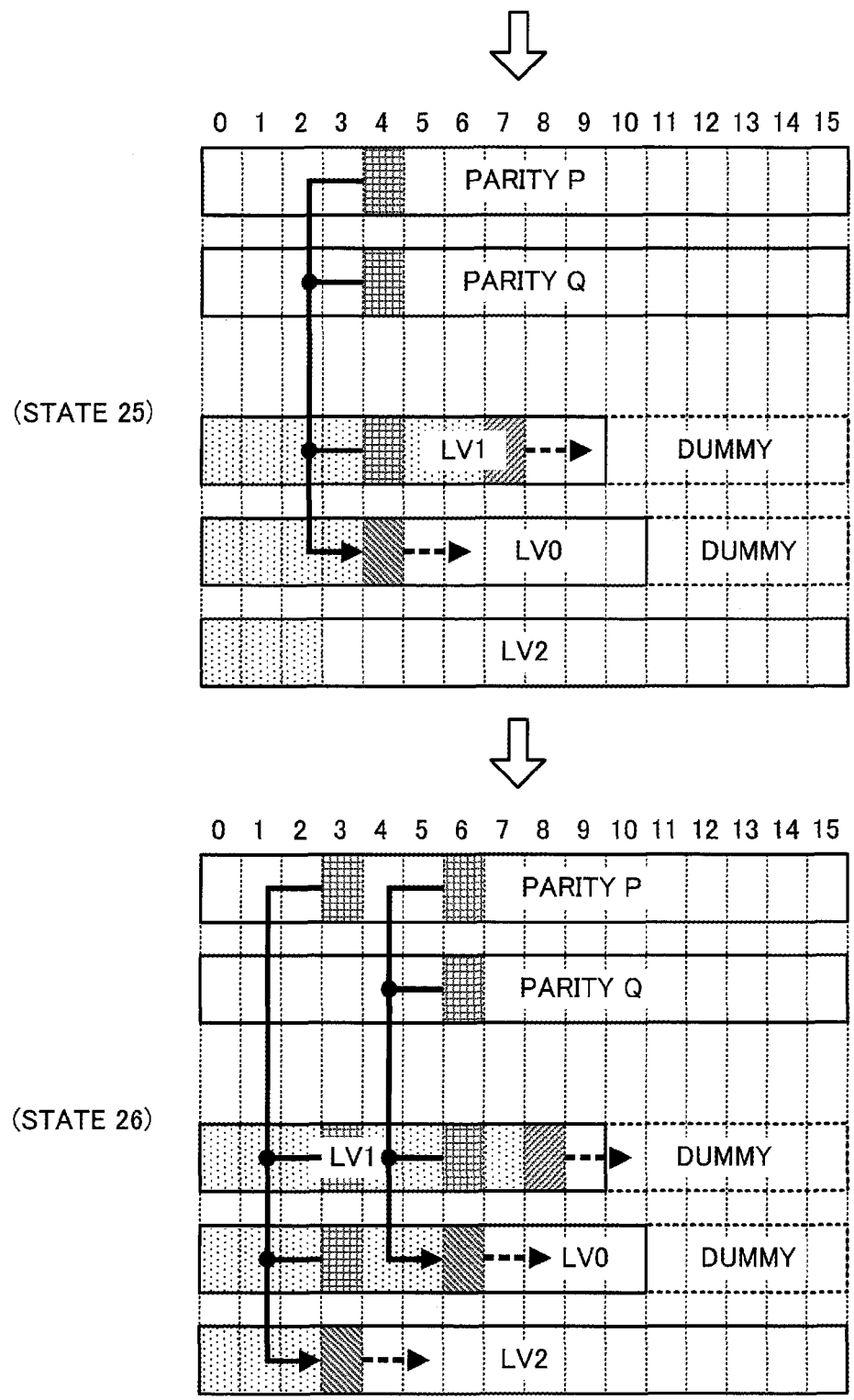
FIG. 25 illustrates the example of the read processing of the logical volume group from the tape library apparatus.

FIGS. 23 to 25 illustrate an example of read processing of the logical volume group from the tape library apparatus.

When receiving an instruction of data read of the logical volume group from the LVG read control unit 222, the read control unit 212 decides read order of the logical volumes belonging to the logical volume group. The read control unit 212 at least sets the maximum size of logical volume to have the last read order, and the second largest logical volume to have the second read order from the last among the logical volumes belonging to the logical volume group. As a result, a data amount restored by calculation becomes larger. In addition, both a time to execute in parallel restoration processing of one logical volume and read processing of other one logical volume from the magnetic tape, and a time to execute restoration processing of two logical volumes in parallel become longer. Therefore, a time required until all the data of the logical volume group is stored in the disk array apparatus 300 is reduced.

In the present embodiment, as an example, the read control unit 212 reads the logical volumes belonging to the logical volume group in order of smaller size thereof. In the example of FIGS. 23 to 25, the read control unit 212 decides read order as the order of logical volumes LV1, LV0, and LV2, and as illustrated in a state 21 of FIG. 23, first starts read of the logical volume LV1 from the magnetic tape in the tape library apparatus 400. In addition, when determining that the logical volume LV1 for which read is started has the third read order from the last, the read control unit 212 instructs the data restoration unit 213 to execute restoration processing of the logical volumes LV0 and LV2 having the last read order and the second read order from the last.

The data restoration unit 213 restores the logical volume LV0 having the second read order from the last in the following procedure.

The data restoration unit 213 calculates the initial interval value Lpq, and registers it in the field of the "initial interval value 1" of the measurement information 250. When the read processing of the logical volume LV1 is completed in the blocks for the number of lines indicated by the initial interval value Lpq, the data restoration unit 213 starts restoration processing of the logical volume LV0 having the second read order from the last. For example, in a case where the initial interval value Lpq is the number of lines "3", as illustrated in a state 22 of FIG. 23, when read of a block of the line number 2 in the logical volume LV1 is completed, and read of a block of a line number 3 is started, the data restoration unit 213 starts the restoration processing of the logical volume LV0.

The initial interval value Lpq is calculated in accordance with the following Expression (3). However, the initial interval value Lpq is an integer of 1 or more, and when a value of one place of decimals is rounded up, and a rounded-up value becomes less than 1 in calculation with Expression (3), a calculation result is fixed as 1.

$$Lpq = Vr(L3/Vr - L2/Vpq)/Bs \quad (3)$$

In Equation (3), L2 is a size of the second largest logical volume of the logical volumes belonging to the logical volume group to be read, and the size corresponds to a size of the logical volume (logical volume LV0 in FIG. 23) restored using the parities P and Q. The data restoration unit 213, for example, obtains L2 from the field of the "LV size 2" of the LVG information 241 in the LVG management table 240.

Based on Expression (3), the data restoration unit 213 delays restoration start timing of the logical volume LV0 from read start timing of the logical volume LV1 by the number of lines according to a difference between L3/Vr indicating an expected time required for read of the logical volume LV2 and L2/Vpq indicating an expected time required for restoration of the logical volume LV0.

The data restoration unit 213 restores blocks of the logical volume LV0 in order from a head block. For example, as illustrated in the state 22 of FIG. 23, the data restoration unit 213 reads a block of the line number 3 in each of the parities P and Q, and the logical volume LV1 from the disk array apparatus 300, and restores the block of the line number 3 in the logical volume LV0 using each read block.

The data restoration unit 213 executes restoration processing of the logical volume LV0 in parallel with the read processing of the logical volume LV1 by the read control unit 212. It is to be noted that the data restoration unit 213 restores all the blocks of the logical volume LV0 having the second read order from the last by adding dummy data to a back end of the read logical volume.

In addition, when restoration of one block in the logical volume LV0 is completed, in a case where a difference between the line number of the block during read in the logical volume LV1 and the line number of the block for which restoration has been completed is not more than a predetermined difference set value, the data restoration unit 213 temporarily stops restoration processing. The difference set value is set as an integer of 1 or more.

The data restoration unit 213 that stopped restoration processing recalculates the initial interval value Lpq in accordance with Expression (3). In the recalculation, the data restoration unit 213 substitutes in L2 of parameters of Expression (3) a total size of the blocks for which restoration has not been completed in the logical volume LV0. In addition, the data restoration unit 213 substitutes in L3 a total size of the blocks for which read has not been completed in the logical volume LV1. Furthermore, the data restoration unit 213 substitutes in Vpq and Vr newest actual measurement values registered in the fields of the "restoration processing speed 2" and the "read processing speed" of the measurement information 250, respectively.

When a difference between the line number of the block during read and the line number of the block to be restored becomes not less than the recalculated initial interval value Lpq, the data restoration unit 213 restarts the restoration processing of the logical volume LV0. As a result, a possibility is reduced that the line number of the block to be restored and the line number of the block to be read coincide with each other again.

Meanwhile, the data restoration unit 213 restores the logical volume LV2 having the last read order in the following procedure. It is to be noted that in the following description, the data restoration unit 213 shall restore the logical volume having the last read order using the parity P as an example.

The data restoration unit 213 calculates the initial interval value Lp, and registers it in the field of the "initial interval value 2" of the measurement information 250. When the restoration processing of the logical volume LV0 is completed in the blocks for the number of lines indicated by the initial interval value Lp, the data restoration unit 213 starts the restoration processing of the logical volume LV2 having the last read order. For example, in a case where the initial interval value Lp is the number of lines "3", as illustrated in a state 23 of FIG. 24, when restoration of a block of the line number 2 in the logical volume LV0 is completed, and restoration of a block of a line number 3 is started, the data restoration unit 213 starts the restoration processing of the logical volume LV2.

The initial interval value Lp is calculated in accordance with the following Expression (4). However, the initial interval value Lp is an integer of 1 or more, and when a value of one place of decimals is rounded up, and a rounded-up value becomes less than 1 in calculation with Expression (4), a calculation result is fixed as 1.

$$Lp=Vpq(L2/Vpq-Lmax/Vp)/Bs \qquad (4)$$

In addition, the data restoration unit 213 substitutes in Vpq an actual measurement value of a restoration speed of a second largest logical volume (logical volume LV0 in FIG. 24) of the logical volumes belonging to the logical volume group to be read. Furthermore, the data restoration unit 213 substitutes in Vp an initial value of a restoration speed of a maximum size of logical volume (logical volume LV2 in FIG. 24) of the logical volumes belonging to the logical volume group to be read.

Based on Expression (4), the data restoration unit 213 delays restoration start timing of the logical volume LV2 from read start timing of the logical volume LV2 by the number of lines according to a difference between L2/Vpq indicating an expected time required for restoration of the logical volume LV0 and Lmax/Vp indicating an expected time required for restoration of the logical volume LV2.

The data restoration unit 213 restores blocks of the logical volume LV2 in order from a head block. For example, as illustrated in a state 24 of FIG. 24, the data restoration unit 213 reads a block of the line number 2 in each of the parity P, logical volume LV1, and logical volume LV0 from the disk array apparatus 300, and restores the block of the line number 2 in the logical volume LV2 using each read block.

The data restoration unit 213 executes restoration processing of the logical volume LV2 in parallel with the restoration processing of the logical volume LV0. It is to be noted that the data restoration unit 213 restores all the blocks of the logical volume LV2 having the last read order by adding dummy data also to a back end of the restored logical volume LV0.

In addition, when restoration of one block in the logical volume LV2 is completed, in a case where a difference between the line number of the block during restoration in the logical volume LV0 and the line number of the block for which restoration has been completed in the logical volume LV2 is not more than a predetermined difference set value, the data restoration unit 213 temporarily stops restoration processing. The difference set value is set as an integer of 1 or more.

In a state 25 of FIG. 25, when having completed restoration of the block of the line number 2 in the logical volume LV2, the data restoration unit 213 is executing restoration processing of a block of a line number 4 in the logical volume LV0. Here, assuming that the difference set value is 2, the data restoration unit 213 determines that a difference between the line number 4 of the block during restoration in the logical volume LV0 and the line number 2 of the block for which restoration has been completed in the logical volume LV2 is not more than the predetermined difference set value "2", and temporarily stops the restoration processing of the logical volume LV2. At this time, the data restoration unit 213 continues the restoration processing of the logical volume LV0.

The data restoration unit 213 that stopped restoration processing of the logical volume LV2 recalculates the initial interval value Lp in accordance with Expression (4). In the recalculation, the data restoration unit 213 substitutes in Lmax of parameters of Expression (4) a total size of the blocks for which restoration has not been completed in the logical volume LV2, and substitutes in L2 a total size of the blocks for which restoration has not been completed in the logical volume LV0. Furthermore, the data restoration unit 213 substitutes in Vp and Vpq newest actual measurement values registered in the fields of the "restoration processing speed 1" and the "restoration processing speed 2" of the measurement information 250, respectively.

When a difference between the line number of the block during restoration in the logical volume LV0 and the line number of the block to be restored in the logical volume LV2 becomes not less than the recalculated initial interval value Lp, the data restoration unit 213 restarts the restoration processing of the logical volume LV2. As a result, a possibility is reduced that the line number of the block to be restored in the logical volume LV2 and the line number of the block to be restored in the logical volume LV0 coincide with each other again.

Assuming that the initial interval value Lp is calculated as "3", as illustrated in a state 26 of FIG. 25, when the line number of the block during restoration in the logical volume LV0 becomes "6", the data restoration unit 213 restarts the restoration processing of the logical volume LV2.

With the above processing, the logical volumes LV0 and LV2 are restored with calculation by the data restoration unit 213 without being read from the magnetic tape of the tape library apparatus 400, and are stored in the disk array apparatus 300. As a result, a time required until data of the whole logical volume group is stored in the disk array apparatus 300 is reduced.

Next, an example of a read processing procedure in the logical volume group unit in the process example 3 will be described using a flow chart. The read processing procedure in the logical volume group unit by the read control unit 212 in the process example 3 is similar to that of FIG. 21. When receiving an execution instruction of restoration processing from the read control unit 212 in step S27a of FIG. 21, the data restoration unit 213 executes in parallel data restoration processing using two types of parities P and Q illustrated in FIG. 26, and data restoration processing using one type of parity (set as the parity P here) illustrated in FIG. 27.

Figure 26:
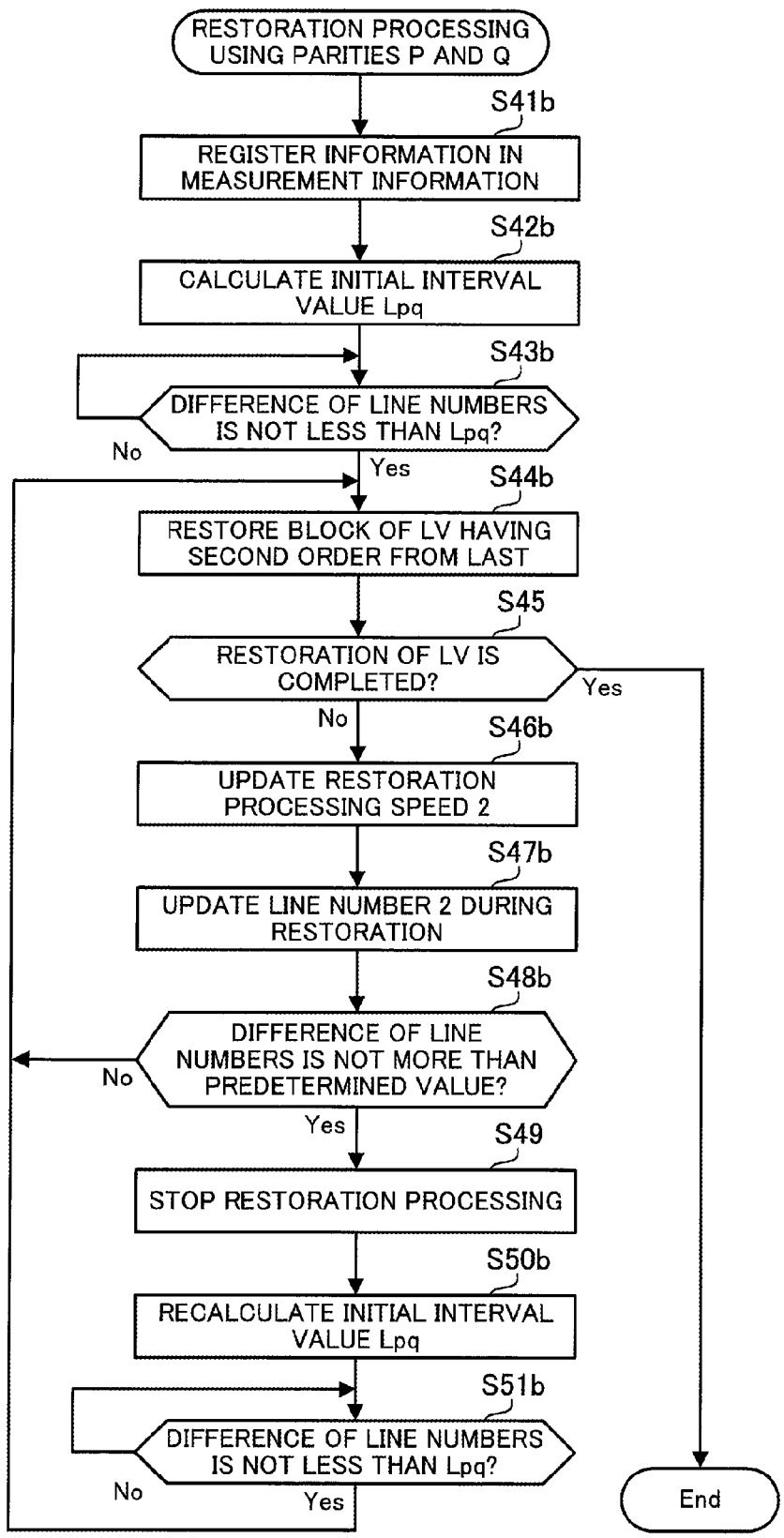
FIG. 26 is a flow chart illustrating a data restoration processing procedure using parities P and Q in a process example 3.

FIG. 26 is a flow chart illustrating a data restoration processing procedure using the parities P and Q in the process example 3. It is to be noted that in FIG. 26, the same step numbers as in FIG. 16 are attached to processing steps in which the same processing as in FIG. 16 is executed.

[Step S41b] The data restoration unit 213 registers a head line number in the field of the "line number 2 during restoration", and registers a predetermined initial value in the field of the "restoration processing speed 2" in the measurement information 250 corresponding to the LVG number that the read control unit 212 has notified of.

[Step S42b] The data restoration unit 213 calculates the initial interval value Lpq in accordance with the above-mentioned Expression (3), and registers it in the field of the "initial interval value 2" of the measurement information 250. At this time, the data restoration unit 213 substitutes in Vr of Expression (3) an actual measurement value registered in the field of the "read processing speed" of the measurement information 250, and substitutes in Vpq of Expression (3) the initial value registered in the "restoration processing speed 2".

[Step S43b] The data restoration unit 213 determines whether or not a difference between the line number registered in the field of the "line number during read" of the measurement information 250 and the line number registered in the field of the "line number 2 during restoration" of the measurement information 250 is not less than the initial interval value Lpq calculated in step S42b. The data restoration unit 213 enters a waiting state until the difference of the line numbers becomes not less than the initial interval value Lpq, and executes processing of step S44b when the difference becomes not less than the initial interval value Lpq.

[Step S44b] The data restoration unit 213 selects a line number of a head block of the blocks for which restoration has not been completed in the logical volume to be restored in FIG. 26. The data restoration unit 213 reads from the disk array apparatus 300 a block of other logical volume corresponding to a same line number as the selected line number and blocks of the parities P and Q. The data restoration unit 213 restores data of the block corresponding to the selected line number in the logical volume to be restored using the data of each read block, and stores the restored data of the block in the disk array apparatus 300.

[Step S45] The data restoration unit 213 determines whether or not restoration of the whole logical volume to be restored has been completed. When restoration of the whole logical volume has been completed, the data restoration unit 213 ends the processing. Meanwhile, when the block for which restoration has not been completed is present in the blocks in the logical volume, the data restoration unit 213 executes processing of step S46b.

[Step S46b] The data restoration unit 213 calculates a restoration processing speed of the logical volume to be restored from a head block until now. The data restoration unit 213 updates information of the field of the "restoration processing speed 2" of the measurement information 250 by the calculated restoration processing speed.

[Step S47b] The data restoration unit 213 increments by one the line number of the field of the "line number 2 during restoration" of the measurement information 250.

[Step S48b] The data restoration unit 213 determines whether or not a difference between the line number registered in the field of the "line number during read" of the measurement information 250 and the line number registered in the field of the "line number 2 during restoration" of the measurement information 250 is not more than a predetermined difference set value. When the difference of the line numbers is larger than the difference set value, the processing proceeds to step S44b, and the data restoration unit 213 executes restoration processing of a next block. Meanwhile, when the difference between the line numbers is not more than the difference set value, the data restoration unit 213 executes processing of step S49.

It is to be noted that in step S48b, when read processing of the logical volume having previous read order from the magnetic tape has been completed by the read control unit 212, the data restoration unit 213 unconditionally executes processing of step S44b.

[Step S49] The data restoration unit 213 temporarily stops restoration processing of the logical volume to be restored.

[Step S50b] The data restoration unit 213 recalculates the initial interval value Lpq in accordance with Expression (3), and updates the field of the "initial interval value 2" of the measurement information 250 with the calculated value. In performing the recalculation, the data restoration unit 213 calculates a total size of the blocks for which restoration has not been completed among the blocks of the logical volume to be restored, and substitutes the calculated value in L2 of Expression (3). In addition, the data restoration unit 213 calculates a total size of the blocks for which read has not been completed among the blocks of the logical volume having the third read order from the last (i.e., the logical volume during read by the read control unit 212), and substitutes the calculated value in L3 of Expression (3). Furthermore, the data restoration unit 213 substitutes in Vpq and Vr values registered in the fields of the "restoration processing speed 2" and the "read processing speed" of the measurement information 250, respectively.

[Step S51b] The data restoration unit 213 determines whether or not the difference between the line number registered in the field of the "line number during read" of the measurement information 250 and the line number registered in the field of the "line number 2 during restoration" of the measurement information 250 is not less than the initial interval value Lpq calculated in step S50b. The data restoration unit 213 enters a waiting state until the difference of the line numbers becomes not less than the initial interval value Lpq, and executes processing of step S44b when the difference becomes not less than the initial interval value Lpq.

Figure 27:
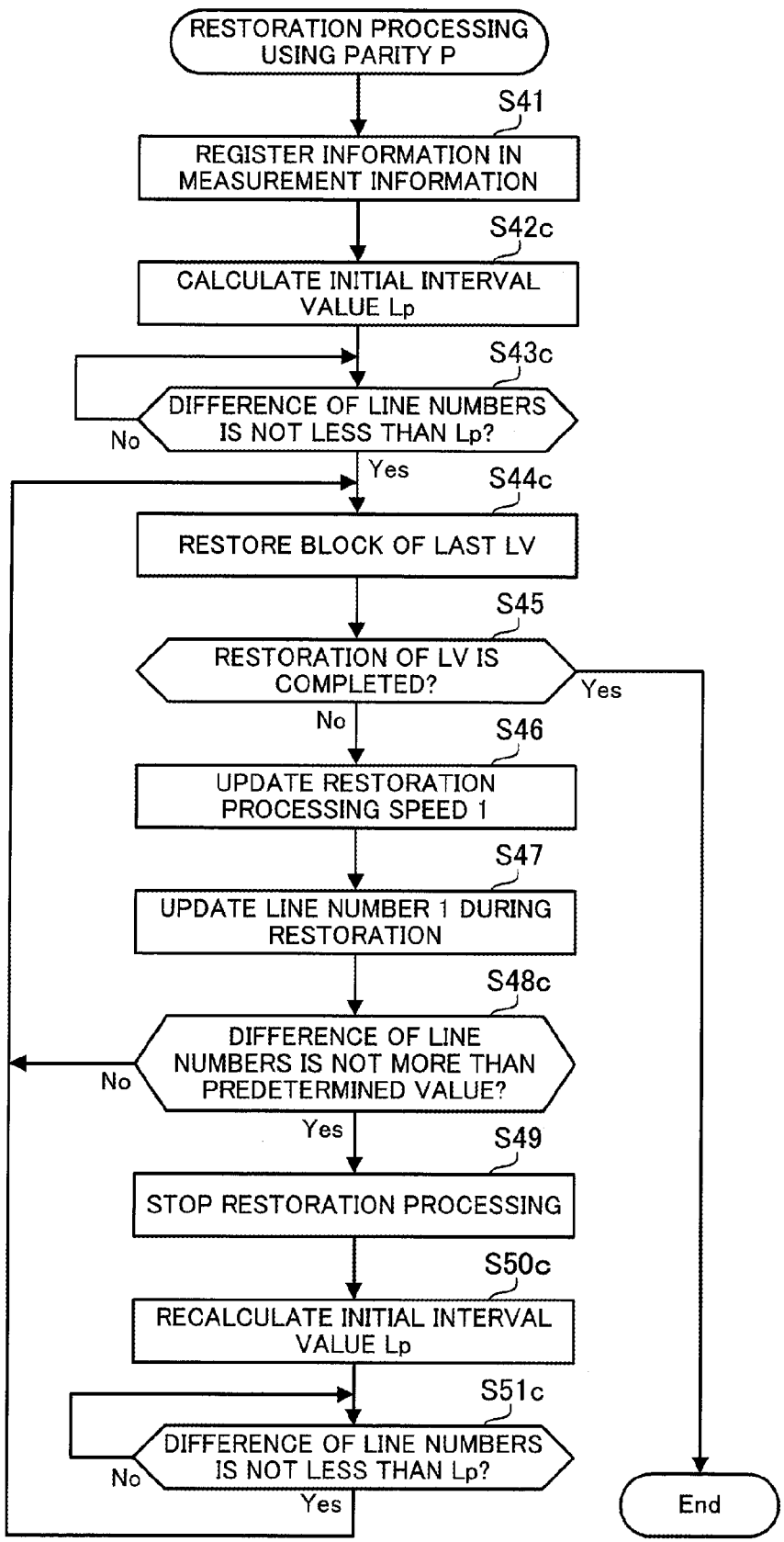
FIG. 27 is a flow chart illustrating a data restoration processing procedure using the parity P in the process example 3.

FIG. 27 is a flow chart illustrating a data restoration processing procedure using the parity P in the process example 3. It is to be noted that in FIG. 27, the same step numbers as in FIG. 16 are attached to processing steps in which the same processing as in FIG. 16 is executed.

[Step S41] The data restoration unit 213 registers a head line number in the field of the "line number 1 during restoration", and registers a predetermined initial value in the field of the "restoration processing speed 1" in the measurement information 250 corresponding to the LVG number that the read control unit 212 has notified of.

[Step S42c] The data restoration unit 213 calculates the initial interval value Lp in accordance with the above-mentioned Expression (4), and registers it in the field of the "initial interval value 1" of the measurement information 250. At this time, the data restoration unit 213 substitutes in Vpq of Expression (4) an actual measurement value registered in the field of the "restoration processing speed 2" of the measurement information 250, and substitutes in Vp of Expression (4) the initial value registered in the "restoration processing speed 1".

[Step S43c] The data restoration unit 213 determines whether or not a difference of the line numbers registered in each field of the "line number 1 during restoration" and the "line number 2 during restoration" of the measurement information 250 is not less than the initial interval value Lp calculated in step S42c. The data restoration unit 213 enters a waiting state until the difference of the line numbers becomes not less than the initial interval value Lp, and executes processing of step S44c when the difference becomes not less than the initial interval value Lp.

[Step S44c] The data restoration unit 213 selects a line number of a head block of the blocks for which restoration has not been completed in the logical volumes to be restored in FIG. 27. The data restoration unit 213 reads from the disk array apparatus 300 a block of other logical volume corresponding to a same line number as the selected line number and a block of the parity P. The data restoration unit 213 restores data of the block corresponding to the selected line number in the logical volume to be restored using the data of each read block, and stores the restored data of the block in the disk array apparatus 300.

[Step S45] The data restoration unit 213 determines whether or not restoration of the whole logical volume to be restored has been completed. When restoration of the logical volume has been completed, the data restoration unit 213 ends the processing. Meanwhile, when the block for which restoration has not been completed is present in the blocks in the logical volume, the data restoration unit 213 executes processing of step S46.

[Step S46] The data restoration unit 213 calculates a restoration processing speed of the logical volume to be restored from a head block until now. The data restoration unit 213 updates information of the field of the "restoration processing speed 1" of the measurement information 250 by the calculated restoration processing speed.

[Step S47] The data restoration unit 213 increments by one the line number of the field of the "line number 1 during restoration" of the measurement information 250.

[Step S48c] The data restoration unit 213 determines whether or not the difference of the line numbers registered in each field of the "line number 1 during restoration" and the "line number 2 during restoration" of the measurement information 250 is not more than a predetermined difference set value. When the difference of the line numbers is larger than the difference set value, the processing proceeds to step S44c, and the data restoration unit 213 executes restoration processing of a next block. Meanwhile, when the difference between the line numbers is not more than the difference set value, the data restoration unit 213 executes processing of step S49.

It is to be noted that in step S48c, when restoration processing of the logical volume having previous read order is completed, the data restoration unit 213 unconditionally executes processing of step S44c.

[Step S49] The data restoration unit 213 temporarily stops restoration processing of the logical volume to be restored.

[Step S50c] The data restoration unit 213 recalculates the initial interval value Lp in accordance with Expression (4), and updates the field of the "initial interval value 1" of the measurement information 250 with the calculated value. In performing the recalculation, the data restoration unit 213 calculates a total size of the blocks for which restoration has not been completed of the logical volume to be restored, and substitutes the calculated value in Lmax of Expression (4). In addition, the data restoration unit 213 calculates a total size of the blocks for which restoration has not been completed of the logical volumes having the second read order from the last, and substitutes the calculated value in L2 of Expression (4). Furthermore, the data restoration unit 213 substitutes in Vp and Vpq values registered in the fields of the "restoration processing speed 1" and the "restoration processing speed 2" of the measurement information 250, respectively.

[Step S51c] The data restoration unit 213 determines whether or not the difference of the line numbers registered in each field of the "line number 1 during restoration" and the "line number 2 during restoration" of the measurement information 250 is not less than the initial interval value Lp calculated in step S50c. The data restoration unit 213 enters a waiting state until the difference of the line numbers becomes not less than the initial interval value Lp, and executes processing of step S44c when the difference becomes not less than the initial interval value Lp.

It is to be noted that in the above description of the second embodiment, read processing from the tape library apparatus 400 in the logical volume group unit by the read control unit 212 is executed according to an instruction from the LVG read control unit 222. However, such read processing may be performed according to a recall execution instruction from the virtual tape control unit 221.

For example, when receiving a recall execution instruction from the virtual tape control unit 221, the read control unit 212 specifies a logical volume group to which a logical volume targeted for recall belongs. After this, the read control unit 212 makes a head read order of the logical volume targeted for recall in step S23 in FIG. 15 or 21, and makes read order of the other logical volumes belonging to the same logical volume group to be a smaller one.

Since then, the read control unit 212 executes processing after step S24 of FIG. 15 or 21. Here, when step S24 is first executed, the read control unit 212 reads the logical volume targeted for recall from the magnetic tape in the tape library apparatus 400, and stores it in the disk array apparatus 300. The virtual tape control unit 221 reads data for which read has been requested from the host apparatus 500 from the logical volume targeted for recall stored in the tape library apparatus 400, transmits it to the host apparatus 500.

In addition, processing after FIG. 15 or step S24 of FIG. 21 is further continued, and thereby not only the logical volume targeted for recall but other logical volumes belonging to the same logical volume group as the logical volume targeted for recall are cached in the disk array apparatus 300. As a result, it becomes possible for the virtual tape control unit 221 to respond at a high speed to a read request from the host apparatus 500 also for data in other logical volumes associated with the logical volume to be read from the host apparatus 500.

In addition, in the above-described second embodiment, the control apparatus 200 utilizes the parity stored in the disk array apparatus 300 only for speed-up of data read. However, the control apparatus 200 may utilize the parity in the disk array apparatus 300 to restore data of a logical volume that has become impossible to be read from the magnetic tape due to failure of the magnetic tape, and the like.

For example, in a case of a single parity, when it becomes impossible for the control apparatus 200 to read one of the logical volumes belonging to the logical volume group from the magnetic tape, the control apparatus 200 restores data of the logical volume from other logical volumes belonging to the same logical volume group and the parity. In addition, in a case of double parity, when it becomes impossible for the control apparatus 200 to read two of the logical volumes belonging to the logical volume group from the magnetic tape, the control apparatus 200 restores data of those two logical volumes from other logical volumes belonging to the same logical volume group and the two types of parity.

Third Embodiment

In addition to the processing described in the second embodiment, a control apparatus of a storage system according to a third embodiment further restores a part of the same logical volume by calculation, and reads other part thereof from the magnetic tape in parallel with restoration processing of the part of the same logical volume. As a result, a time required until the data of the whole logical volume group is stored in the disk array apparatus 300 is further reduced.

A hardware configuration of the storage system according to the third embodiment is similar to that of the second embodiment. In addition, basic processing functions included in the control apparatus in the third embodiment are as illustrated in FIG. 5. Therefore, symbols illustrated in FIG. 5 will be used in the following description.

Figure 28:
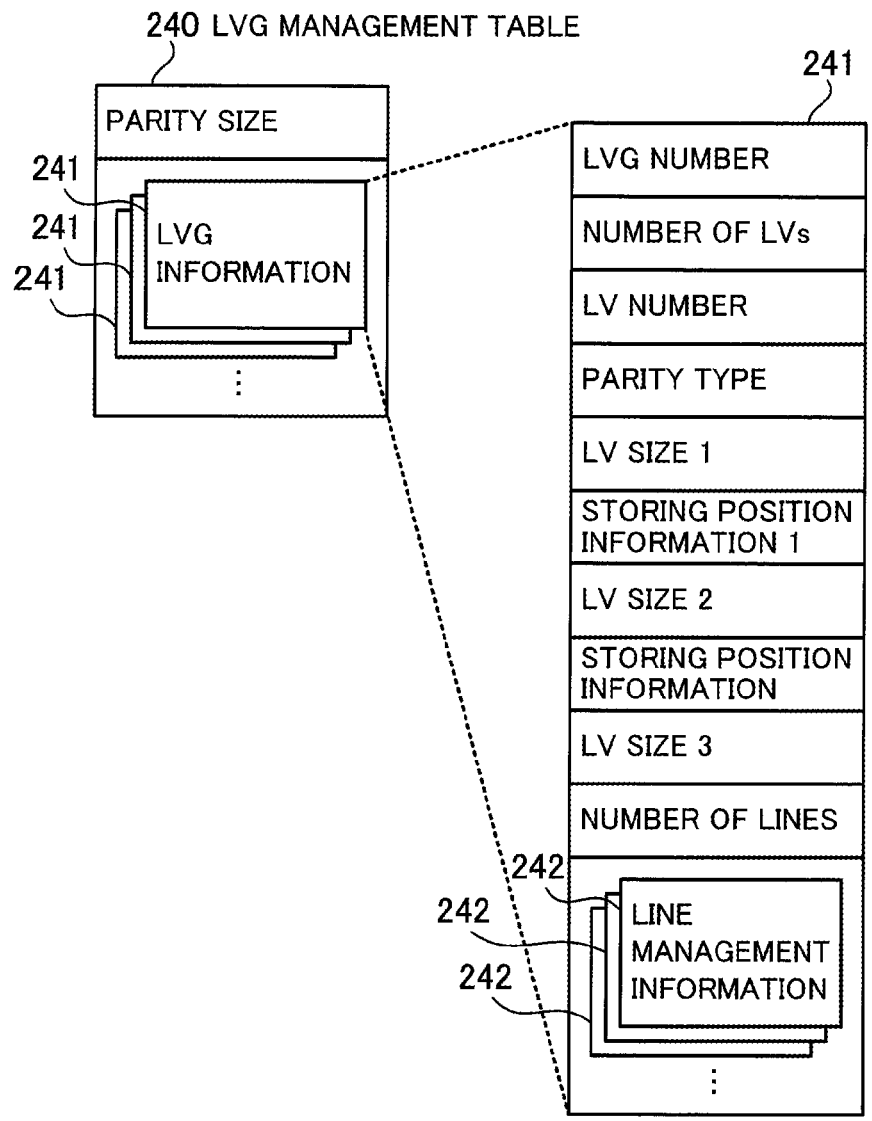
FIG. 28 illustrates an example of information registered in the LVG management table.

FIG. 28 illustrates an example of information to be registered in the LVG management table. In the third embodiment, in addition to the information illustrated in FIG. 7, each field of a "storing position information 1" and a "storing position information 2" is provided in the LVG information 241 in the LVG management table 240.

In the field of the "storing position information 1", registered is information indicating a storing position in the magnetic tape of a maximum size of logical volume of the logical volumes belonging to the logical volume group. In the field of the "storing position information 2", registered is information indicating a storing position in the magnetic tape of a second largest size of logical volume of the logical volumes belonging to the logical volume group. As the information indicating the storing position, for example, registered are an identification number of the magnetic tape, a head address of an area where the corresponding logical volume in the magnetic tape has been recorded, and the like.

The information of each field of the "storing position information 1" and the "storing position information 2" is registered by the write control unit 211 in data of the logical volume group being written in the magnetic tape in the tape library apparatus 400 by the write control unit 211. The information of each field of the "storing position information 1" and the "storing position information 2" is referred to by the read control unit 212. It is to be noted that the read control unit 212 may obtain the information corresponding to each field of the "storing position information 1" and the "storing position information 2" from the LV management table 230.

Figure 29:
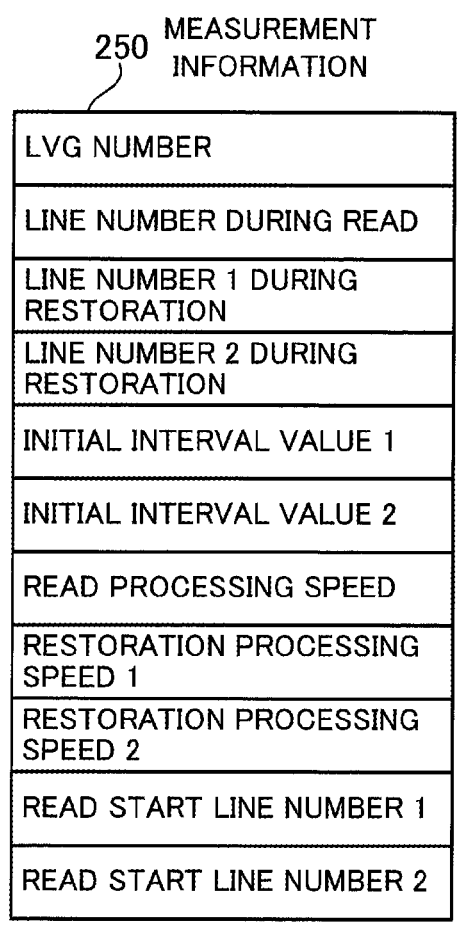
FIG. 29 illustrates an example of information registered in the measurement information.

FIG. 29 illustrates an example of information registered in measurement information. In the third embodiment, in addition to the information illustrated in FIG. 8, each field of a "read start line number 1" and a "read start line number 2" is provided in the measurement information 250.

In the field of the "read start line number 1", registered is a line number of a head block of an area to be read by the read control unit 212 among the blocks of the logical volume having the last read order. In the field of the "read start line number 2", registered is a line number of a head block of an area to be read by the read control unit 212 among the blocks of the logical volume having the second read order from the last.

Next, a read process example in the third embodiment will be described as process examples 4 to 6.

Process Example 4

A process example 4 is the example in which read processing from the tape library apparatus 400 in the logical volume group unit in the above-described process example 1 is modified as follows. In the read processing in the process example 1, the read control unit 212 has ended the processing at the time of having read the logical volume having the second read order from the last from the magnetic tape. In contrast with this, in the following process example 4, when having completed read of the logical volume having the second read order from the last from the magnetic tape, the read control unit 212 starts processing of reading a part of the logical volume during restoration from the magnetic tape.

Figure 30:
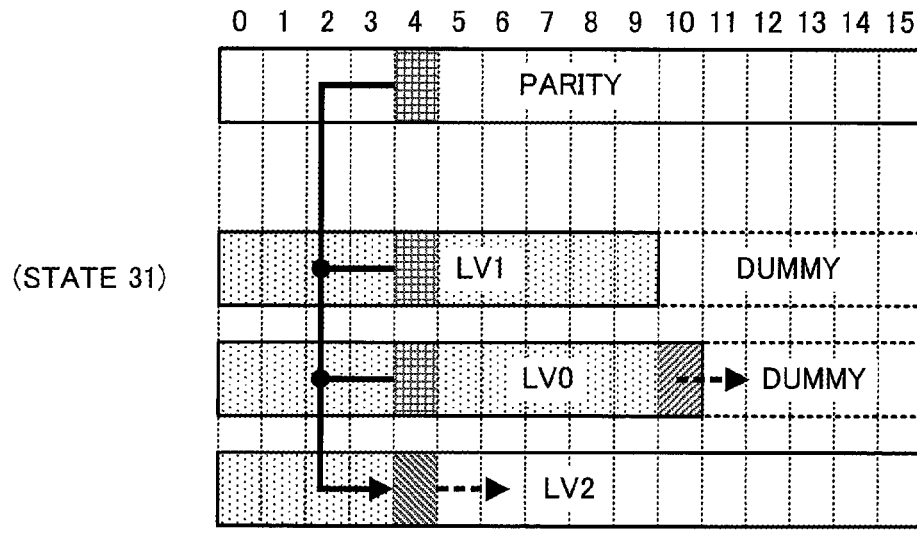
FIG. 30 illustrates an example of read processing of a logical volume group from the tape library apparatus in a process example 4.
Figure 30:
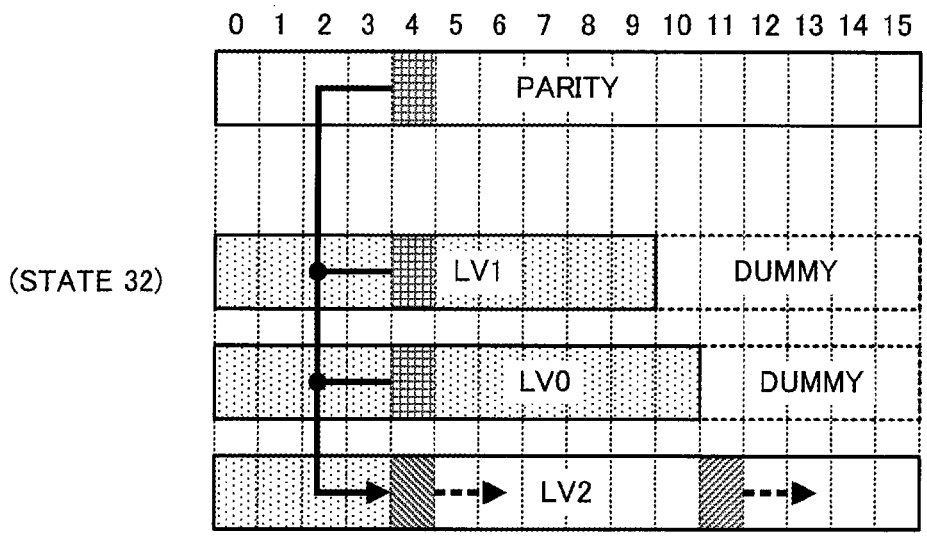

FIG. 30 illustrates an example of read processing of the logical volume group from the tape library apparatus in the process example 4.

A state 31 of FIG. 30 is, as an example, illustrates the state where from the state 6 of FIG. 14, read processing of the logical volume LV0 by the read control unit 212, and restoration processing of the logical volume LV2 by the data restoration unit 213 are further advanced. In the process example 4, when having completed read of a final block in the logical volume LV0 from the magnetic tape, the read control unit 212 makes the tape library apparatus 400 execute preparation for reading the logical volume LV2 having the last read order from the magnetic tape.

When the magnetic tape in which the logical volume LV2 has been stored is mounted in the tape drive in the tape library apparatus 400, and a magnetic head is arranged near an area of the logical volume LV2 on the magnetic tape, the read control unit 212 calculates a read capacity Rd1 in accordance with next Expression (5), and further calculates a read start line number Ld1 in accordance with Expression (6). Here, the read start line number Ld1 indicates a boundary position between an area to be restored by the data restoration unit 213 and an area to be read from the magnetic tape by the read control unit 212 among areas that have not been restored in the logical volume LV2.

$$Rd1 = Vd \cdot Rp1/(Vd+Vp1) \quad (5)$$

$$Ld1 = Nmax - Rd1 \quad (6)$$

In Expression (5), Vd is a data read speed from the magnetic tape, and a predecided value is substituted in Vd. Vp1 is a data restoration speed in the logical volume having the last read order, and the actual measurement value registered in the field of the "restoration processing speed 1" of the measurement information 250 is substituted in Vp1. Rp1 is a size of an area for which restoration of data has not been completed of the logical volume having the last read order. Nmax is the number of blocks of the logical volume having the last read order, and the value registered in the field of the "number of lines" of the LVG information 241 of the LVG management table 240 is substituted in Nmax. It is to be noted that values after a decimal point are rounded down in performing calculation of Expression (5).

The read control unit 212 reads from the magnetic tape data from a block corresponding to the calculated read start line number Ld1 to a final block among the blocks of the logical volume LV2 having the last read order, and stores it in the disk array apparatus 300. Meanwhile, when having completed restoration of a block corresponding to a line number smaller by one than the read start line number Ld1 of the logical volume LV2, the data restoration unit 213 ends the restoration processing.

In a state 32 of FIG. 30, assume that the read start line number Ld1 has been calculated as "12". In this case, the read control unit 212 reads data from the magnetic tape from a twelfth block from a head (i.e., a block corresponding to a line number 11) to a final block of the logical volume LV2. In addition, in parallel with read processing from the magnetic tape by the read control unit 212, the data restoration unit 213 restores blocks to the line number 10 of the logical volume LV2.

As described above, processing that restores a part of the logical volume LV2 using the parity, and processing that reads other part thereof from the magnetic tape are executed in parallel. As a result of it, a time required until data of the whole logical volume group is stored in the disk array apparatus 300 is reduced.

Here, with the above-described Expressions (5) and (6), the read start line number Ld1 is calculated so that a time to read from the magnetic tape the part of the block for which restoration has not been completed of the logical volume LV2, and a time to restore the other part thereof by calculation become the same as each other at the time of having been prepared for reading the logical volume LV2 having the last read order from the magnetic tape. As a result, it becomes possible to minimize a time required until the whole logical volume LV2 is stored in the disk array apparatus 300.

Figure 31:
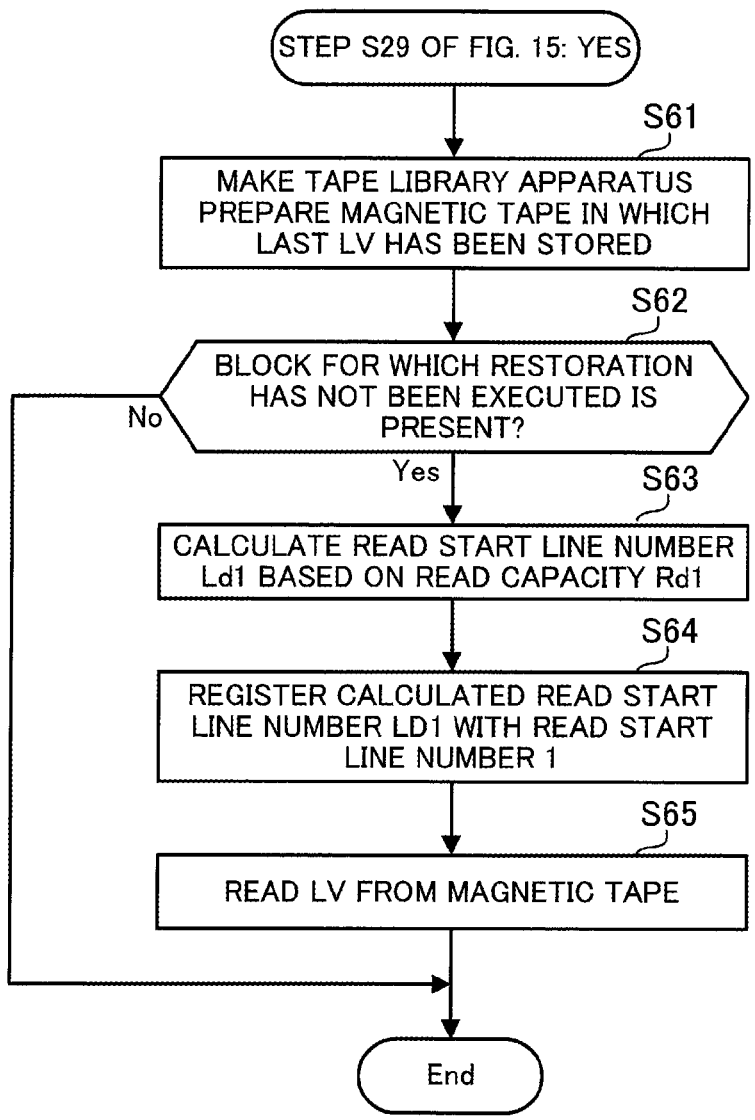
FIG. 31 is a flow chart illustrating an example of a processing procedure of the read control unit in the process example 4.

FIG. 31 is a flow chart illustrating an example of a processing procedure of the read control unit in the process example 4. When determining "Yes" in step S29 of FIG. 15, i.e., when having completed read of the logical volume having the second read order from the last, from the magnetic tape, the read control unit 212 further executes processing illustrated in FIG. 31.

[Step S61] The read control unit 212 sets the logical volume having the last read order as a logical volume for read processing, and reads position information of the logical volume for read processing from the field of the "storing position information 1" of the LVG information 241 registered in the LVG management table 240. The read control unit 212 notifies the tape library apparatus 400 of the read position information, and makes the tape library apparatus 400 execute preparation for reading the logical volume for read processing from the magnetic tape.

[Step S62] The read control unit 212 determines whether or not a block for which restoration processing by the data restoration unit 213 is not executed is present in the blocks of the logical volume for read processing. When the line number registered in the field of the "line number 1 during restoration" of the measurement information 250 indicates a line number of a final block of the logical volume for read processing, the read control unit 212 determines that the block is not present for which restoration has not been executed, and ends processing. Meanwhile, when determining that the block is present for which restoration has not been executed, the read control unit 212 executes processing of step S63.

[Step S63] The read control unit 212 calculates the read capacity Rd1 in accordance with Expression (5), and calculates the read start line number Ld1 from Expression (6) based on the read capacity Rd1.

[Step S64] The read control unit 212 registers the calculated read start line number Ld1 in the field of the "read start line number 1" of the measurement information 250.

[Step S65] The read control unit 212 reads from the magnetic tape from the block indicated by the calculated read start line number Ld1 to the final block of the blocks of the logical volume for read processing. This read processing of step S65 is executed in parallel with restoration processing of a block prior to the block indicated by the read start line number Ld1 by the data restoration unit 213.

Figure 32:
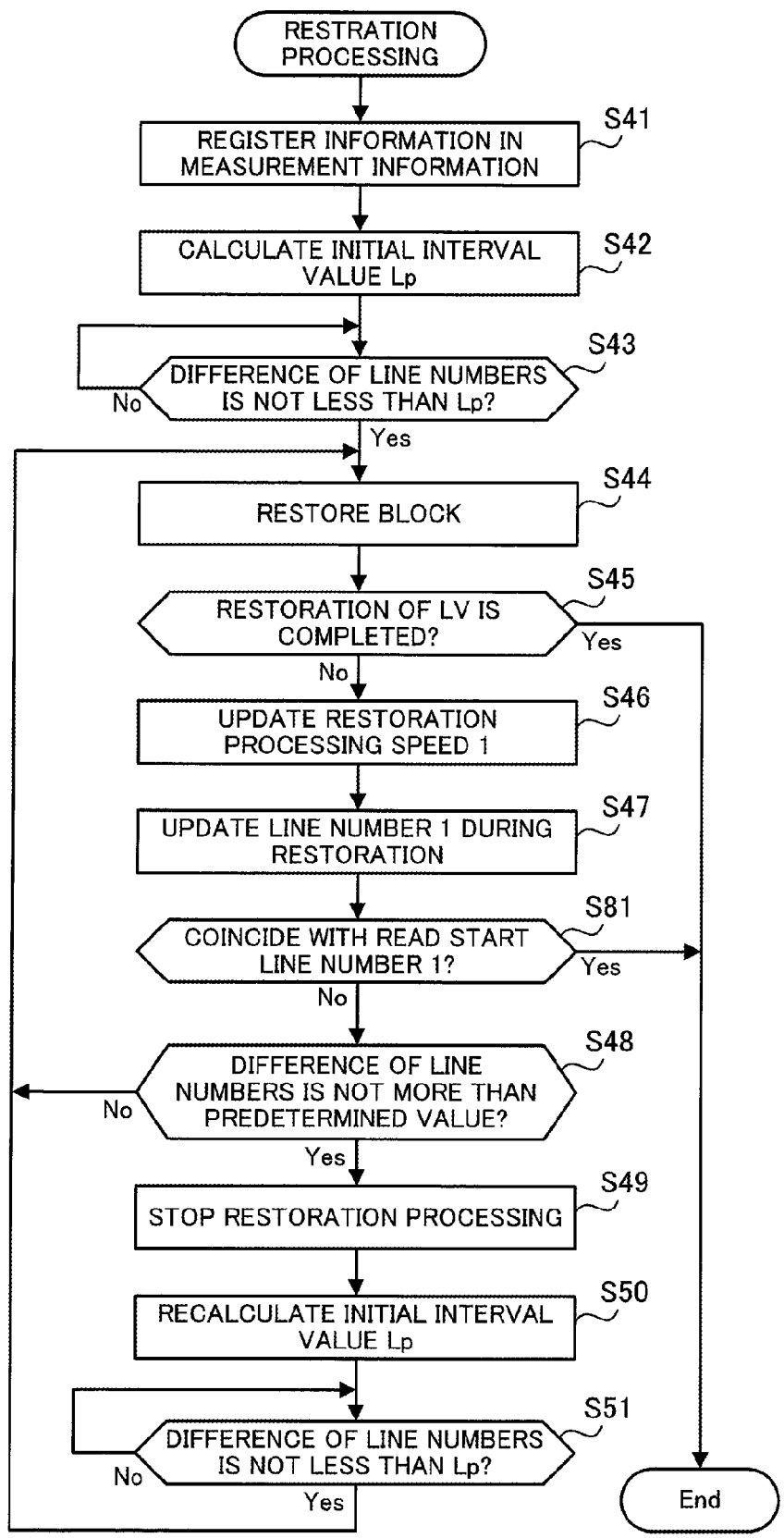
FIG. 32 is a flow chart illustrating a data restoration processing procedure in the process example 4.

FIG. 32 is a flow chart illustrating a data restoration processing procedure in the process example 4. It is to be noted that the flow chart of FIG. 32 is the flow chart in which processing of next step S81 is added between steps S47 and S48 in the flow chart illustrated in FIG. 16.

[Step S81] The data restoration unit 213 determines whether or not the line number of the field of the "line number 1 during restoration" of the measurement information 250, the line number having been updated in step S47, coincides with the line number registered in the field of the "read start line number 1" of the measurement information 250. When the line numbers coincide with each other, the data restoration unit 213 ends the processing. Meanwhile, when the line numbers do not coincide with each other, the data restoration unit 213 executes processing of step S48.

Process Example 5

A process example 5 is the example in which read processing from the tape library apparatus 400 in the logical volume group unit in the above-described process example 2 is modified as follows. In the read processing in the process example 2, the read control unit 212 has ended the processing at the time of having read the logical volume having the third read order from the last from the magnetic tape. In contrast with this, in the following process example 5, when having completed read of a logical volume having the third read order from the last from the magnetic tape, the read control unit 212 starts processing of reading a part of the logical volume during restoration from the magnetic tape.

Figure 33:
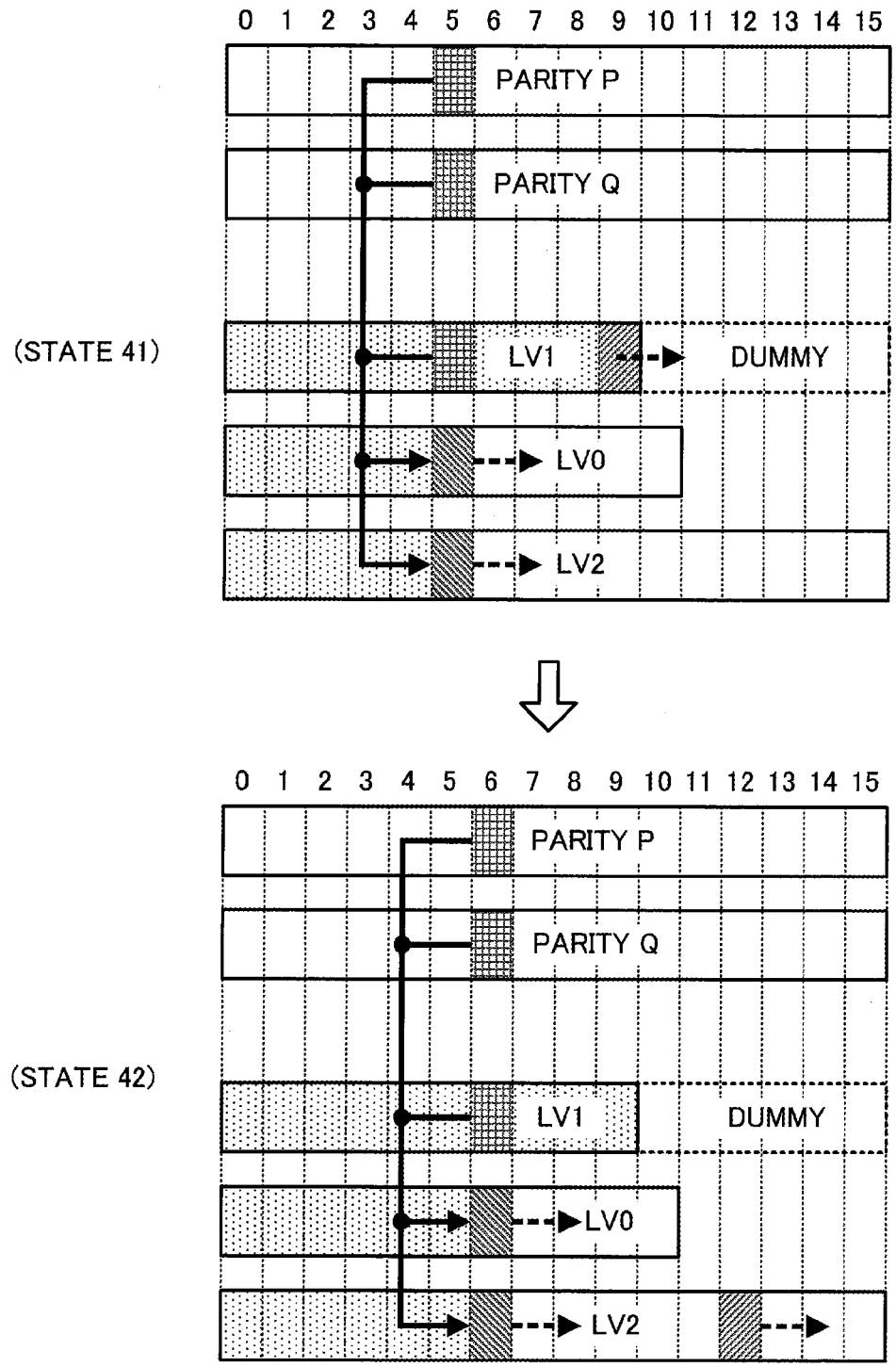
FIG. 33 illustrates an example of read processing of a logical volume group from the tape library apparatus in a process example 5.

FIG. 33 illustrates an example of read processing of the logical volume group from the tape library apparatus in the process example 5.

A state 41 of FIG. 33, as an example, indicates a state where from the state 15 of FIG. 20, read processing of the logical volume LV1 by the read control unit 212, and restoration processing of the logical volumes LV0 and LV2 by the data restoration unit 213 are further advanced. In the process example 5, when having completed read of a final block in the logical volume LV1 from the magnetic tape, the read control unit 212 makes the tape library apparatus 400 execute preparation for reading the logical volume LV2 having the last read order from the magnetic tape.

When the magnetic tape in which the logical volume LV2 has been stored is mounted in the tape drive in the tape library apparatus 400, and a magnetic head is arranged near an area of the logical volume LV2 on the magnetic tape, the read control unit 212 calculates the read capacity Rd1 in accordance with the above-described Expression (5), and further calculates the read start line number Ld1 in accordance with the above-described Expression (6).

The read control unit 212 reads from the magnetic tape data from a block corresponding to the calculated read start line number Ld1 to a final block among the blocks of the logical volume LV2 having the last read order, and stores it in the disk array apparatus 300. Meanwhile, when completing restoration of a block corresponding to a line number smaller by one than the read start line number Ld1 of the logical volume LV2, the data restoration unit 213 ends the restoration processing of the logical volume LV2. However, the data restoration unit 213 executes restoration processing to the final block of the logical volume LV0.

In a state 42 of FIG. 33, assume that the read start line number Ld1 has been calculated as "13". In this case, the read control unit 212 reads data from the magnetic tape from a thirteenth block from the head (i.e., a block corresponding to a line number 12) to the final block of the logical volume LV2. In addition, in parallel with read processing from the magnetic tape by the read control unit 212, the data restoration unit 213 restores blocks to the line number 11 of the logical volume LV2.

As described above, processing that restores a part of the logical volume LV2 using the parity, and processing that reads other part thereof from the magnetic tape are executed in parallel. As a result of it, a time required until data of the whole logical volume group is stored in the disk array apparatus 300 is reduced.

It is to be noted that although in an example illustrated in FIG. 33, the restoration processing using the parity and the read processing from the magnetic tape of the logical volume LV2 are executed in parallel, for example, restoration processing using the parity and read processing from the magnetic tape of the logical volume LV0 instead of the logical volume LV2 may be executed in parallel. However, as the example of FIG. 33, restoration processing using the parity and read processing from the magnetic tape of the maximum size of logical volume LV2 in the logical volume group are executed in parallel, and thereby a time when restoration processing and read processing are executed in parallel becomes longer. As a result of it, a reduction effect of a time required until data of the whole logical volume group is stored in the disk array apparatus 300 becomes larger.

Next, read processing from the tape library apparatus 400 in the logical volume group unit in the process example 5 will be described using a flow chart. First, the read control unit 212 executes processing of the flow chart illustrated in FIG. 21, and when determining "Yes" in step S29, i.e., when having completed read of the logical volume having the third read order from the last, from the magnetic tape, the read control unit 212 executes processing illustrated in FIG. 31.

Figure 34:
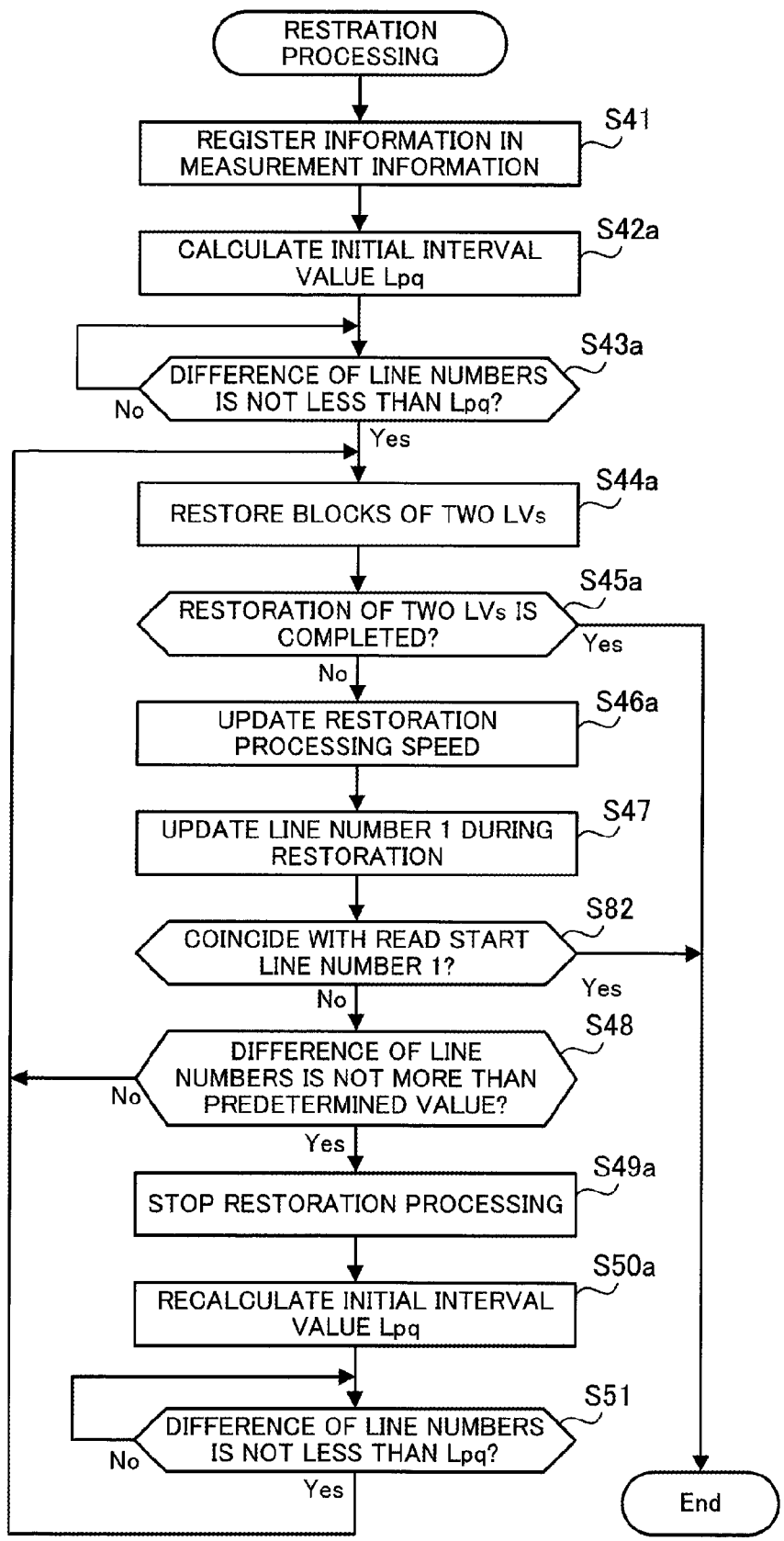
FIG. 34 is a flow chart illustrating a data restoration processing procedure in the process example 5.

FIG. 34 is a flow chart illustrating a data restoration processing procedure in the process example 5. It is to be noted that the flow chart of FIG. 34 is the flow chart in which processing of next step S82 is added between steps S47 and S48 in the flow chart illustrated in FIG. 22.

[Step S82] The data restoration unit 213 determines whether or not the line number of the field of the "line number 1 during restoration" of the measurement information 250, the line number having been updated in step S47, coincides with the line number registered in the field of the "read start line number 1" of the measurement information 250. When the line numbers coincide with each other, the data restoration unit 213 ends the processing. Meanwhile, when the line numbers do not coincide with each other, the data restoration unit 213 executes processing of step S48.

Process Example 6

A process example 6 is the example in which read processing from the tape library apparatus 400 in the logical volume group unit in the above-described process example 3 is modified as follows. In the read processing in the process example 3, the read control unit 212 has ended the processing at the time of having read the logical volume having the third read order from the last from the magnetic tape. In contrast with this, in the following process example 6, when having completed read of the logical volume having the third read order from the last from the magnetic tape, the read control unit 212 starts processing of reading a part of the logical volume during restoration from the magnetic tape.

Figure 35:
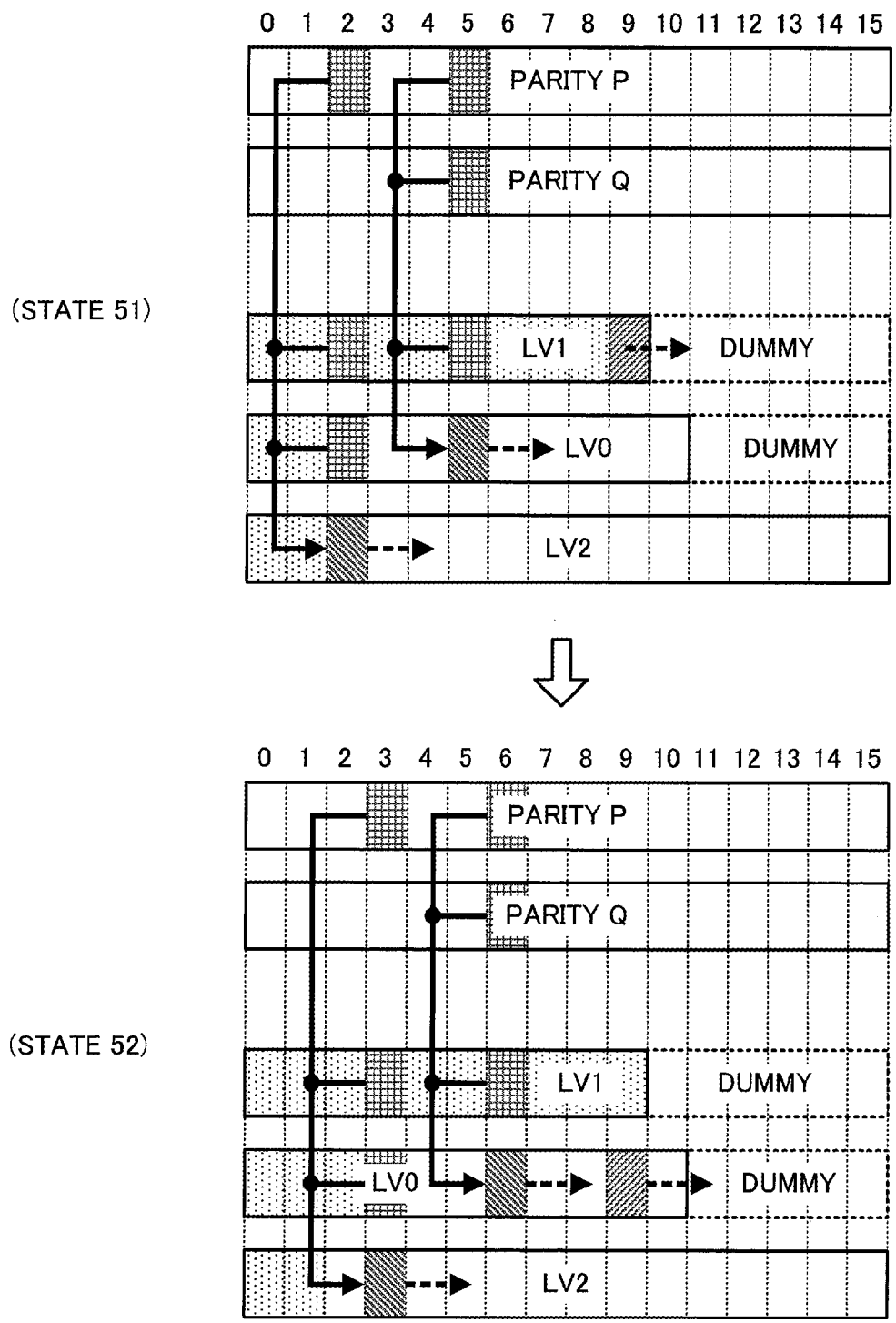
FIG. 35 illustrates an example of read processing of a logical volume group from the tape library apparatus in a process example 6.

FIG. 35 illustrates an example of read processing of the logical volume group from the tape library apparatus in the process example 6.

A state 51 of FIG. 35, as an example, indicates a state where from the state 24 of FIG. 24, read processing of the logical volume LV1 by the read control unit 212, and restoration processing of the logical volumes LV0 and LV2 by the data restoration unit 213 are further advanced. In the process example 6, when having completed read of a final block in the logical volume LV1 from the magnetic tape, the read control unit 212 makes the tape library apparatus 400 execute preparation for reading the logical volume LV0 having the second read order from the last from the magnetic tape.

When the magnetic tape in which the logical volume LV0 has been stored is mounted in the tape drive in the tape library apparatus 400, and a magnetic head is arranged near an area of the logical volume LV0 on the magnetic tape, the read control unit 212 calculates a read capacity Rd2 in accordance with next Expression (7), and further calculates a read start line number Ld2 in accordance with Expression (8).

$Rd2 = Vd \cdot Rp2/(Vd+Vp2)$ (7)

$Ld2 = N2 - Rd2$ (8)

In Expression (7), Vp2 is a data restoration speed in the logical volume having the second read order from the last, and the actual measurement value registered in the field of the "restoration processing speed 2" of the measurement information 250 is substituted in Vp2. Rp2 is a size of an area for which restoration of data has not been completed of the logical volume having the second read order from the last. N2 is the number of blocks of the logical volume having the second read order from the last, and is, for example, calculated based on a value registered in each field of the "LV size 2" of the LVG information 241 of the LVG management table 240, and the "parity size" of the LVG management table 240. It is to be noted that values after a decimal point are rounded down in performing calculation of Expression (7).

The read control unit 212 reads from the magnetic tape data from a block corresponding to the calculated read start line number Ld2 to a final block among the blocks of the logical volume LV0 having the second read order from the last, and stores it in the disk array apparatus 300. Meanwhile, when completing restoration of a block corresponding to a line number smaller by one than the read start line number Ld2 of the logical volume LV0, the data restoration unit 213 ends the restoration processing of the logical volume LV0.

In a state 52 of FIG. 35, assume that a read start line number Ld3 has been calculated as "10". In this case, the read control unit 212 reads data from the magnetic tape from a tenth block from a head (i.e., a block corresponding to a line number 9) to the final block of the logical volume LV0. In addition, in parallel with read processing from the magnetic tape by the read control unit 212, the data restoration unit 213 restores blocks to the line number 8 of the logical volume LV0.

As described above, processing that restores a part of the logical volume LV0 using the parity, and processing that reads other part thereof from the magnetic tape are executed in parallel. As a result of it, a time required until data of the whole logical volume group is stored in the disk array apparatus 300 is reduced.

Furthermore, although not illustrated, when read to the final block of the logical volume LV0 is completed, the read control unit 212 makes the tape library apparatus 400 execute preparation for reading the logical volume LV2 having the last read order from the magnetic tape. Subsequent processing of the read control unit 212 is similar to the above-mentioned process example 5. Namely, the read control unit 212 calculates the read start line number Ld1 using Expressions (5) and (6). The read control unit 212 reads from the magnetic tape data from the block corresponding to the calculated read start line number Ld1 to the final block among the blocks of the logical volume LV2, and stores it in the disk array apparatus 300. Meanwhile, when completing restoration of a block corresponding to a line number smaller by one than the read start line number Ld1 of the logical volume LV2, the data restoration unit 213 ends the restoration processing of the logical volume LV2. In a manner described above, processing that restores a part of the logical volume LV2 using the parity, and processing that reads other part thereof from the magnetic tape are executed in parallel.

Figure 36:
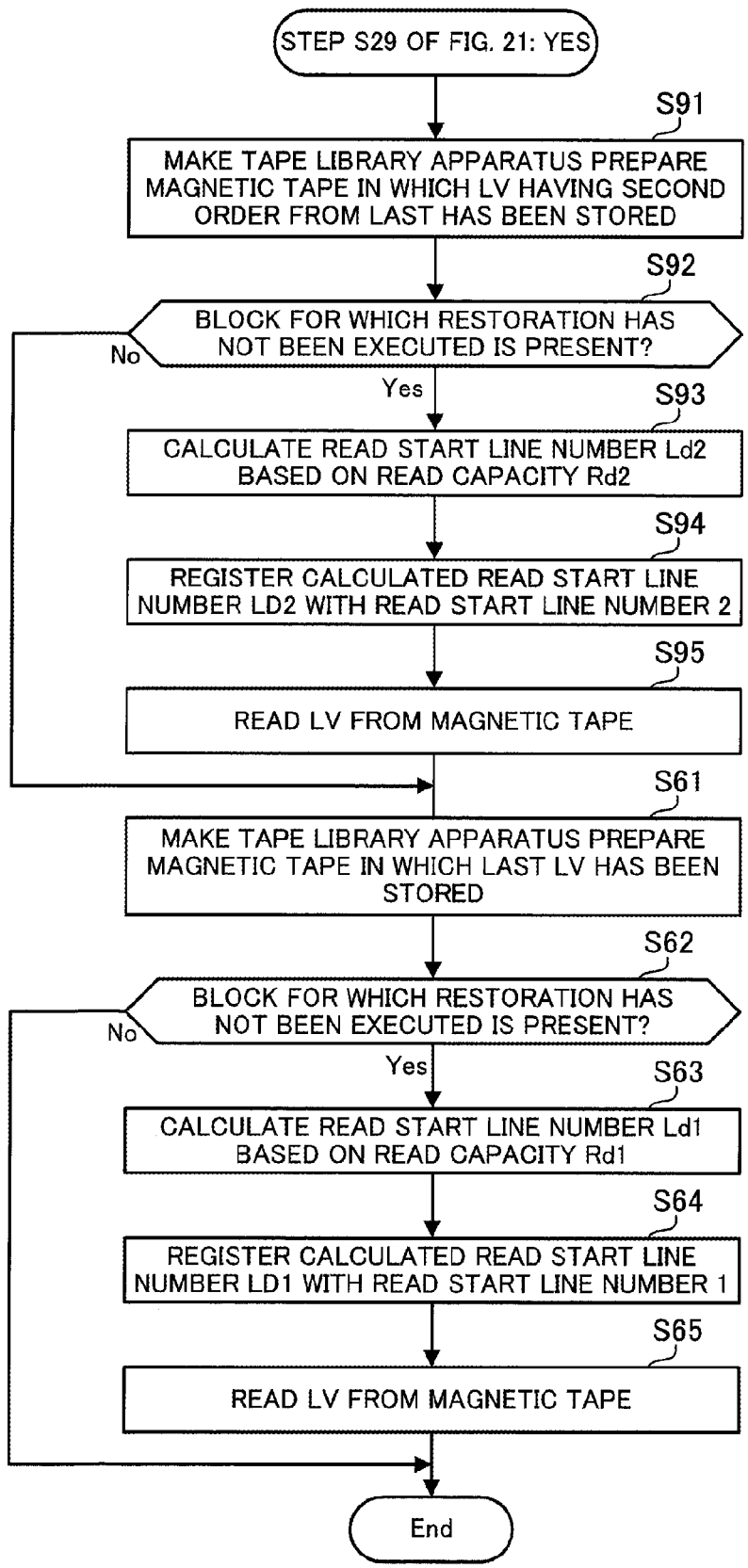
FIG. 36 is a flow chart illustrating an example of a processing procedure of the read control unit in the process example 6.

FIG. 36 is a flow chart illustrating an example of a processing procedure of the read control unit in the process example 6. It is to be noted that in FIG. 36, the same step numbers as in FIG. 31 are attached to processing steps in which the same processing as in FIG. 31 is executed.

When determining "Yes" in step S29 of FIG. 21, i.e., when having completed read of the logical volume having the third read order from the last, from the magnetic tape, the read control unit 212 further executes processing illustrated in FIG. 36.

[Step S91] The read control unit 212 sets the logical volume having the second read order from the last as a logical volume for read processing, and reads position information of the logical volume for read processing from the field of the "storing position information 2" of the LVG information 241 registered in the LVG management table 240. The read control unit 212 notifies the tape library apparatus 400 of the read position information, and makes the tape library apparatus 400 execute preparation for reading the logical volume for read processing from the magnetic tape.

[Step S92] The read control unit 212 determines whether or not a block for which restoration processing by the data restoration unit 213 is not executed is present in the blocks of the logical volume for read processing. When the line number registered in the field of the "line number 2 during restoration" of the measurement information 250 indicates a line number of a final block of the logical volume for read processing, the read control unit 212 determines that the block is not present for which restoration has not been executed, and executes processing of step S61. Meanwhile, when determining that the block is present for which restoration has not been executed, the read control unit 212 executes processing of step S93.

[Step S93] The read control unit 212 calculates the read capacity Rd2 in accordance with Expression (7), and calculates the read start line number Ld2 from Expression (8) based on the read capacity Rd2.

[Step S94] The read control unit 212 registers the calculated read start line number Ld2 in the field of the "read start line number 2" of the measurement information 250.

[Step S95] The read control unit 212 reads from the magnetic tape from a block indicated by the calculated read start line number Ld2 to the final block of the blocks of the logical volume for read processing. This read processing of step S95 is executed in parallel with restoration processing of a block prior to the block indicated by the read start line number Ld2 by the data restoration unit 213.

After this, when completing read to the final block of the logical volume for read processing, the read control unit 212 executes processing of steps S61 to S65 indicated in FIG. 31 with the logical volume for read processing being as the logical volume having the last read order.

Next, processing of the data restoration unit 213 will be described. When receiving an execution instruction of restoration processing from the read control unit 212 in step S27*a* of FIG. 21, the data restoration unit 213 executes each processing of FIGS. 37 and 38 in parallel.

Figure 37:
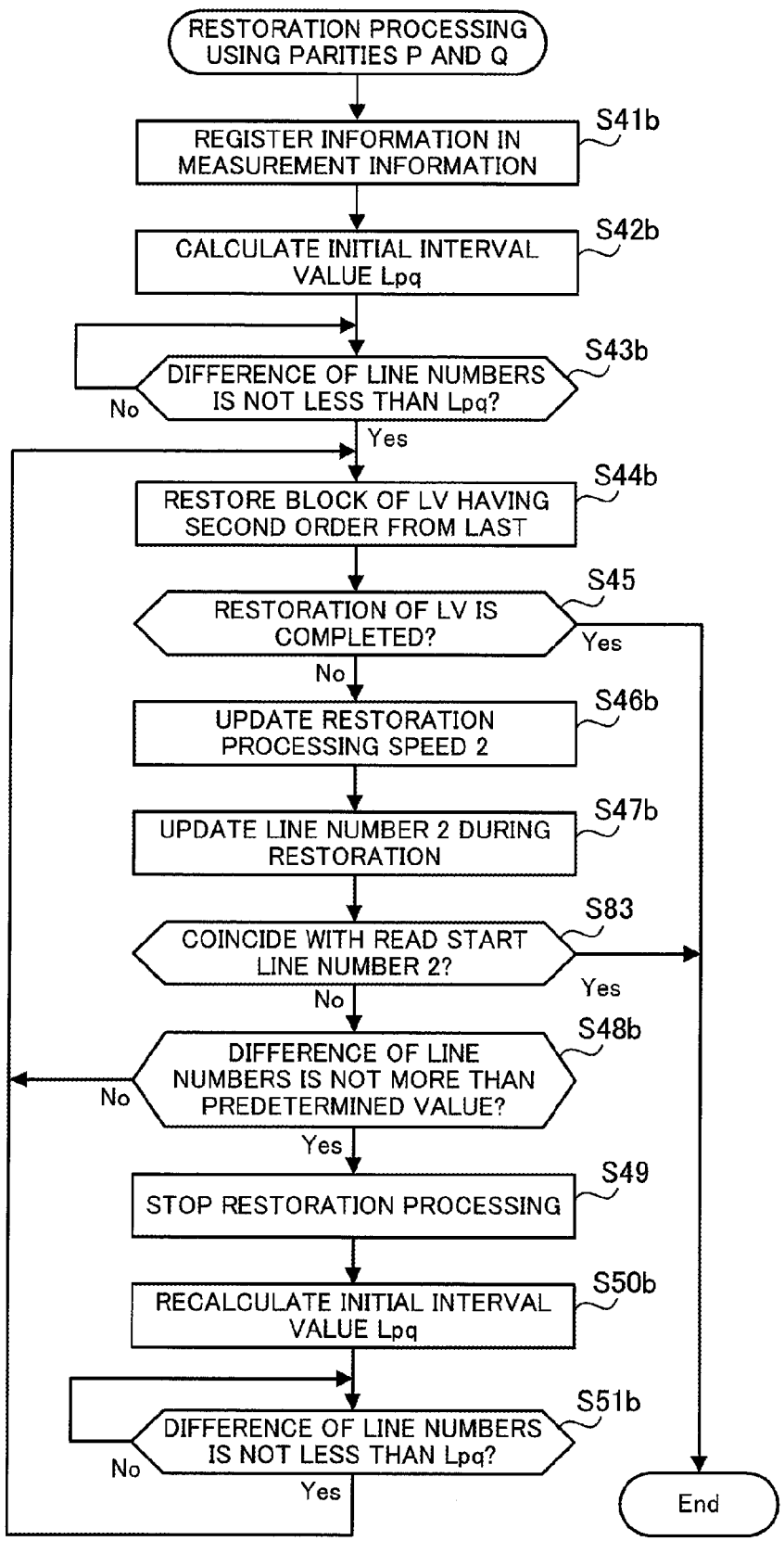
FIG. 37 is a flow chart illustrating a data restoration processing procedure using the parities P and Q in the process example 6.

FIG. 37 is a flow chart illustrating a data restoration processing procedure using the parities P and Q in the process example 6. This processing of FIG. 37 is the processing in which the data restoration unit 213 restores the logical volume having the second read order from the last using two types of parities P and Q. The flow chart of FIG. 37 is the flow chart in which processing of step S83 is added between steps S47*b* and S48*b* in the flow chart illustrated in FIG. 26.

[Step S83] The data restoration unit 213 determines whether or not the line number of the field of the "line number 2 during restoration" of the measurement information 250, the line number having been updated in step S47*b*, coincides with the line number registered in the field of the "read start line number 2" of the measurement information 250. When the line numbers coincide with each other, the data restoration unit 213 ends the processing. Meanwhile, when the line numbers do not coincide with each other, the data restoration unit 213 executes processing of step S48*b*.

Figure 38:
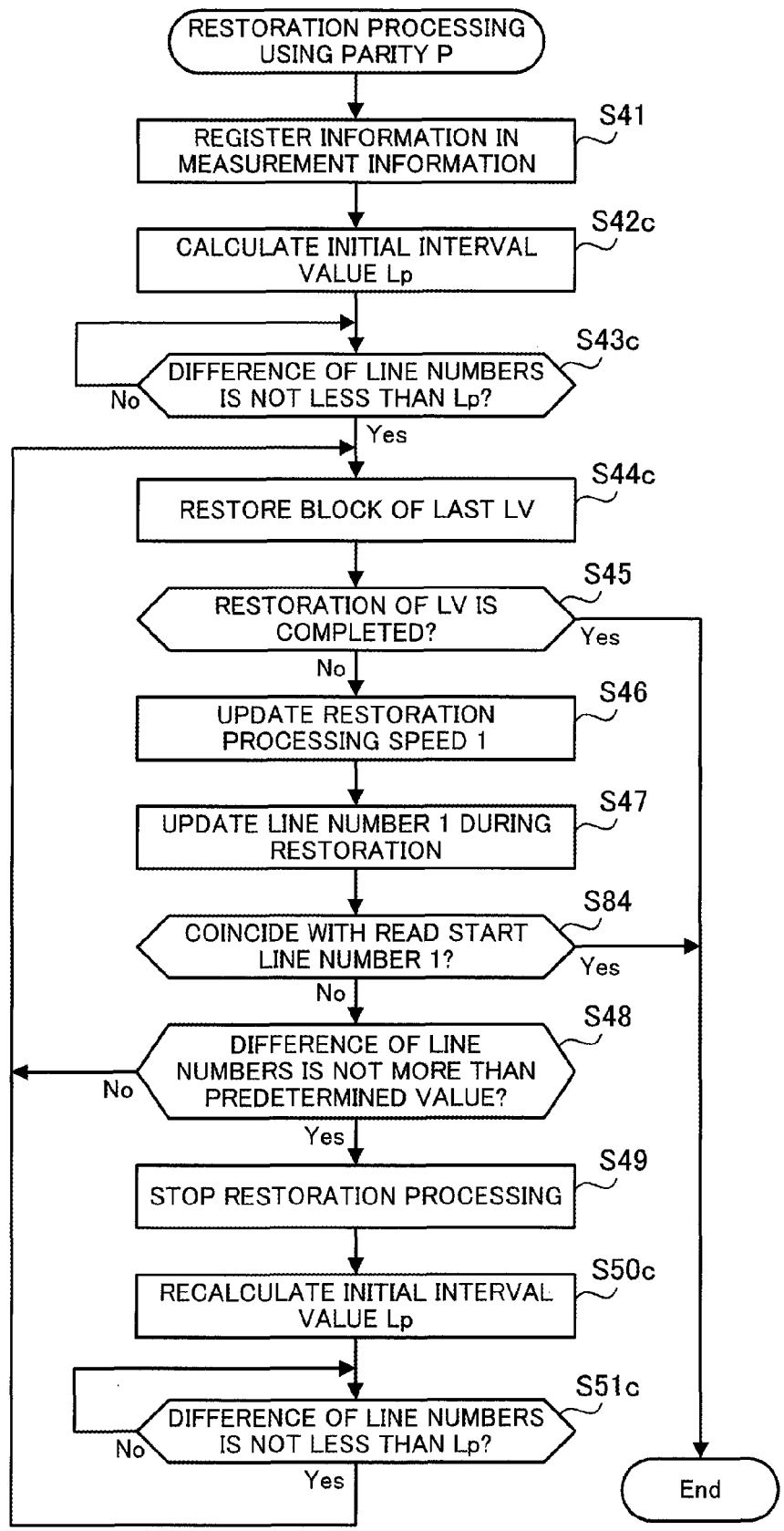
FIG. 38 is a flow chart illustrating a data restoration processing procedure using the parity P in the process example 6.

FIG. 38 is a flow chart illustrating a data restoration processing procedure using the parity P in the process example 6. This processing of FIG. 38 is the processing in which the data restoration unit 213 restores the logical volume having the last read order using one type of parity (here, as an example, the parity P). The flow chart of FIG. 38 is the flow chart in which processing of step S84 is added between steps S47 and S48 in the flow chart illustrated in FIG. 27.

[Step S84] The data restoration unit 213 determines whether or not the line number of the field of the "line number 1 during restoration" of the measurement information 250, the line number having been updated in step S47, coincides with the line number registered in the field of the "read start line number 1" of the measurement information 250. When the line numbers coincide with each other, the data restoration unit 213 ends the processing. Meanwhile, when the line numbers do not coincide with each other, the data restoration unit 213 executes processing of step S48.

It is to be noted that processing functions of the storage control apparatus 10 and the control apparatus 200 that have been illustrated in the above-described each embodiment are achievable by a computer. In that case, a program is provided that describes processing contents of functions that each communication apparatus has, the program is executed by the computer, and thereby the above-described processing functions are achieved on the computer. The program in which the processing contents are described is recordable on a computer-readable recording medium. As a computer-readable recording medium, there are included a magnetic storage apparatus, an optical disk, a magneto-optical recording medium, a semiconductor memory, and the like. There are included an HDD (hard disk drive), a FD (flexible disk), a magnetic tape, and the like as the magnetic storage apparatus. There are included a DVD, a DVD-RAM, a CD-ROM, a CD-R/RW, and the like as the optical disk. There are included an MO (Magneto-Optical disk) and the like as the magneto-optical recording medium.

When distributing the program, for example, portable recording media, such as a DVD and a CD-ROM, on which the program has been recorded are sold. In addition, it is also possible to store the program in a memory apparatus of a server computer, and to transfer the program from the server computer to other computer through a network.

The computer that executes the program stores in its own memory apparatus, for example, the program recorded on the portable recording medium or the program transferred from the server computer. The computer then reads the program from its own memory apparatus, and executes processing in accordance with the program. It is to be noted that the computer may also read the program directly from the portable recording medium, and execute processing in accordance with the program. In addition, the computer may also sequentially execute processing in accordance with the received program, whenever the program is transferred from the server computer connected through the network.

According to one aspect, in a storage control apparatus, a storage system, and a storage control method, a data read time from a memory apparatus is reduced.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A storage control apparatus used with a first memory apparatus and a second memory apparatus that has a higher access speed than the first memory apparatus, the storage control apparatus comprising:
   a parity calculation unit that calculates, when a data set including first data and second data is written in the first memory apparatus, parity data based on the first data and second data and stores the calculated parity data in the second memory apparatus; and
   a read control unit that performs, upon receipt of a read request to read the data set including the first data and second data from the first memory apparatus, a first access to the first memory apparatus to read the first data out of the first memory apparatus, a second access to the second memory apparatus to read the parity data out of the second memory apparatus, and a data restoring operation to restore the second data on the basis of the first data and parity data that have been read, and responds to the read request by sending a data set including the read first data and the restored second data.

2. The storage control apparatus according to claim 1, wherein:
the first data includes a first volume of data and a second volume of data that are to be read in that order;
the second data includes a third volume of data; and
the read control unit executes the data restoring operation for the third volume in parallel with the first access for the second volume.

3. The storage control apparatus according to claim 2, wherein:
the first access for the second volume is executed at a first speed;
the data restoring operation is executed at a second speed;
the second volume has a first data size;
the third volume has a second data size; and
the read control unit performs a procedure including:
estimating a first processing time for reading the second volume, based on the first speed and the first data size,
estimating a second processing time for restoring the third volume, based on the second speed and the second data size, and
starting the data restoring operation with a delay time equal to a difference between the first processing time and the second processing time that are estimated, after the first access for the second volume is started.

4. The storage control apparatus according to claim 2, wherein:
the first access for the second volume is executed at a first speed;
the data restoring operation is executed at a second speed;
the read control unit performs a procedure including:
temporarily stopping the data restoring operation before the first access is completed for the second volume;
estimating a first completion time to be taken for completing the first access for the second volume, based on the first speed and a data size of unread part of the second volume;
estimating a second completion time to be taken for completing the data restoring operation for the third volume, based on the second speed and a data size of unrestored part of the third volume; and
restarting the data restoring operation after passage of time equal to a difference between the first completion time and the second completion time that are estimated.

5. The storage control apparatus according to claim 2, wherein the read control unit determines a remaining area of the third volume that has not been restored, when the first access for the first volume is finished before completion of the data restoring operation, and reads a part of the remaining area of the third volume out of the first memory apparatus, in parallel with the data restoring operation.

6. The storage control apparatus according to claim 5, wherein:
the read control unit sets a boundary to divide the remaining area of the third volume into a first area to be further restored by the data restoring operation and a second area to be read out of the first memory apparatus; and
the boundary between the first and second areas is determined such that the read control unit finishes reading the second area of the third volume out of the first memory apparatus simultaneously with completion of the data restoring operation for the first area of the third volume.

7. The storage control apparatus according to claim 1, wherein:
the first data includes a first volume of data;
the second data includes second and third volumes of data;
the parity calculation unit calculates first parity data and second parity data from the first, second, and third volumes and stores the calculated first parity data and second parity data in the second memory apparatus, the first and second parity data being of different types;
the first access is to read the first volume from the first memory apparatus;
the data restoring operation includes:
a first data restoring operation that restores the second volume from the first volume read out of the first memory apparatus and the first and second parity data read out of the second memory apparatus, and
a second data restoring operation that restores the third volume from the first volume read out of the first memory apparatus and the first and second parity data read out of the second memory apparatus; and
the read control unit executes the first and second data restoring operations in parallel with the first access for the first volume.

8. The storage control apparatus according to claim 7, wherein:
the first access for the first volume is executed at a first speed;
the first data restoring operation is executed at a second speed;
the first volume has a first data size;
the second volume is greater than the third volume and has a second data size; and
the read control unit performs a procedure including:
estimating a first processing time for reading the first volume, based on the first speed and the first data size,
estimating a second processing time for restoring the second volume, based on the second speed and the second data size, and
starting both the first and second data restoring operations with a delay time equal to a difference between the first processing time and the second processing time that are estimated, after the first access for the first volume is started.

9. The storage control apparatus according to claim 7, wherein:
the first access for the first volume is executed at a first speed;
the first data restoring operation is executed at a second speed;
the read control unit further performs a procedure including:
temporarily stopping the data restoring operation before the first access is completed for the first volume;
estimating a first completion time to be taken for completing the first access for the first volume, based on the first speed and a data size of unread part of the first volume;
estimating a second completion time to be taken for completing the first data restoring operation for the second volume, based on the second speed and a data size of unrestored part of the second volume; and restarting the first data restoring operation after passage of time equal to a difference between the first completion time and the second completion time.

10. The storage control apparatus according to claim 7, wherein the read control unit determines a remaining area of the second volume that has not been restored, when the first access for the first volume is finished before completion of the first data restoring operation, and reads a part of the remaining area of the second volume out of the first memory apparatus, in parallel with the first data restoring operation.

11. The storage control apparatus according to claim 10, wherein:
the read control unit sets a boundary to divide the remaining area of the second volume into a first area to be further restored by the first data restoring operation and a second area to be read out of the first memory apparatus; and
the boundary between the first and second areas is determined such that the read control unit finishes reading the second area of the second volume out of the first memory apparatus simultaneously with completion of the first data restoring operation for the first area of the second volume.

12. The storage control apparatus according to claim 1, wherein:
the first data includes a first volume of data;
the second data includes second and third volumes of data;
the parity calculation unit calculates first parity data and second parity data from the first, second, and third volumes and stores the calculated first parity data and second parity data in the second memory apparatus, the first and second parity data being of different types;
the first access is to read the first volume from the first memory apparatus;
the data restoring operation includes:
a first data restoring operation that restores the second volume from the first volume read out of the first memory apparatus and the first and second parity data read out of the second memory apparatus, and
a second data restoring operation that restores the third volume from the first volume read out of the first memory apparatus, the second volume restored by the first data restoring operation, and either the first parity data or the second parity data read out of the second memory apparatus; and
the read control unit executes the first and second data restoring operations in parallel with the first access for the first volume.

13. The storage control apparatus according to claim 12, wherein:
the first access for the first volume is executed at a first speed;
the first data restoring operation is executed at a second speed;
the first volume has a first data size;
the second volume has a second data size; and
the read control unit performs a procedure including:
estimating a first processing time for reading the first volume, based on the first speed and the first data size,
estimating a second processing time for restoring the second volume, based on the second speed and the second data size, and
starting the first data restoring operation with a delay time equal to a difference between the first processing time and the second processing time that are estimated, after the first access for the first volume is started.

14. The storage control apparatus according to claim 12, wherein:
the first data restoring operation is executed at a first speed;
the second data restoring operation is executed at a second speed;
the second volume has a first data size;
the third volume has a second data size; and
the read control unit performs a procedure including:
estimating a first processing time for restoring the second volume, based on the first speed and the first data size,
estimating a second processing time for restoring the third volume, based on the second speed and the second data size, and
starting the second data restoring operation with a delay time equal to a difference between the first processing time and the second processing time that are estimated, after the first data restoring operation for the second volume is started.

15. The storage control apparatus according to claim 12, wherein:
the first access for the first volume is executed at a first speed;
the first data restoring operation is executed at a second speed;
the read control unit further performs a procedure including:
temporarily stopping the first data restoring operation before the first access is completed for the first volume;
estimating a first completion time to be taken for completing the first access for the first volume, based on the first speed and a data size of unread part of the first volume;
estimating a second completion time to be taken for completing the first data restoring operation for the second volume, based on the second speed and a data size of unrestored part of the second volume; and
restarting the first data restoring operation after passage of time equal to a difference between the first completion time and the second completion time.

16. The storage control apparatus according to claim 12, wherein the read control unit determines a remaining area of the second volume that has not been restored, when the first access for the first volume is finished before completion of the first data restoring operation, and reads a part of the remaining area of the second volume out of the first memory apparatus, in parallel with the first data restoring operation.

17. The storage control apparatus according to claim 12, wherein the read control unit determines a remaining area of the third volume that has not been restored, when the first data restoring operation is finished before completion of the second data restoring operation, and reads a part of the remaining area of the third volume out of the first memory apparatus, in parallel with the second data restoring operation.

18. The storage control apparatus according to claim 1, wherein:
the first data includes at least one volume of data;
the second data includes at least one volume of data;
the parity calculation unit equalizes the volumes of the first and second data in size by adding dummy data thereto before calculating parity data from the first and second data.

19. A storage system comprising:
a first memory apparatus;
a second memory apparatus that has a higher access speed than the first memory apparatus; and a storage control apparatus coupled to the first and second memory apparatuses, the storage control apparatus including:
- a parity calculation unit that calculates, when a data set including first data and second data is written in a first memory apparatus, parity data based on the first data and second data and stores the calculated parity data in the second memory apparatus; and
- a read control unit that performs, upon receipt of a read request to read the data set including the first data and second data from the first memory apparatus, a first access to the first memory apparatus to read the first data out of the first memory apparatus, a second access to the second memory apparatus to read the parity data out of the second memory apparatus, and a data restoring operation to restore the second data based on the first data and parity data that have been read, and responds to the read request by sending a data set including the read first data and the restored second data.

20. A storage control method comprising:
calculating, by a computer when a data set including first data and second data is written in a first memory apparatus, parity data based on the first data and second data and storing the calculated parity data in a second memory apparatus that has a higher access speed than the first memory apparatus;
performing, by the computer upon receipt of a read request to read the data set including the first data and second data from the first memory apparatus, a first access to the first memory apparatus to read the first data out of the first memory apparatus, a second access to the second memory apparatus to read the parity data out of the second memory apparatus, and a data restoring operation to restore the second data on the basis of the first data and parity data that have been read; and
responding, by the computer, to the read request by sending a data set including the read first data and the restored second data.

* * * * *